US012604521B2

(12) United States Patent
Hou et al.

(10) Patent No.: US 12,604,521 B2
(45) Date of Patent: Apr. 14, 2026

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Wei-Chih Hou, Hsinchu City (TW); Chun-Jun Lin, Hsinchu City (TW); Feng-Ming Chang, Taitung City (TW); Shu-Ning Hsu, Taichung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 564 days.

(21) Appl. No.: 18/150,545

(22) Filed: Jan. 5, 2023

(65) Prior Publication Data

US 2024/0194678 A1      Jun. 13, 2024

Related U.S. Application Data

(60) Provisional application No. 63/386,918, filed on Dec. 11, 2022.

(51) Int. Cl.
H10D 84/85      (2025.01)
H10D 30/43      (2025.01)
(Continued)

(52) U.S. Cl.
CPC .......... H10D 84/856 (2025.01); H10D 30/43 (2025.01); H10D 30/6735 (2025.01);
(Continued)

(58) Field of Classification Search
CPC .. H10D 84/856; H10D 30/43; H10D 30/6735; H10D 62/121; H10D 84/0167;
(Continued)

(56) References Cited

U.S. PATENT DOCUMENTS 9,209,247 B2    12/2015  Colinge et al.
9,236,267 B2    1/2016  De et al.
(Continued)

OTHER PUBLICATIONS

Krishnan et al., "A manufacturable dual channel (Si and SiGe) high-k metal gate CMOS technology with multiple oxides for high performance and low power applications", International Electron Devices Meeting, 2011, total 4 pages.

*Primary Examiner* — Jeff W Natalini
*Assistant Examiner* — Rose Keagy
(74) *Attorney, Agent, or Firm* — Birch, Stewart, Kolasch & Birch, LLP

(57)      ABSTRACT

A method includes depositing an epitaxial stack over a substrate, the epitaxial stack comprising alternating first semiconductor layers and second semiconductor layers, wherein the first semiconductor layers comprise a different semiconductor composition from that of the second semiconductor layers; forming a dielectric wall in the epitaxial stack; removing a first subset of the first semiconductor layers on a first side of the dielectric wall, while leaving a first subset of the second semiconductor layers on the first side of the dielectric wall; removing a second subset of the second semiconductor layers on a second side of the dielectric wall, while leaving a second subset of the first semiconductor layers on the second side of the dielectric wall; forming a first gate structure around the first subset of the second semiconductor layers; and forming a second gate structure around the second subset of the first semiconductor layers.

20 Claims, 52 Drawing Sheets

(51) Int. Cl.
| | |
|---|---|
| *H10D 30/67* | (2025.01) |
| *H10D 62/10* | (2025.01) |
| *H10D 84/01* | (2025.01) |
| *H10D 84/03* | (2025.01) |

(52) U.S. Cl.
CPC ....... *H10D 62/121* (2025.01); *H10D 84/0167* (2025.01); *H10D 84/017* (2025.01); *H10D 84/0188* (2025.01); *H10D 84/038* (2025.01)

(58) Field of Classification Search
CPC . H10D 84/017; H10D 84/0188; H10D 84/038
See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2019/0103472 A1* | 4/2019 | Cheng .................. | H10D 64/685 |
| 2021/0336024 A1* | 10/2021 | Chen ................... | H10D 64/017 |
| 2022/0165730 A1* | 5/2022 | Chen ................. | H01L 21/02603 |
| 2022/0189945 A1* | 6/2022 | Lee ....................... | G06F 30/398 |
| 2022/0367702 A1* | 11/2022 | Yang ................... | H10D 30/024 |
| 2023/0095140 A1* | 3/2023 | Xie ..................... | H10D 30/014 |
| | | | 257/288 |
| 2023/0290862 A1* | 9/2023 | Hall ...................... | H10D 30/43 |
| 2024/0072047 A1* | 2/2024 | Xie ................. | H01L 21/76897 |

* cited by examiner

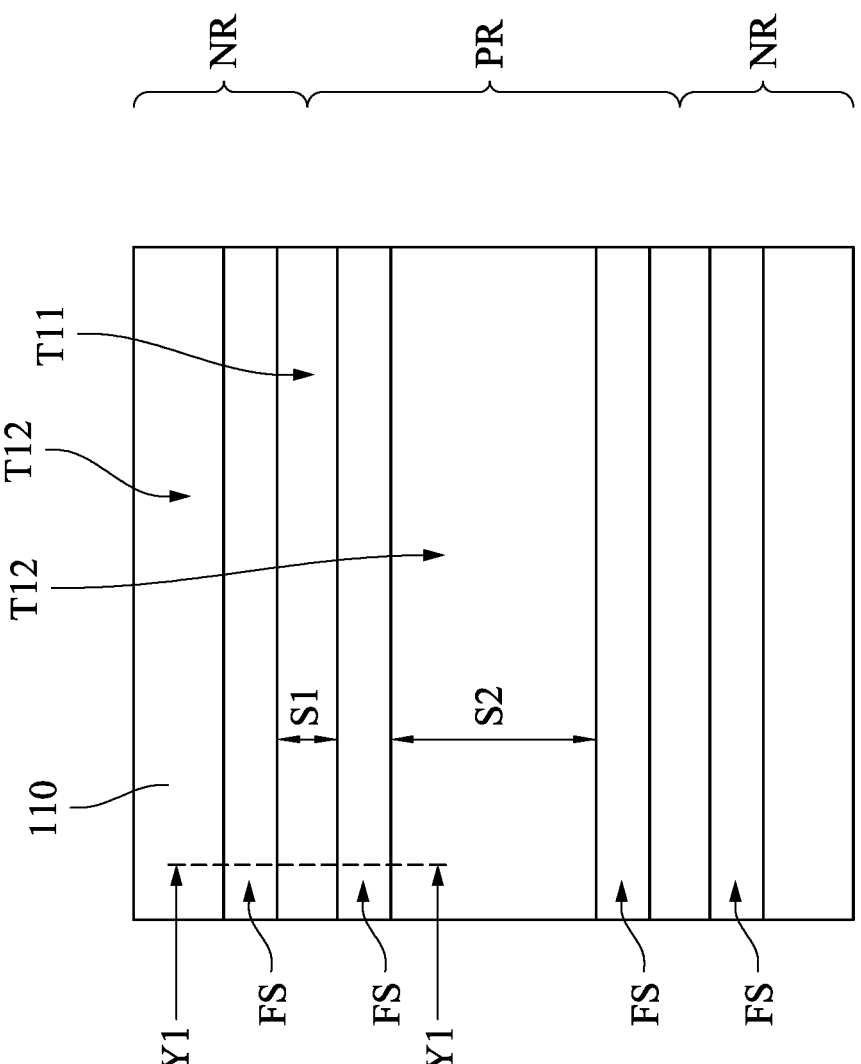
Fig. 2A
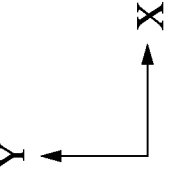

Figures 15C, 15D:
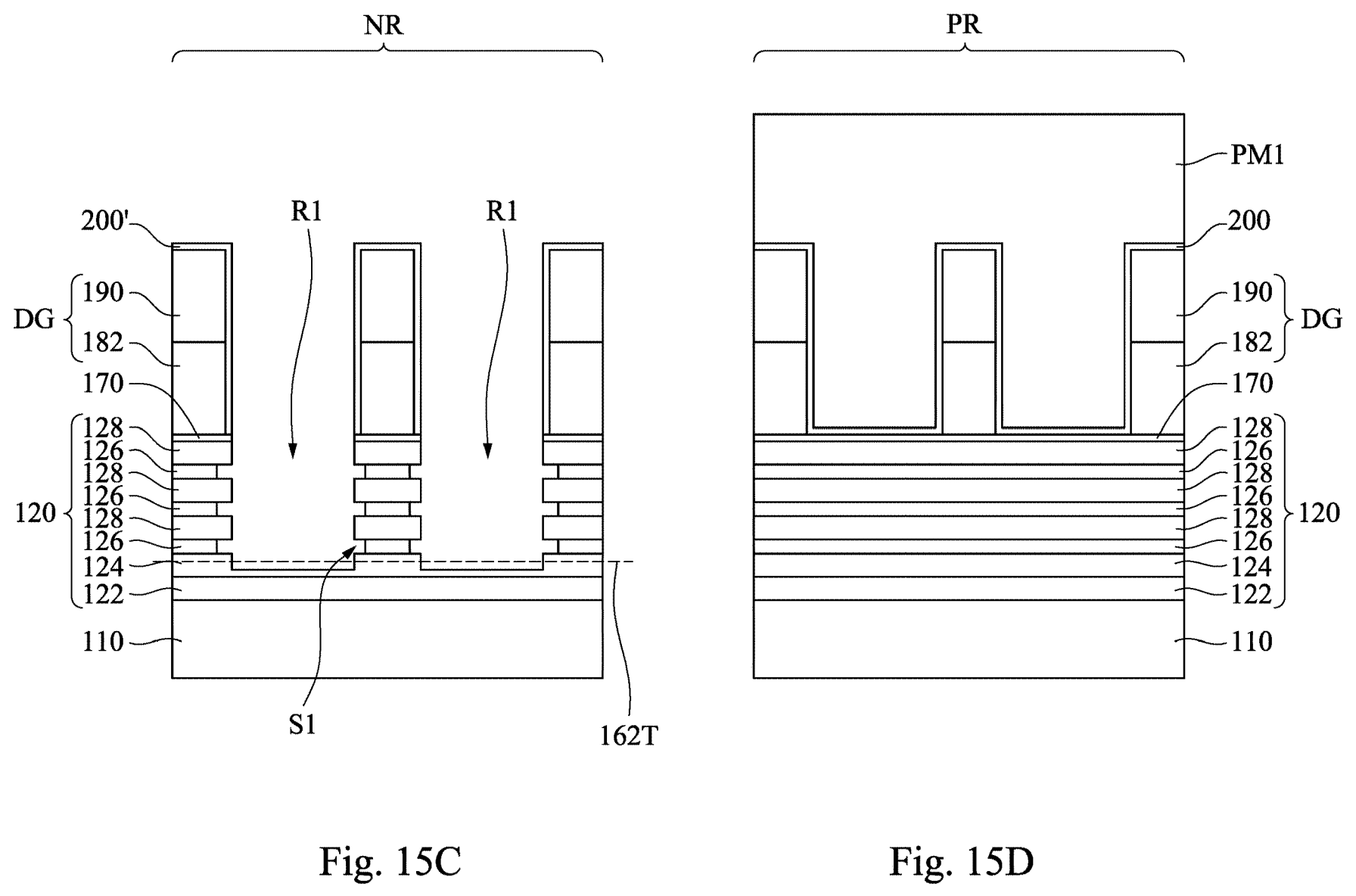

SEMICONDUCTOR DEVICE AND MANUFACTURING METHOD THEREOF

PRIORITY CLAIM AND CROSS-REFERENCE

This application claims priority to U.S. Provisional Application Ser. No. 63/386,918, filed Dec. 11, 2022, which is herein incorporated by reference.

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-27B illustrate schematic views of intermediate stages in the manufacture of a semiconductor device in accordance with some embodiments of the present disclosure.

FIGS. 30A-32B illustrate schematic views of intermediate stages in the manufacture of a semiconductor device in accordance with some embodiments of the present disclosure.

DETAILED DESCRIPTION

Figure 1:
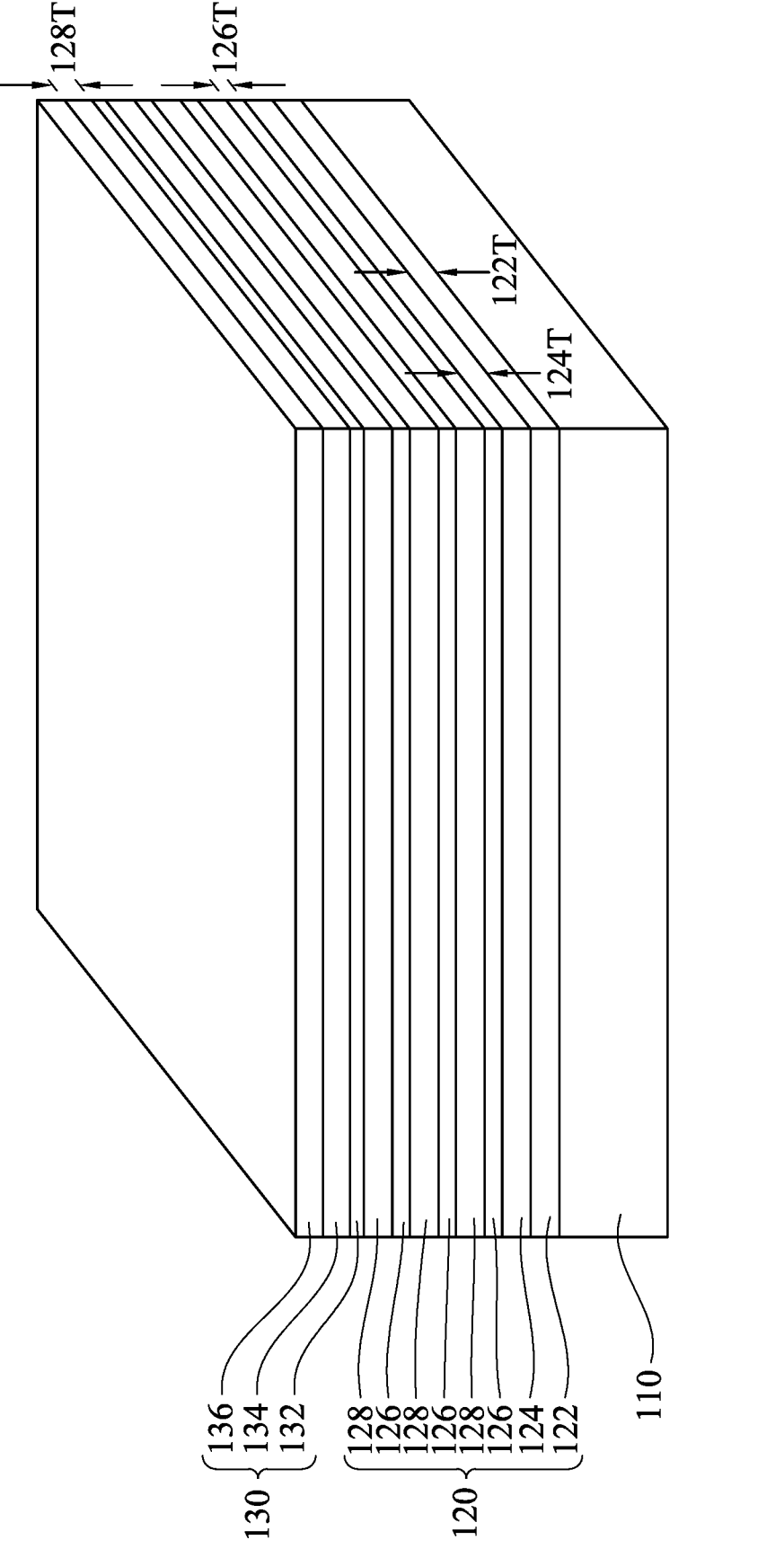

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The term "multi-gate device" is used to describe a device (e.g., a semiconductor transistor) that has at least some gate material disposed on multiple sides of at least one channel of the device. In some examples, the multi-gate device may be referred to as a gate all around (GAA) device or a nanosheet device having gate material disposed on at least four sides of at least one channel of the device. The channel region may be referred to as a "nanowire," which as used herein includes channel regions of various geometries (e.g., cylindrical, bar-shaped) and various dimensions. In some examples, the multi-gate device may be referred to as a FinFET device. However, one of ordinary skill would recognize that the teaching can apply to a single channel (e.g., single nanosheet) or any number of channels. One of ordinary skill may recognize other examples of semiconductor devices that may benefit from aspects of the present disclosure.

FIGS. 1-27B illustrate schematic views of intermediate stages in the manufacture of a semiconductor device in accordance with some embodiments of the present disclosure. FIG. 1 is a schematic view of the semiconductor device at various stages in accordance with some embodiments. FIGS. 2A, 6A, 7A, 13A, 15A, 16A, 18A, 20A, 21A, 22A, and 23A are top views of the semiconductor device at various stages in accordance with some embodiments. FIGS. 2B, 3-5, 6B, 7B, 8, 9-12, 13B, 22B, and 23B are cross-sectional views of the semiconductor device (e.g., taken along line Y1-Y1 in FIGS. 2A, 6A, 7A, 13A, 22A, and 23A) at various manufacturing stages in accordance with some embodiments. FIGS. 13C, 15B, 16B, 18B, 19A, 21B are cross-sectional views of the semiconductor device (e.g., taken along line Y2-Y2 in FIGS. 13A, 15A, 16A, 18A, and 21A) at various manufacturing stages in accordance with some embodiments. FIGS. 13D, 15C. 16C, 17A, 18C, 19B, 20B, 21C, 22C, 23C, 24A, 25A, 26A, and 27A are cross-sectional views of the semiconductor device (e.g., taken along line X1-X1 in FIGS. 13A, 15A, 16A, 18A, 20A, 21A, 22A, and 23A) at various manufacturing stages in accordance with some embodiments. FIGS. 15D, 16D, 17B, 18D, 19C, 20C, 21D, 22D, 23D, 24B, 25B, 26B, and 27B are cross-sectional views of the semiconductor device (e.g., taken along line X2-X2 in FIGS. 15A, 16A, 18A, 20A, 21A, 22A, and 23A) at various manufacturing stages in accordance with some embodiments. It is understood that additional steps may be provided before, during, and after the steps shown in FIGS. 1-27B, and some of the steps described below can be replaced or eliminated for additional embodiments of the method. The order of the operations/processes may be interchangeable.

Reference is made to FIG. 1. An epitaxial stack 120 is formed over a substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP. InSb, and/or GaInAsP; or a combination thereof) or other appropriate semiconductor materials. In some embodiments, the substrate 110 may include a semiconductor-on-insulator (SOI) structure such as a buried dielectric layer. Also, the substrate 110 may include a buried dielectric layer such as a buried oxide (BOX) layer, such as that formed by a method referred to as separation by implantation of oxygen (SIMOX) technology, wafer bonding, selective epitaxial growth (SEG), or another appropriate method.

The epitaxial stack 120 includes an epitaxial layer 122, an epitaxial layer 124, and alternately stacking epitaxial layers 126 and 128. The epitaxial layers 126 are interposed by the epitaxial layers 128. The epitaxial layers 122 and 126 may have different semiconductor compositions from the epitaxial layers 124 and 128, in which the epitaxial layers 122 and 126 may have the same or similar semiconductor composition, and the epitaxial layers 124 and 128 may have the same or similar semiconductor composition. For example, a Si concentration in the epitaxial layers 122 and 126 is less than a Si concentration in the epitaxial layers 124 and 128. Stated differently, in the embodiments, a Ge concentration in the epitaxial layers 122 and 126 is greater than a Ge concentration in the epitaxial layers 124 and 128. For example, the epitaxial layers 122 and 126 are $Si_xGe_{1-x}$, and the epitaxial layers 124 and 128 are $Si_yGe_{1-y}$, in which x and y are in a range from 0 to 1, and y>x. In some embodiments, the epitaxial layers 122 and 126 are SiGe layers, and the epitaxial layers 124 and 128 are Si layers. However, other embodiments are possible including those that provide for the material/compositions having different oxidation rates and/or etch selectivity.

The epitaxial layers 128 or portions thereof may form nanosheet channel(s) of a n-type multi-gate transistor, and the epitaxial layers 126 or portions thereof may form nanosheet channel(s) of a p-type multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section.

In the present embodiments, three layers of the epitaxial layers 126 and three layers of the epitaxial layers 128 are alternately arranged as illustrated in FIG. 1. It can be appreciated that any number of epitaxial layers 126/128 can be formed in the epitaxial stack 120; the number of layers depending on the desired number of channels regions for the transistor. In some embodiments, the number of epitaxial layers 126/128 is between 2 and 10. For the n-type multi-gate device, the epitaxial layers 126 in channel regions(s) may eventually be removed and serve to define a vertical distance between adjacent channels (e.g., epitaxial layers 128) for a subsequently-formed metal gate. For the p-type multi-gate device, the epitaxial layers 128 in channel regions(s) may eventually be removed and serve to define a vertical distance between adjacent channels (e.g., epitaxial layers 126) for a subsequently-formed metal gate.

In the present embodiments, the epitaxial layers 128 may have a thickness 128T greater than a thickness 126T of the epitaxial layers 126. For example, a thickness of the epitaxial layers 128 may be in a range from about 7 nanometers to about 13 nanometers, and a thickness of the epitaxial layers 126 may be in a range from about 4 nanometers to about 10 nanometers. Germanium atoms may diffuse from SiGe epitaxial layers (e.g., the epitaxial layers 126) into Si epitaxial layers (e.g., the epitaxial layers 128) during processes, and the germanium diffusion may thin the Si epitaxial layers. The greater thickness 128T of the epitaxial layers 128 may compensate the thinning of the Si layers (e.g., the epitaxial layers 128) due to the germanium diffusion. In some other embodiments, the thickness 128T of the epitaxial layers 128 may be equal to or less than the thickness 126T of the epitaxial layers 126. In the present embodiments, the epitaxial layer 122 may have a thickness 122T greater than the thickness 126T of the epitaxial layers 126, or even greater than the thickness 128T of the epitaxial layers 128. In the present embodiments, the epitaxial layer 124 may have a thickness 124T equal to or greater than the thickness 128T of the epitaxial layers 128. By these thickness designs, the epitaxial layer 122 and 124 can serve as etch stop layers in subsequent etching process. In some embodiments, since the topmost epitaxial layer 128 may be consumed during various subsequent deposition/etching processes, the topmost epitaxial layer 128 may be designed to have a thickness greater than the underlying epitaxial layers 128.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers 122-128 include suitable semiconductor material, such as like Si, Ge, Sn, SiGe, GeSn, III-V semiconductor, the like, or the combination thereof. In some embodiments, the epitaxially grown layers 124 and 128 may include a same semiconductor material as that of the substrate 110. In some embodiments, the epitaxially grown layers 122 and 126 include a different material than the substrate 110. In some other embodiments, at least one of the layers 122-128 may include other materials such as a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. As discussed, the materials of the layers 122-128 may be chosen based on providing differing oxidation and/or etching selectivity properties. In some embodiments, the layers 122-128 are substantially dopant-free, where for example, no intentional doping is performed during the epitaxial growth process.

In some embodiments, the substrate 110 may be lightly doped to form wells. For example, the substrate 110 may be doped with p-type dopants to form a p-type well in the region NR, and the substrate 110 may be doped with n-type dopants to form a n-type well in the region PR. In some embodiments, a dopant concentration of the layers 122 and 124 may be less than a doping concentration of the substrate 110. Therefore, the well leakage is lowered by the configuration of the layers 122 and 124.

Figure 2B:
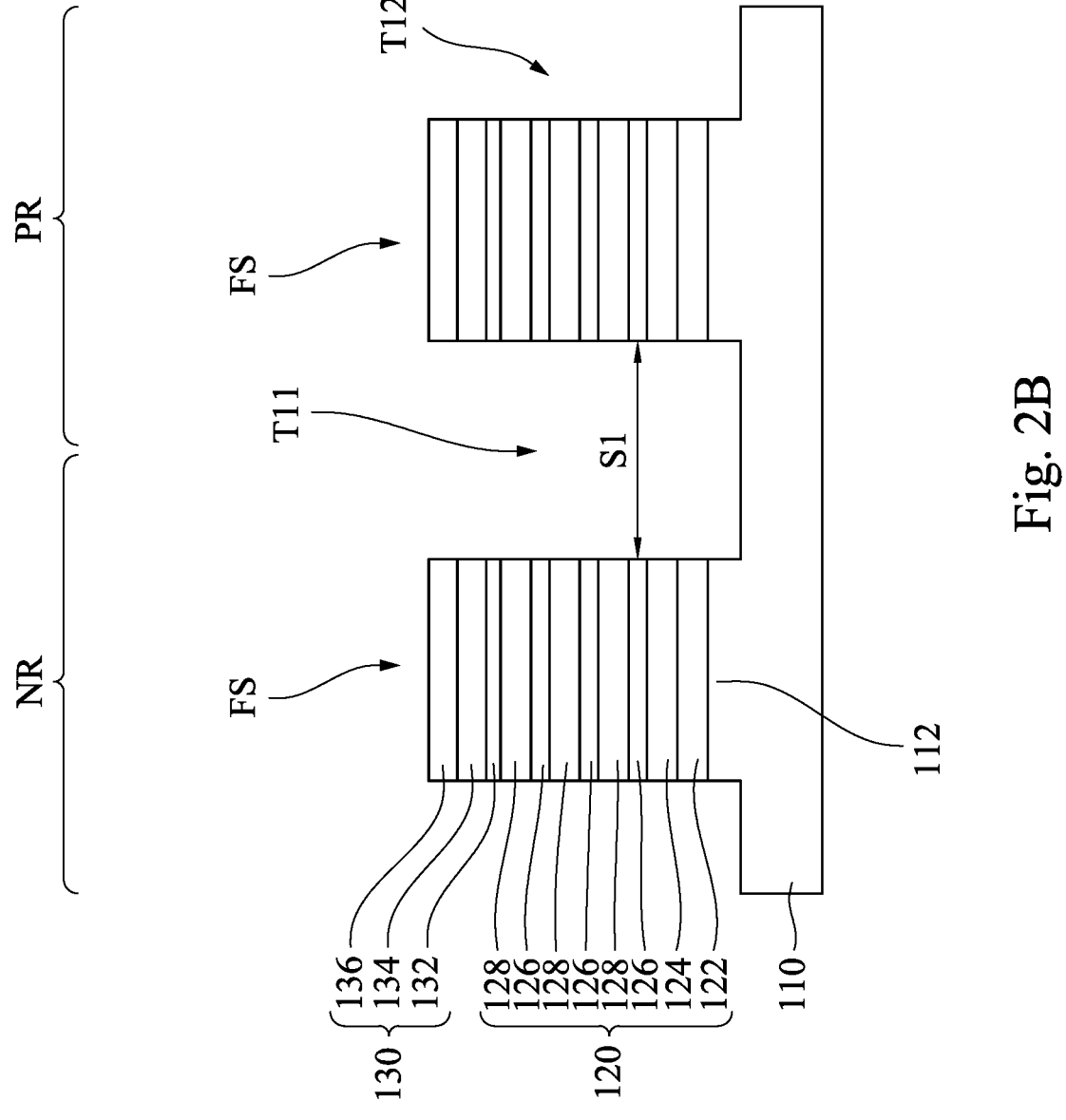

Reference is made to FIGS. 2A and 2B. A plurality of semiconductor fins FS extending from the substrate 110 are formed. The semiconductor fins FS may extend substantially along a direction X. In various embodiments, each of the fins FS includes a substrate portion 112 formed from the substrate 110 and portions of each of the epitaxial layers 122-128 of the epitaxial stack 120. The fins FS may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins FS by etching initial epitaxial stack 120. The etching process can include dry etching, wet etching, reactive ion etching (RIE), and/or other suitable processes.

In the embodiments as illustrated in FIGS. 1 and 2B, a hard mask (HM) layer 130 is formed over the epitaxial stack 120 prior to patterning the fins FS. In some embodiments, the HM layer 130 includes an oxide layer 132 (e.g., a pad oxide layer that may include $SiO_2$), a nitride layer 134 (e.g., a pad nitride layer that may include $Si_3N_4$) formed over the oxide layer, and an oxide layer 136 (e.g., $SiO_2$). The oxide layer 132 may act as an adhesion layer between the epitaxial stack 120 and the nitride layer 134 and may act as an etch stop layer for etching the nitride layer 134. In some examples, the oxide layer 132 includes thermally grown oxide, chemical vapor deposition (CVD)-deposited oxide, and/or atomic layer deposition (ALD)-deposited oxide. In some embodiments, the nitride layer 134 is deposited on the oxide layer 132 by CVD and/or other suitable techniques. In some embodiments, the oxide layer 136 is deposited on the nitride layer 134 by CVD and/or other suitable techniques. In some embodiments, a thickness of the HM layer 130 may be in a range from about 45 nanometers to about 60 nanometers. If the thickness of the HM layer 130 is less than about 45 nanometers, the HM layer 130 may not effectively protect the semiconductor materials in subsequent processes. If the thickness of the HM layer 130 is greater than about 60 nanometers, it may become difficult to remove the HM layer 130 later.

The fins FS may be subsequently fabricated using suitable processes including photolithography and etch processes. The photolithography process may include forming a photoresist layer (not shown) over the HM layer 130, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process. The patterned mask may then be used to protect regions of the substrate 110, and layers formed thereupon, while an etch process forms trenches T11 and T12 in unprotected regions through the HM layer 130, through the epitaxial stack 120, and into the substrate 110, thereby leaving the plurality of extending fins FS. The trenches T11 and T12 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fins FS. In some embodiments, a width of the fins FS may be in a range from about 10 nanometers to about 45 nanometers. If the width of the fins FS is less than about 10 nanometers, defects from processes (e.g., lithography and etching) may become serious. If the width of the fins FS is greater than about 45 nanometers, a device size may be unnecessarily enlarged.

In some embodiments, the formed fins FS may be paired. Each pair of the fins FS may have a first spacing S1 therebetween, and two neighboring pairs of the fins FS may have a second spacing S2 therebetween, in which the second spacing S2 is greater than the first spacing S1. The spacing S1 may be in a range from about 15 to about 35 nanometers. If the spacing S1 is less than about 15 nanometers, defects from lithography, etching, and gap filling process may become serious. If the spacing S1 is greater than about 35 nanometers, the distance between transistors may be unnecessarily increased. For example, each of the trenches T11 is located between a pair of fins FS, and the trenches T12 is located between two neighboring pairs of the fins FS, in which the trenches T11 is narrower than the trenches T12. In the present embodiments, one of the paired fins FS is for a n-type device, and the other of the paired fins FS is for a p-type device. And, two adjacent fins FS spaced apart by the trench T12 are respectively for the p-type devices. In some areas (not shown in the figure), the two adjacent fins FS spaced apart by the trench T12 may be respectively for the n-type devices. For clear illustration, the substrate 110 is illustrated as having regions NR where n-type devices are to be formed and regions PR where p-type devices are to be formed.

Figure 3:
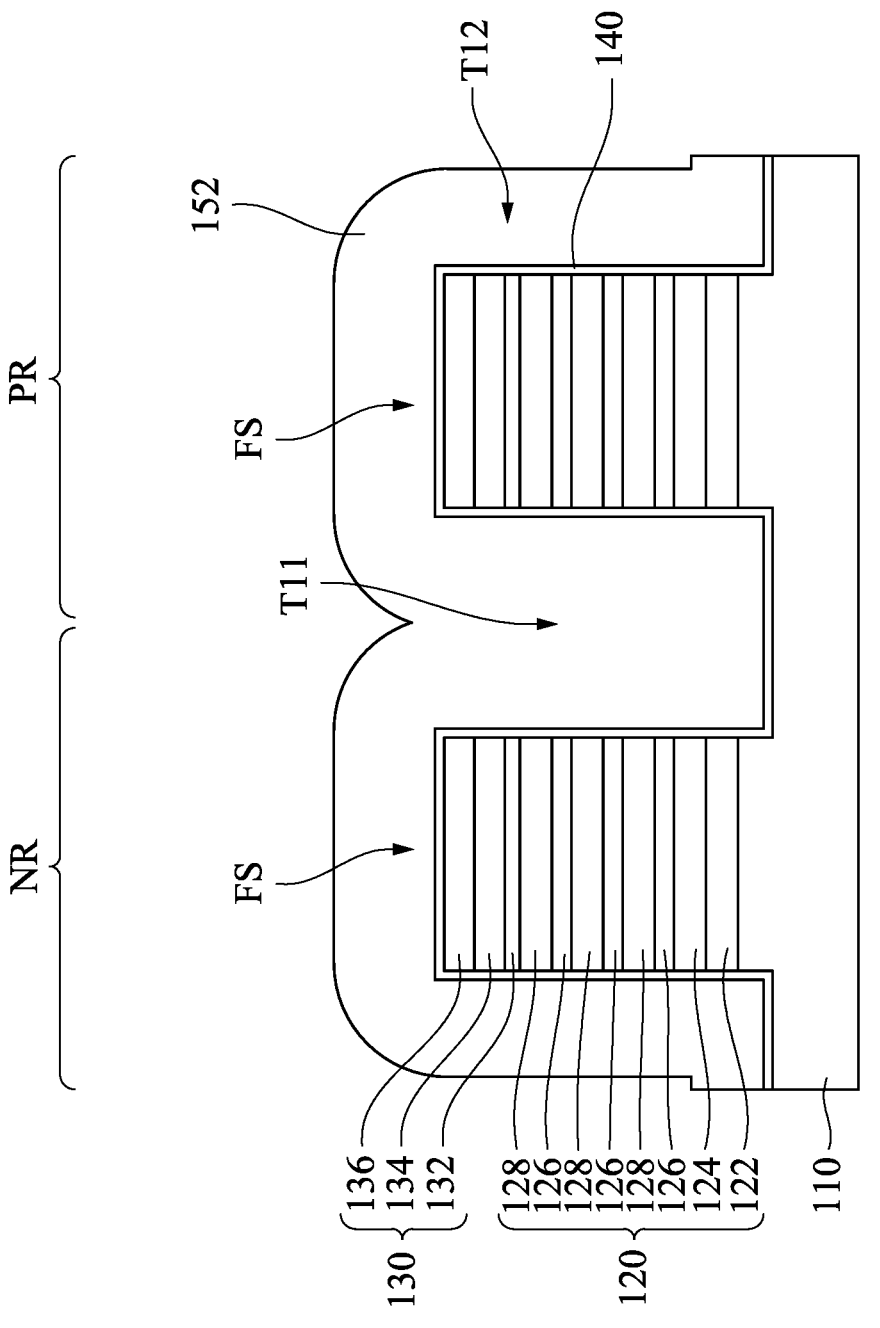
Figure 4:
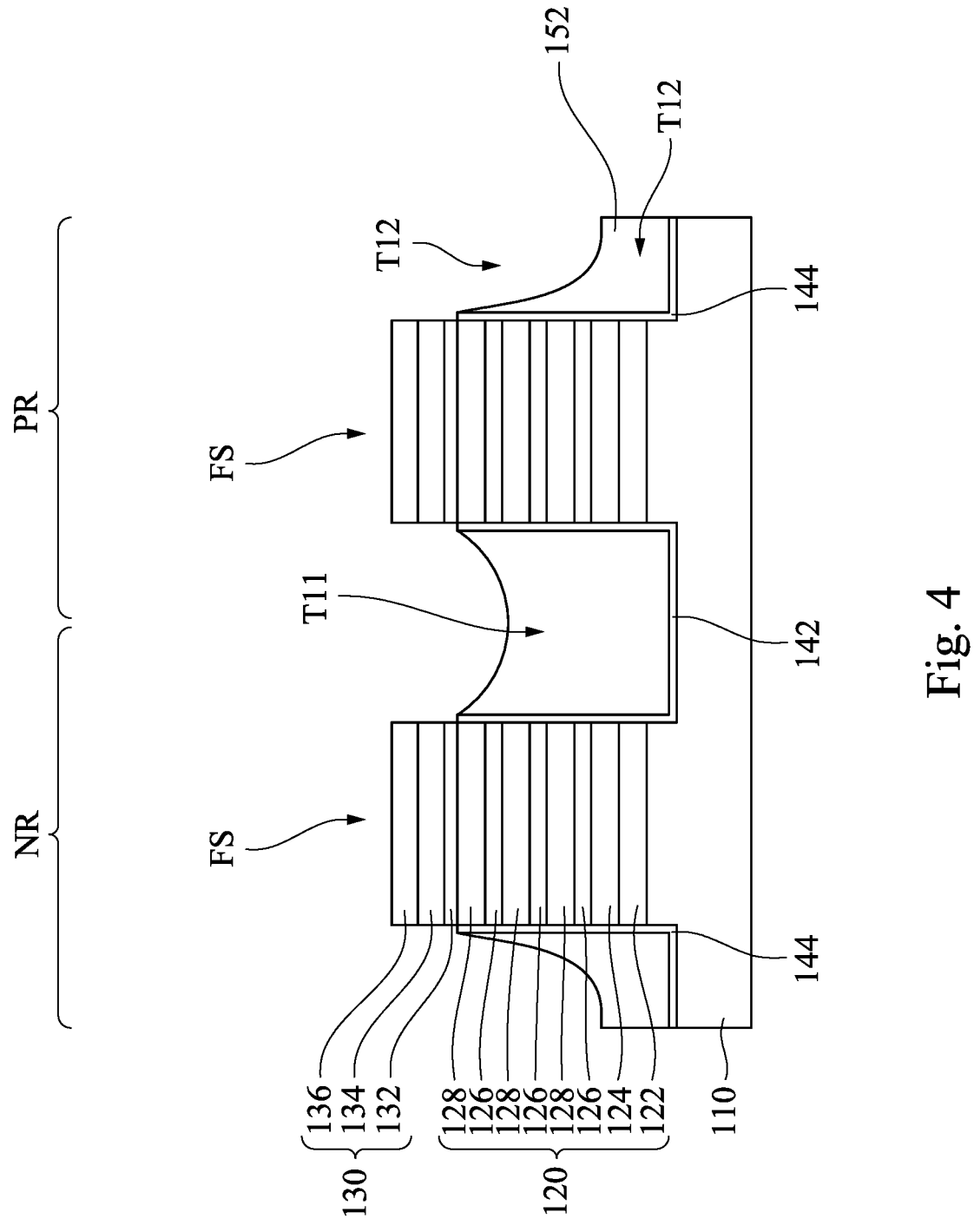
Figure 5:
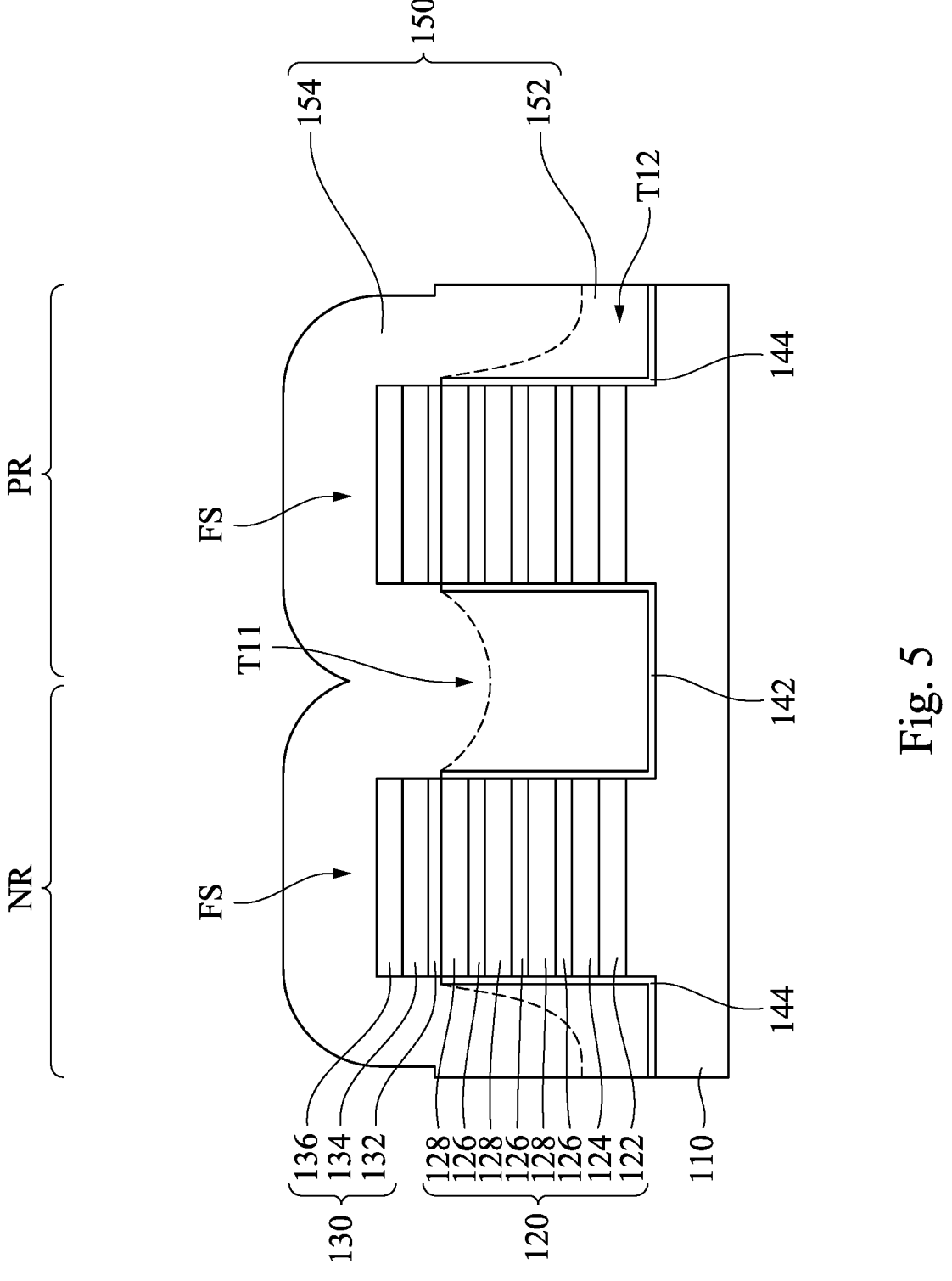

Reference is made to FIGS. 3-5, where a layer formation process is performed. The layer formation process may include one or more deposition processes and one or more etching processes. Prior to the layer formation process, referring to FIG. 3, a liner layer 140 is deposited over the structure of FIG. 2B. The liner layer 140 may include a semiconductor material (e.g., Si) or a semiconductor oxide material (e.g., $SiO_2$). The liner layer 140 may protect the epitaxial layers 122-128 of the stack 120 from the subsequent processes.

Still referring to FIG. 3, a dielectric layer 152 is conformally deposited on the liner layer 140 using CVD, ALD, or a suitable deposition method. The dielectric layer 152 may include low-k dielectric materials. The dielectric layer 152 may be a single-layer or a multi-layer structure. In some embodiments, the dielectric layer 152 includes SiN, SiCN, SiOC, SiOCN or the like. Due to various spacing S1 and S2 between the fins FS, the dielectric layer 152 completely fills the trench T11, which is narrower than the trench T12, but does not completely fill the trench T12.

Referring to FIG. 4, an etching process is performed to remove top portions of the dielectric layer 152 and top portions of the liner layer 140 (referring to FIG. 3). The top surfaces of the dielectric layer 152 and the top surfaces/ends of the liner layer 140 (referring to FIG. 3) are lowered, for example, to a position lower than a top surface of the HM layer 130. After the etching process, remaining portions of the liner layer 140 (referring to FIG. 3) are referred to as liners 142 and 144 in trenches T11 and T12, respectively. The etching process is controlled such that the top ends of the liners 142 and 144 are level with or higher than a top surface of the topmost epitaxial layer 128. In the present embodiments, the top ends of the liners 142 and 144 are lower than a top surface of the oxide layer 132. In some alternative embodiments, the top ends of the liners 142 and 144 are higher than a top surface of the oxide layer 132 but lower than a top surface of the nitride layer 134. In still alternative embodiments, the top ends of the liners 142 and 144 are higher than a top surface of the nitride layer 134 but lower than a top surface of the oxide layer 136.

Referring to FIG. 5, a dielectric layer 154 is conformally deposited on the structure of FIG. 4 using CVD, ALD, or a suitable deposition method. The dielectric layer 154 may include low-k dielectric materials. The dielectric layer 154 may be a single-layer or a multi-layer structure. In some embodiments, the dielectric layer 154 includes SiN, SiCN, SiOC, SiOCN or the like. Due to various spacing S1 and S2 between the fins FS, the dielectric layer 154 completely fills the trench T11, which is narrower than the trench T12, but does not completely fill the trench T12. In the present embodiments, the dielectric layer 154 may include a same material (e.g., SiCN) as that of the dielectric layer 152. In some other embodiments, the dielectric layer 154 may include a different material than the dielectric layer 152. The dielectric layer 152 and 154 may be collectively referred to as a dielectric layer 150. In the present embodiments, while the top ends of the liners 142 and 144 are lower than the top surface of the HM layer 130, the dielectric layer 150 filling the trench T11 may cover the top ends of the liners 142 and 144 and be in contact with sidewalls of the HM layer 130.

Figure 6A:
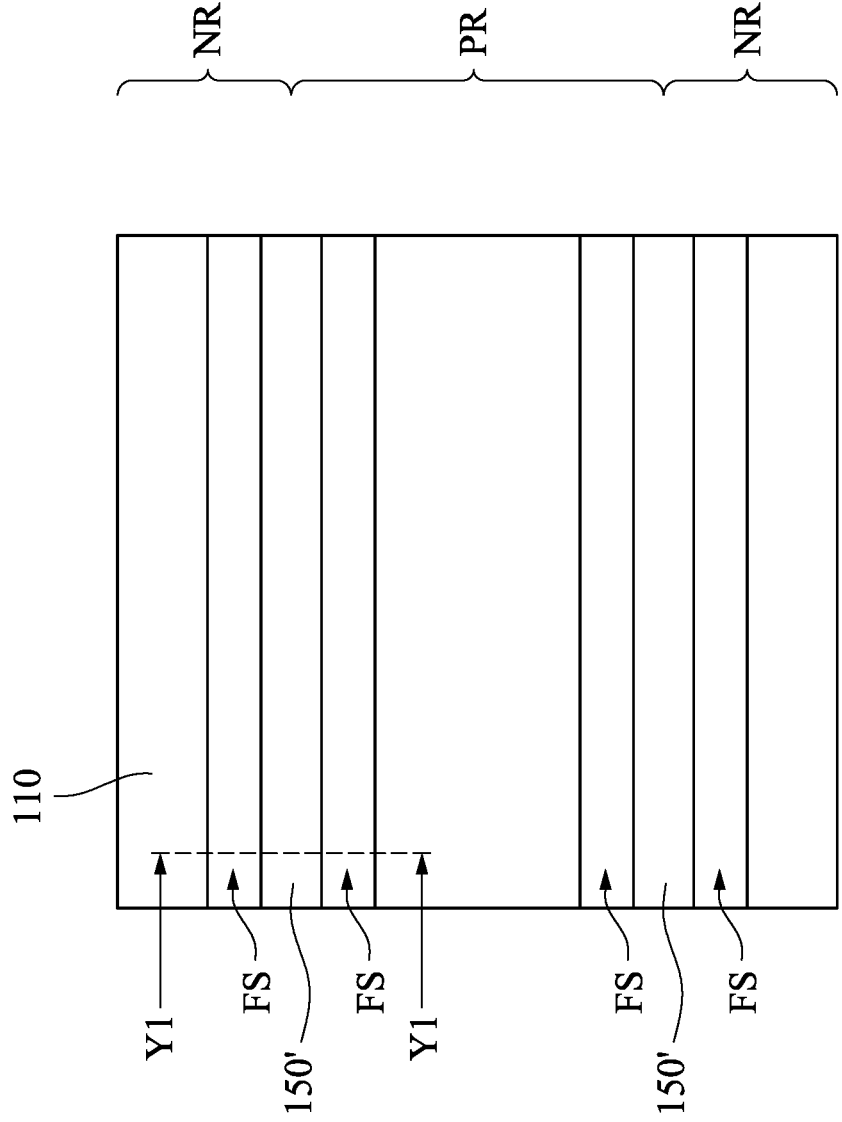
Figure 6A:
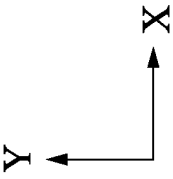
Figure 6B:
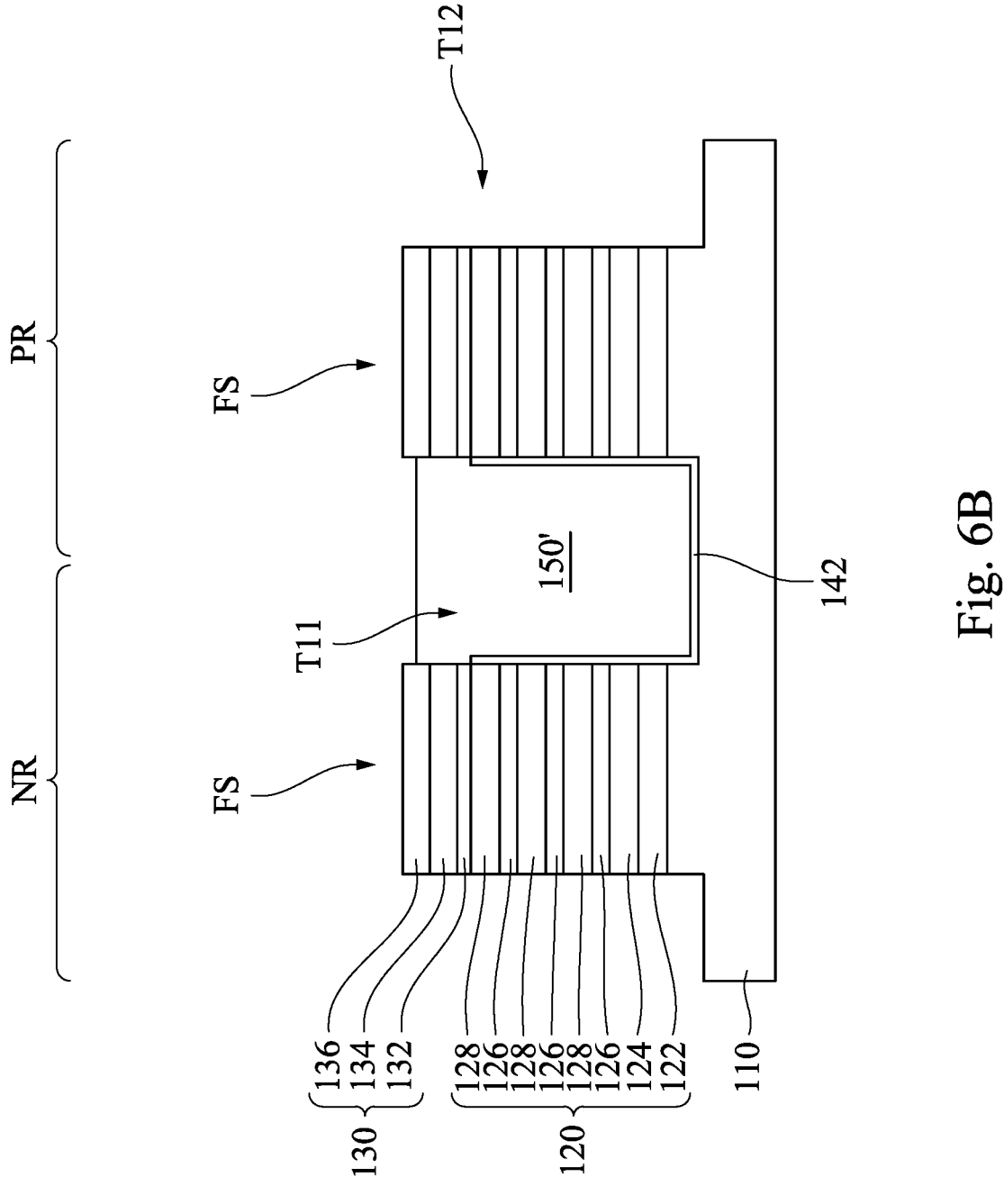

Reference is made to FIGS. 6A and 6B. An etching back process is performed to remove a top portion of the dielectric layer 150 (referring to FIG. 5) in the trenches T11 and completely remove the dielectric layer 150 from the trenches T12. In some embodiments, the etching back process may be a dry etching process that uses oxygen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. The liners 144 may also be removed from the trenches T12 by the etching back process. Unlike the narrower trenches T11 which are entirely filled by the dielectric layer 150 (referring to FIG. 3), the wider trenches T12 allow etchant to etch sidewalls and bottom surface of the dielectric layer 150 (referring to FIG. 5) from inside the trenches T12, such that the dielectric layer 150 (referring to FIG. 5) are removed from the wider trenches T12 in a faster rate than from the narrower trenches T11. As shown in FIGS. 6A and 6B, the dielectric layer 150 (referring to FIG. 5) are removed from the wider trenches T12, while a portion of the dielectric layer 150 (referring to FIG. 5) remains in the narrower trenches T11. The remaining portion of the dielectric layer 150 may be referred to as dielectric walls 150' hereinafter. The etching back process, a top end of the dielectric walls 150' may be higher than a top surface of the epitaxial stack 120 and lower than a top surface of the HM layer 130. In some embodiments, through the layer formation process including deposition and etching processes, the dielectric walls 150' can cover the top ends of the liners 142. For example, the dielectric wall 150' is in contact with the lowered top end of the liners 142. In some embodiments, the formation of the dielectric wall 150' (referring to FIGS. 3-6B) is performed such that a top end of the liner layer 140 (also referred to as the liners 142) is lowered to a position level with or higher than a top surface of the epitaxial stack 120, and the dielectric wall 150' is in contact with the lowered top end of the liner layer 140 (also referred to as the top end of the liners 142).

Figure 7A:
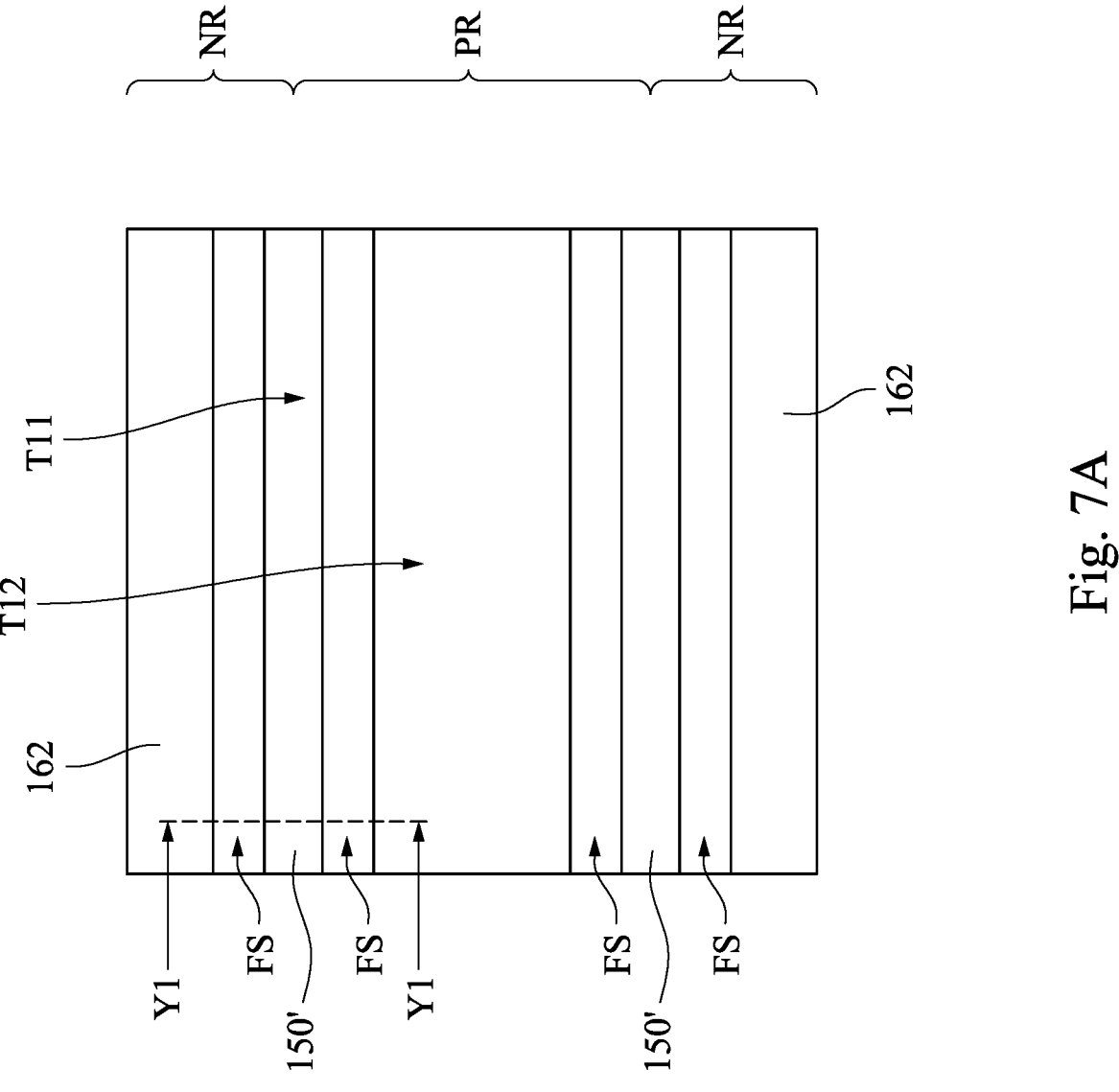
Figure 7B:
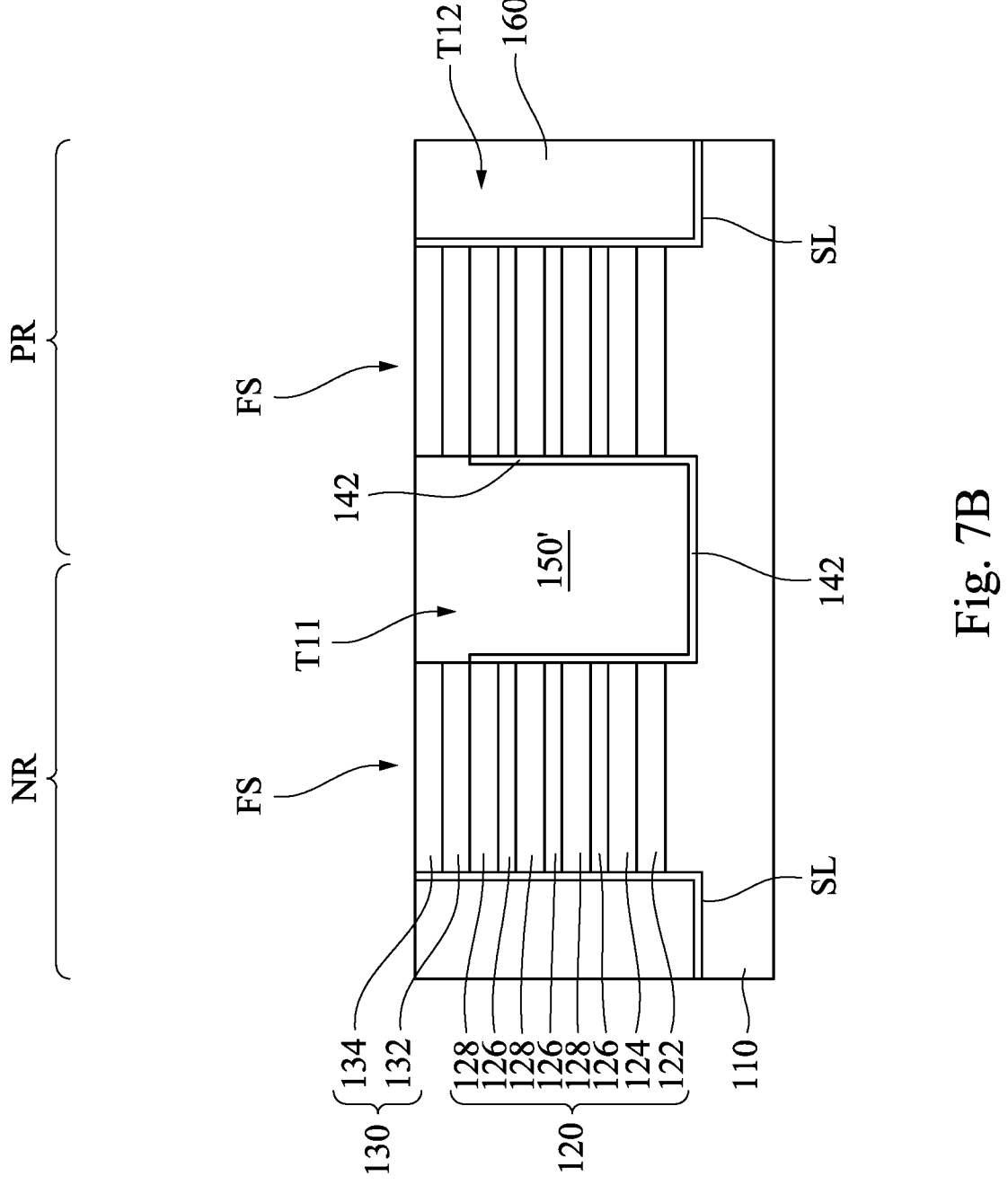

Reference is made to FIGS. 7A and 7B. A liner layer SL may be conformally deposited over the structure of FIGS. 6A and 6B, and a dielectric material 160 is then formed over the substrate 100 and on opposing sides of the fins FS. The liner layer SL may include a semiconductor material (e.g., Si) or a semiconductor oxide material (e.g., $SiO_2$). The dielectric material 160 may include silicon oxide, silicon nitride, silicon oxynitride, fluorine-doped silicate glass (FSG), a low-k dielectric, combinations thereof, and/or other suitable materials. In various examples, the dielectric material 160 may be deposited by a CVD process, a subatmospheric CVD (SACVD) process, a flowable CVD process, an ALD process, a physical vapor deposition (PVD) process, and/or other suitable process. In some embodiments, the dielectric material 160 may include a multi-layer structure, for example, having one or more liner layers. Other dielectric materials formed by any acceptable process may be used. In the illustrated embodiments, the dielectric material 160 is silicon oxide formed by a FCVD process. An anneal process may be performed after the dielectric material 160 is formed. The dielectric material 160 may have materials different from the materials of the dielectric walls 150' to achieve etching selectivity.

In some embodiments, the dielectric material 160 is formed to overfill the trenches T12, such that excess dielectric material 160 covers the fins FS. Next, a removal process is applied to the liner layer SL and the dielectric material 160 to remove excess liner layer SL and dielectric material 160 above the fins FS. In some embodiments, a planarization process may include a chemical mechanical polish (CMP). The HM layer 130 (e.g., the nitride layer 134) may serve as a CMP stop layer. The planarization process exposes the HM layer 130 (e.g., the nitride layer 134) such that a top surface of the nitride layer 134, top ends of the liner layer SL, top surfaces of the dielectric material 160, and the dielectric wall 150' are level after the planarization process is complete.

Figure 8:
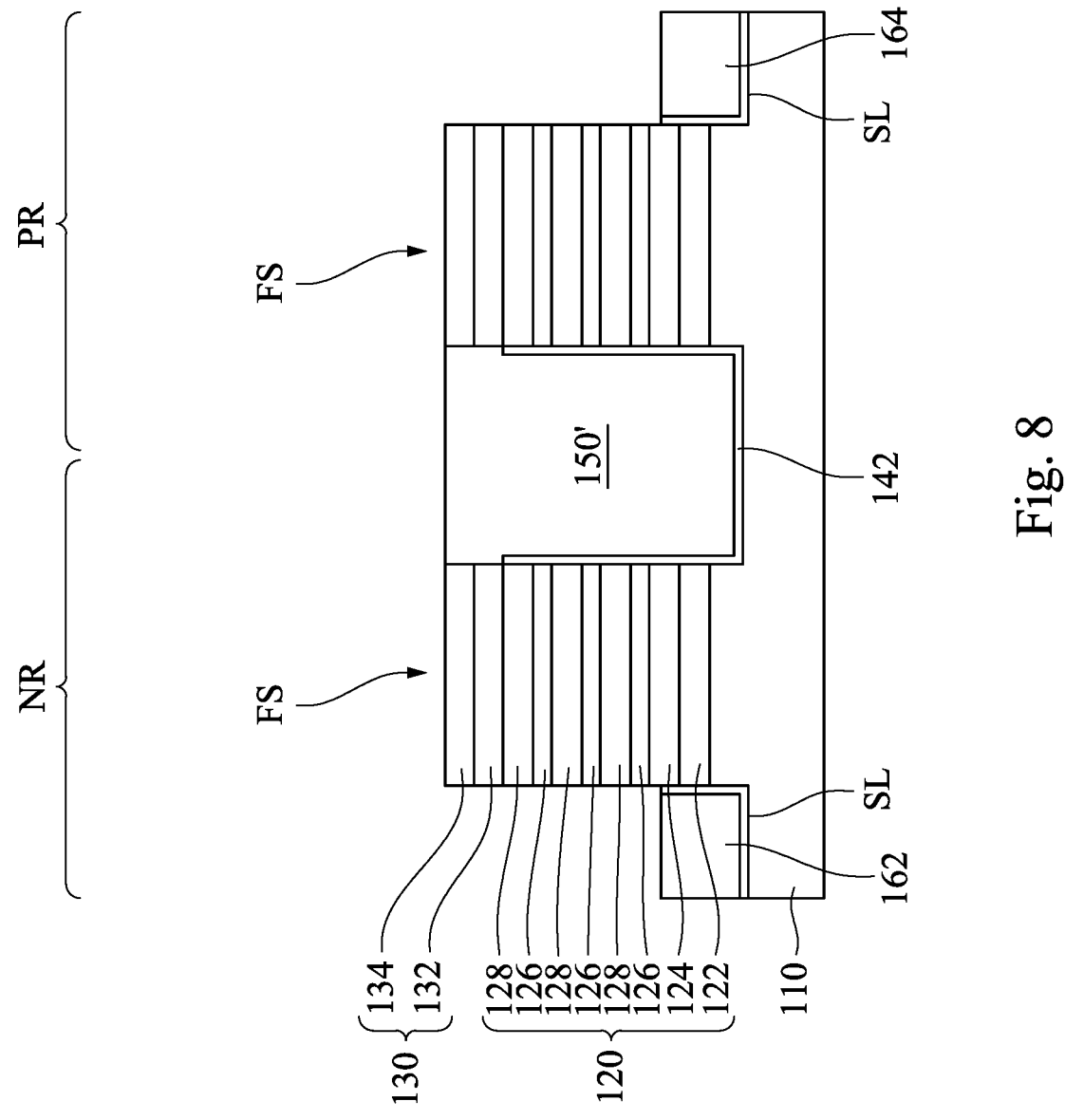

Reference is made to FIG. 8. An etching back process is performed to remove a top portion of the dielectric material 160 (referring to FIGS. 7A and 7B) above the epitaxial layer 122, thereby recessing the dielectric material 160 (referring to FIGS. 7A and 7B). The top of the liners SL may also be lowered by the etching back process. The etching back process may include a wet etch, a dry etch, or the combination thereof. In some embodiments, a recessing depth is controlled (e.g., by controlling an etching time) so as to result in a desired height of the exposed upper portion of the fins FS. In the illustrated embodiments, the desired height exposes each of the layers 126 and 128 of the epitaxial stack 120 in the fins FS. Due to the etch selectivity between the nitride layer 134 and the dielectric material 160 (referring to FIGS. 7A and 7B), the nitride layer 134 may protect the underlying epitaxial stack 120 from being damaged by the etching back process. After the etching back process, portions of the dielectric material 160 (referring to FIGS. 7A and 7B) remain in the trenches T12 and interpose the fins FS. The remaining portions of the dielectric material 160 (referring to FIGS. 7A and 7B) may be referred to as shallow trench isolation (STI) structures 162 and 164, which respectively neighboring the fin FS of the n-type device in the region NR and the fin FS of the p-type device in the region PR. Top surfaces of the STI structures 162 and 164 may be laterally aligned with the epitaxial layer 124. For example, the top surfaces of the STI structures 162 and 164 may be at a level higher than a top surface of the epitaxial layer 122 and lower than a bottom surface of the bottommost epitaxial layer 126.

In some embodiments of the present disclosure, the dielectric wall 150' may have a higher etch resistance to the etching back process than that of the liners 142. The dielectric walls 150' covering the top ends of the liners 142 can protect the liners 142 from being damaged by the etching back process, and prevent the epitaxial stack 120 from be exposed at wall side.

Figure 9:
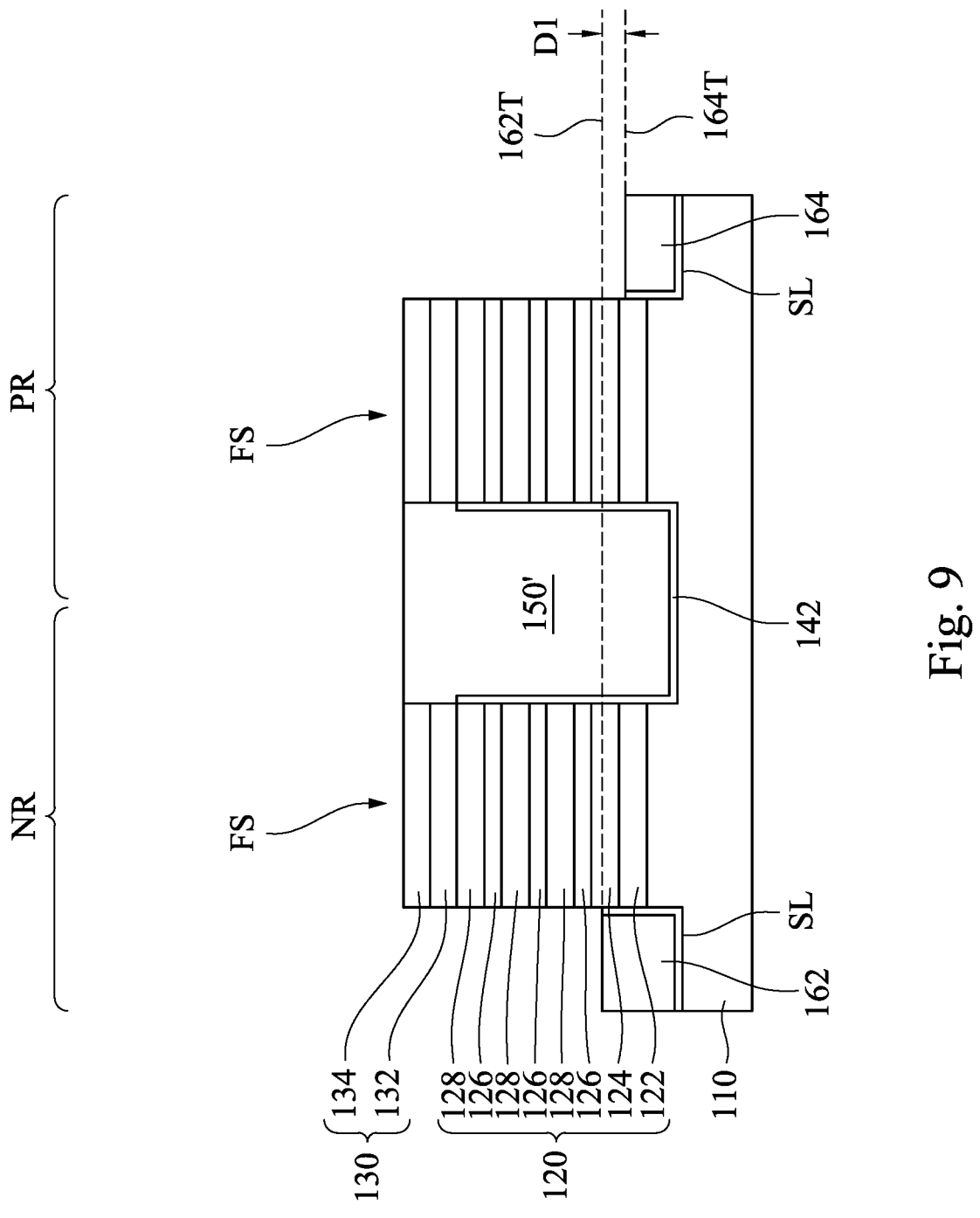

Reference is made to FIG. 9. The STI structure 164 is further recessed by suitable photolithography and etching techniques. The top of the liner SL adjacent the STI structure 164 may also be lowered by the etching back process. The photolithography process may include forming a photoresist layer (not shown) over the structure of FIG. 8, exposing the photoresist to a pattern, performing post-exposure bake processes, and developing the resist to form a patterned mask including the resist. The patterned mask covers the region NR and exposes the region PR. The etching process may include a wet etch, a dry etch, or the combination thereof. The etching process may remove a top portion of the STI structure 164 in the region PR exposed by the resist mask, while the STI structure 162 in the region NR covered by the resist mask is protected from being etched. The patterned mask may be removed by suitable stripping process after the etching processes.

In some embodiments, a recessing depth of the STI structure 164 is controlled (e.g., by controlling an etching time) so as to expose a sidewall of the epitaxial layer 124. After the recessing process, the top surface 162T of the isolation structure 162 is laterally aligned with the epitaxial layer 124, and the top surface 164T of the isolation structure 164 is laterally aligned with the epitaxial layer 122. For example, the top surface 162T of the STI structure 162 may be at a level higher than a top surface of the epitaxial layer 122 and lower than a bottom surface of the bottommost epitaxial layer 126, and the top surface 164T of the isolation structure 164 may be at a level higher than a top surface of the substrate 110 and lower than a bottom surface of the epitaxial layer 124. The top surface 164T of the STI structure 164 is lower than the top surface 162T of the STI structure 162. For example, a height difference DI is between the top surface 164T of the STI structure 164 and the top surface 162T of the STI structure 162 in a direction normal to a top surface of the substrate 110. The height difference DI may be in a range from about 4 nanometers to about 10 nanometers. If the height difference is less than 4 nanometers or greater than 10 nanometers, a subsequent channel releasing process may become difficult, or may damage underlying epitaxial layers The loadings of the STI structure are designed according to the n-type and p-type devices.

Figure 10:
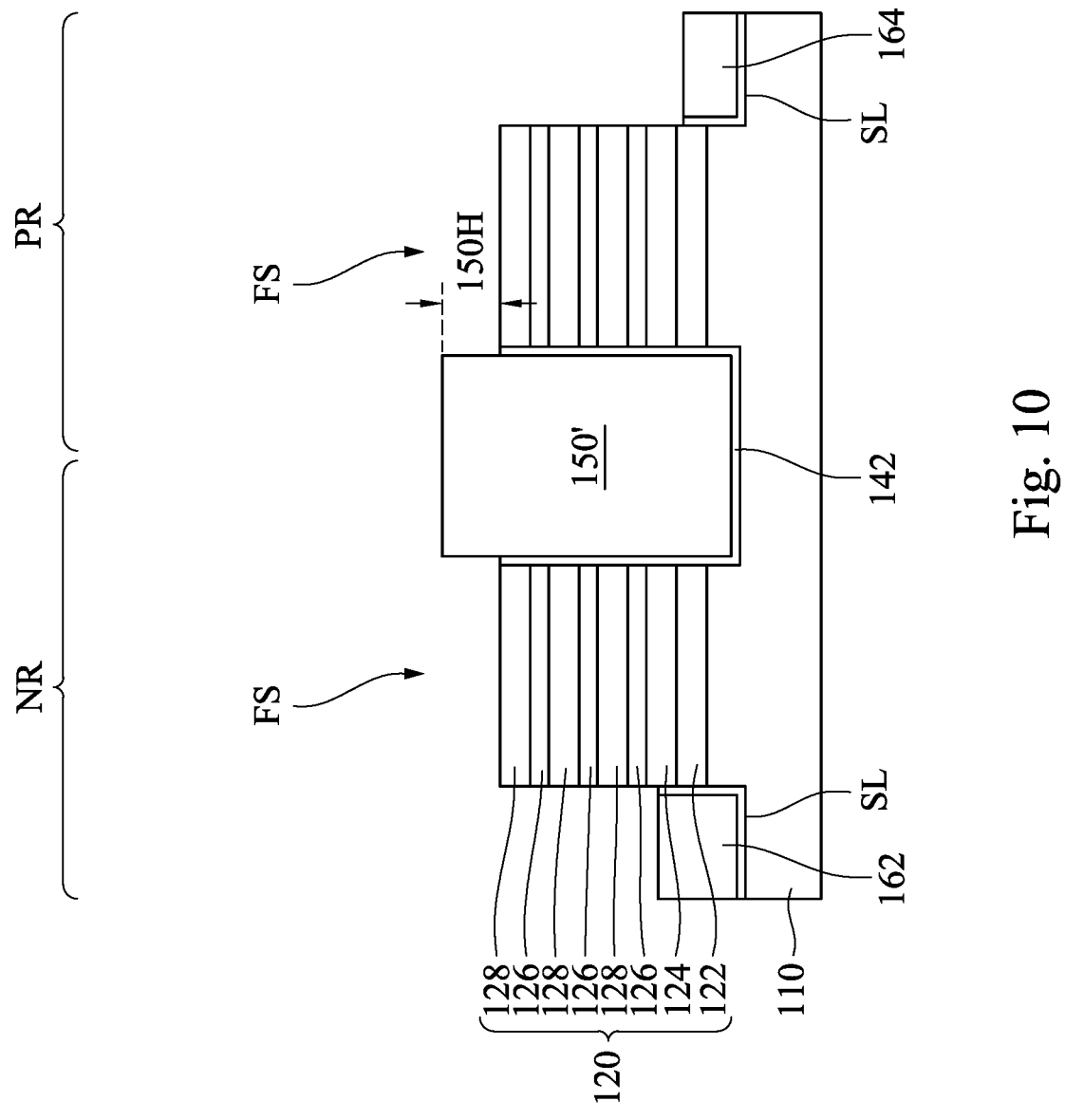

Reference is made to FIG. 10. After recessing the STI structure 164 (referring to FIG. 9), one or more etch processes are performed to may remove the HM layer 130, thereby exposing a topmost epitaxial layer 128. After removing the HM layer 130, the top surface of the dielectric wall 150' is higher than the topmost epitaxial layer 128 by a vertical distance 150H. For example, the vertical distance 150H may be in a range from about 5 nanometers to about 20 nanometers. If the vertical distance 150H is less than about 5 nanometers, the HM layer 130 (referring to FIG. 9) may not protect the underlying semiconductor materials from being etched in previous etch process. If the vertical distance 150H is greater than about 20 nanometers, it may unnecessarily increase a thickness of the HM layer 130 (referring to FIG. 9), and takes a long time to remove the HM layer 130 (referring to FIG. 9).

Figure 11:
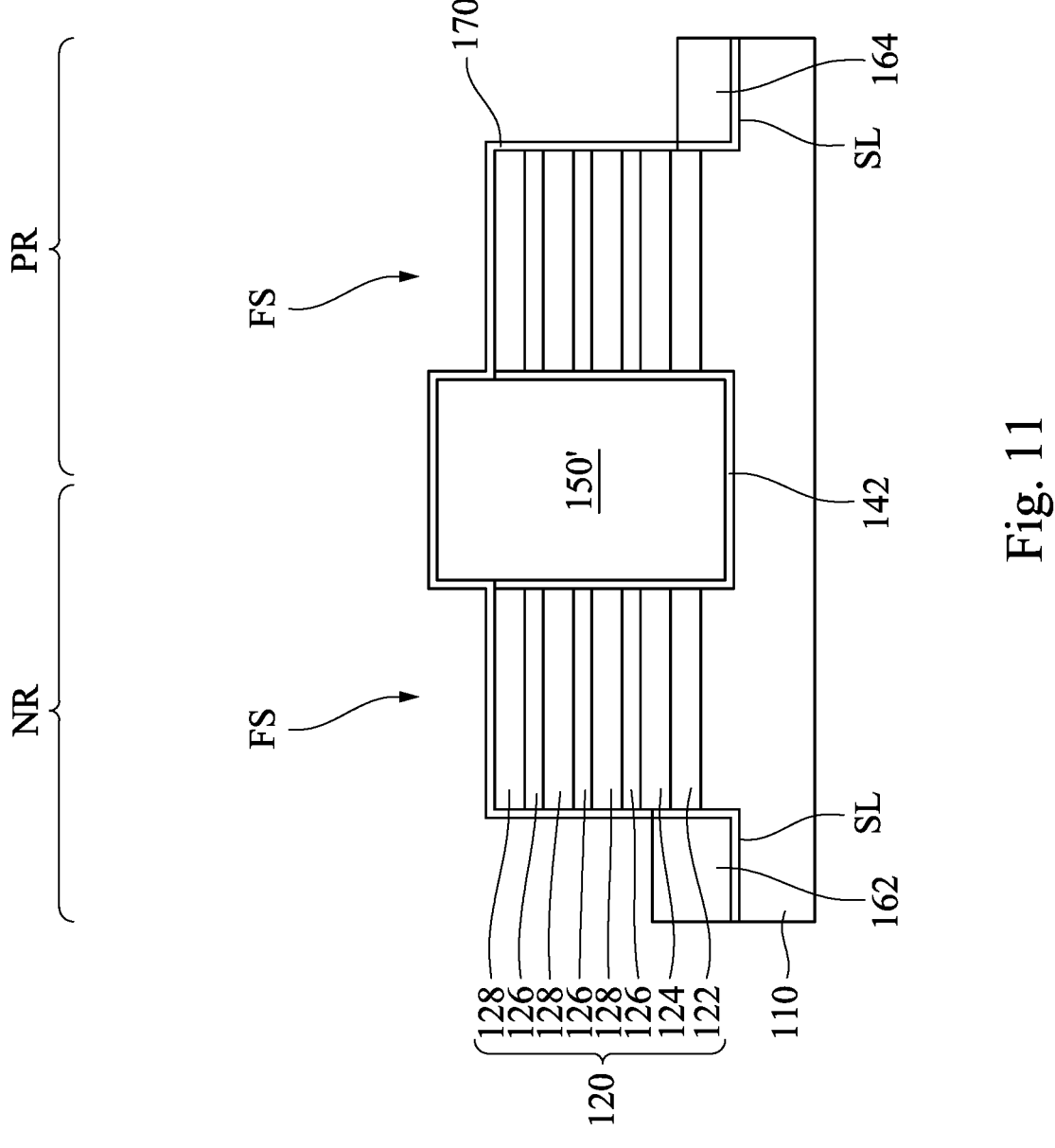

Reference is made to FIG. 11. A dielectric capping layer 170 is formed over the structure of FIG. 10. The dielectric capping layer 170 may be formed of a dielectric material such as silicon oxide, silicon nitride, a combination thereof, or the like. The formation of the dielectric capping layer 170 may include thermal grown, CVD, ALD, or the combination thereof. The dielectric capping layer 170 may be referred to as a dummy gate dielectric layer.

Figure 12:
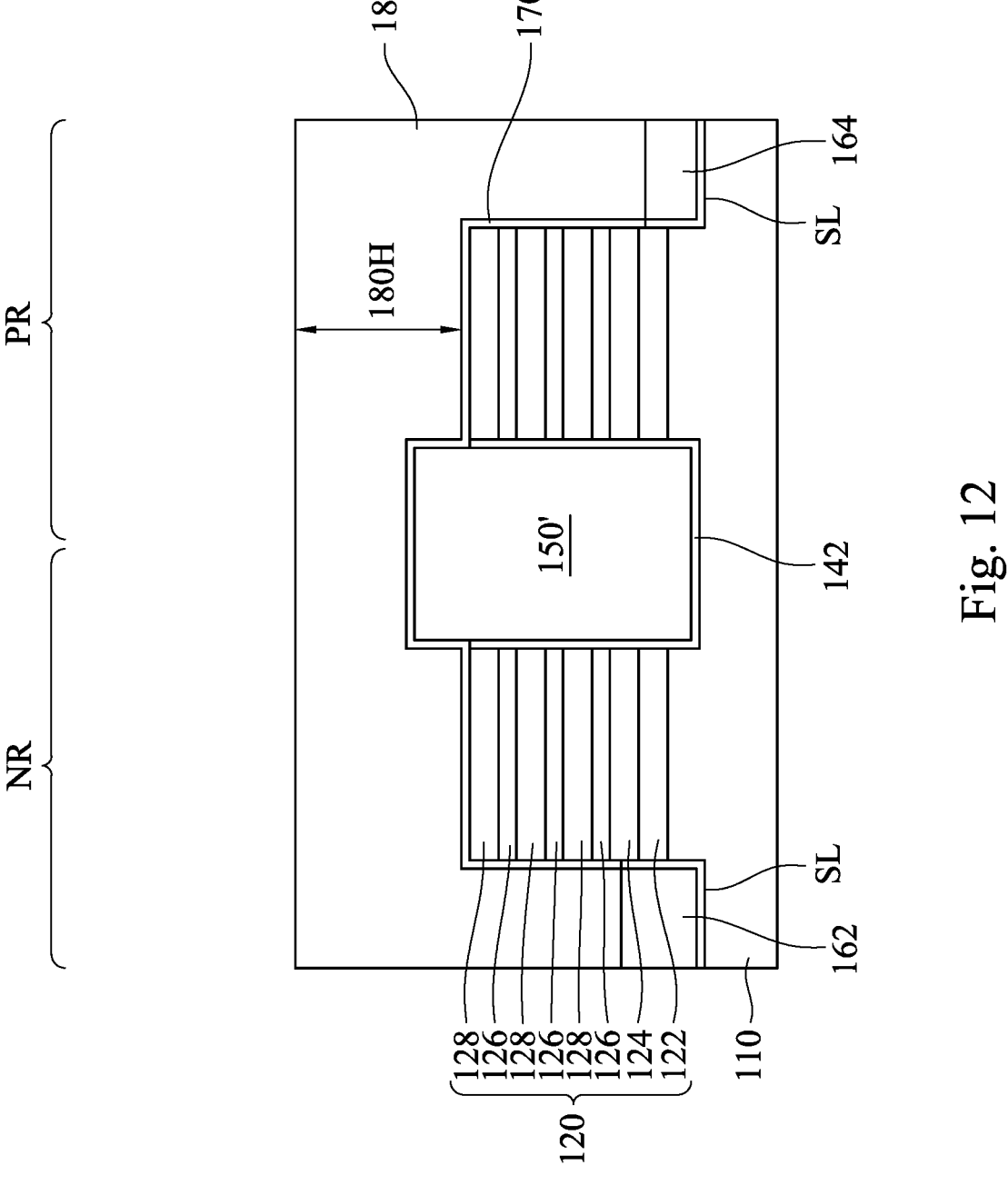
Figure 13A:
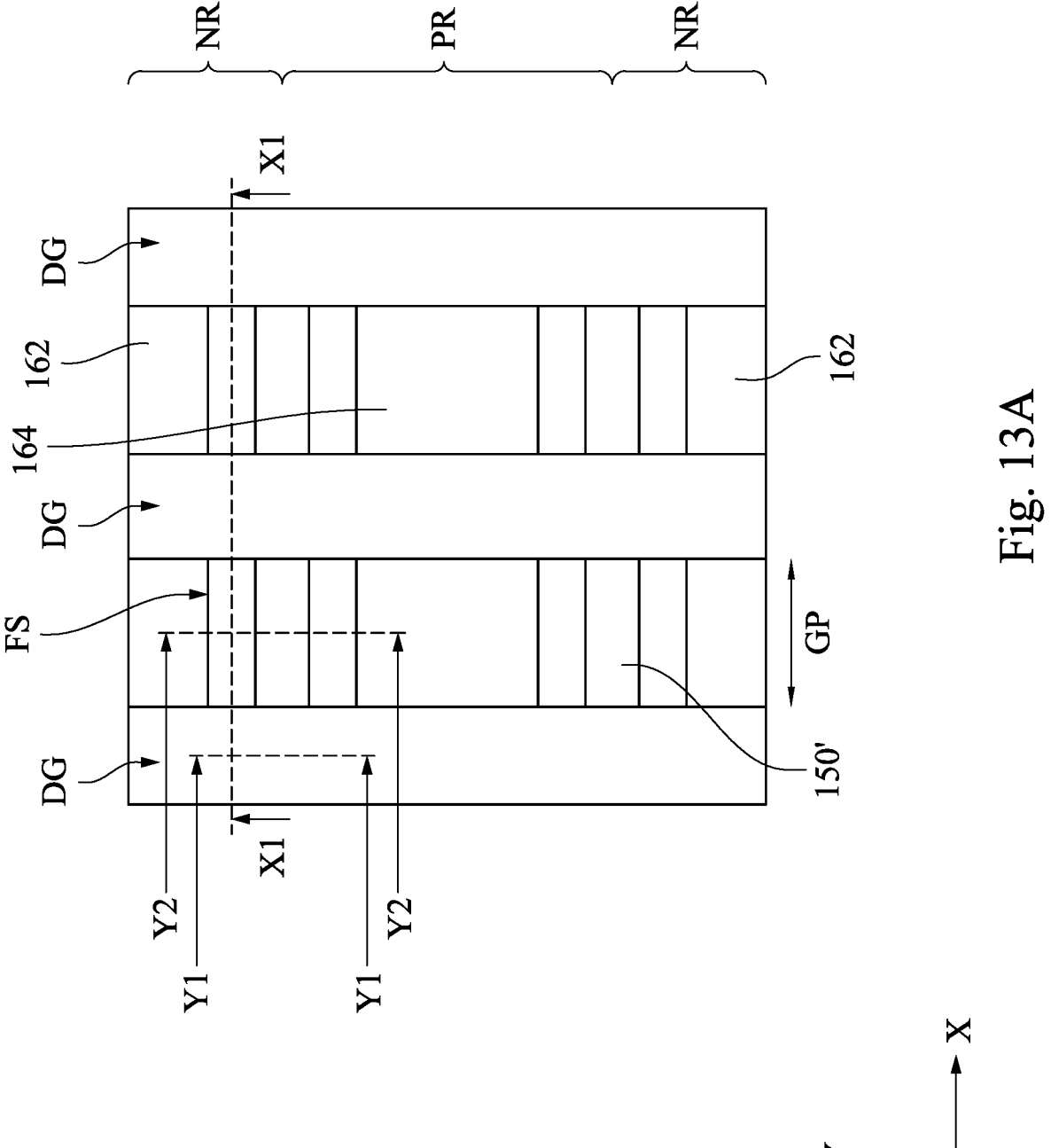
Figure 13B:
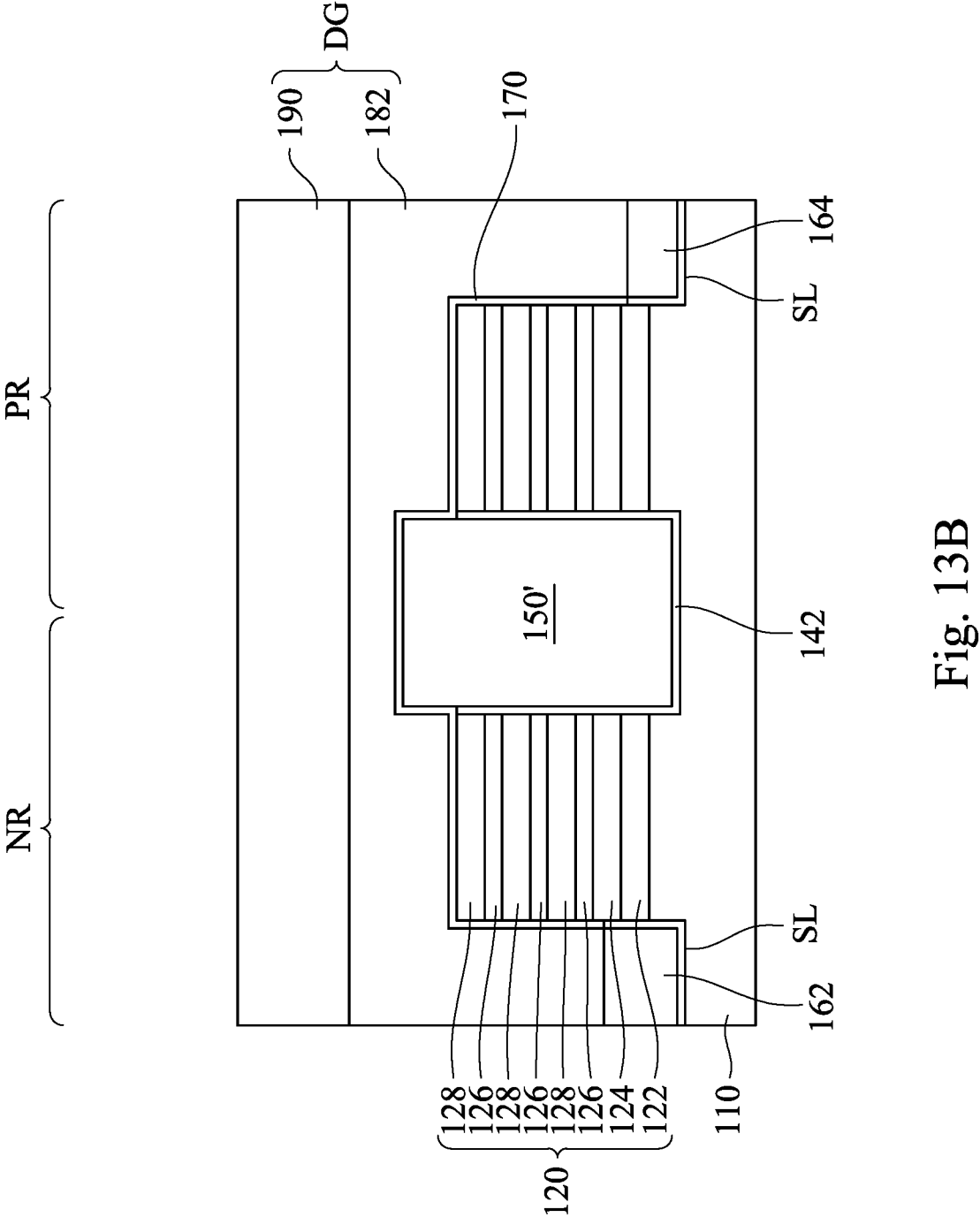
Figure 13C:
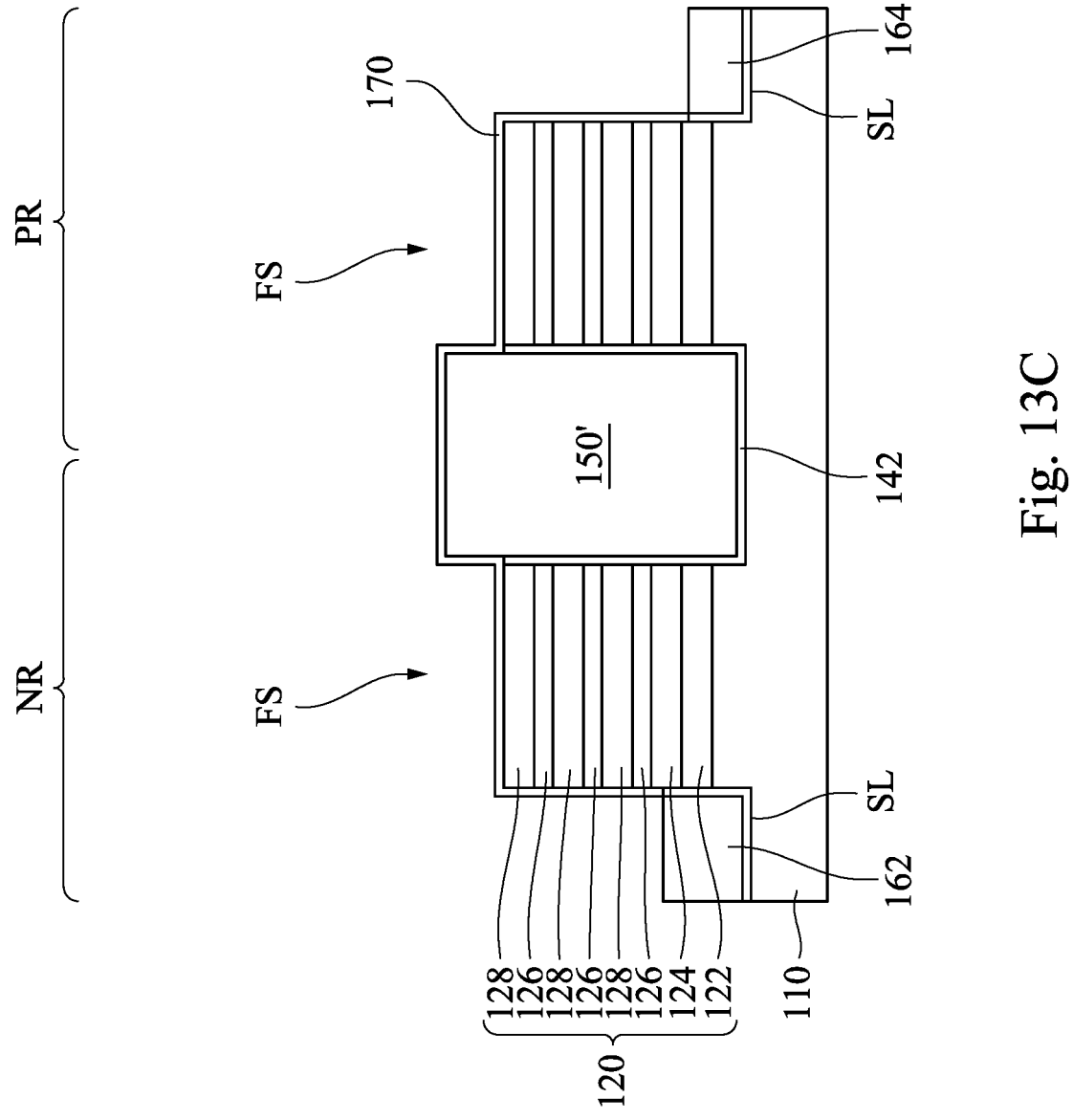
Figure 13D:
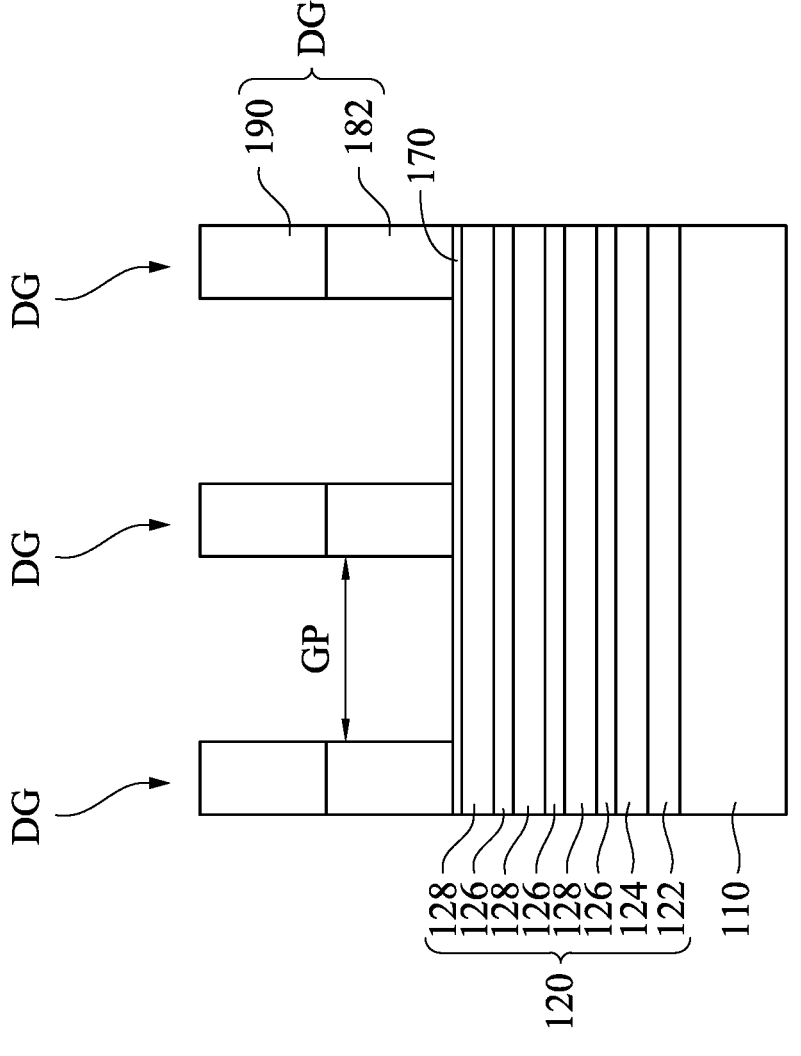

Reference is made to FIG. 12. A dummy gate electrode layer 180 is deposited over the dielectric capping layer 170, followed by a CMP process. The dummy gate electrode layer 180 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The CMP process may planarize a top surface of the dummy gate electrode layer 180. After the CMP process, the dummy gate electrode layer 180 may have a gate height 180H over the epitaxial stack 120 in a range from about 40 nanometers to about 75 nanometers, or from about 55 nanometers to about 65 nanometers. If the gate height 180H is less than about 40 nanometers, a space for metal gate may be limited. If the gate height 180H is greater than about 75 nanometers, it may unnecessarily enlarge a device size.

Reference is made to FIGS. 13A-13D. A hard mask layer is deposited over the dummy gate electrode layer 180. In some embodiments, the hard mask layer may be formed of a dielectric material such as silicon nitride, silicon oxynitride, silicon oxycarbide (SiOC), silicon oxycarbonitride (SiOCN), the like, or a combination thereof. The hard mask layer is patterned into the hard mask 190 by suitable lithography and etching processes. In the lithography process (e.g., photolithography or e-beam lithography) may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. Subsequently, a pattern of the hard mask 190 is transferred to the dummy gate electrode layer 180 (referring to FIG. 12) by any acceptable etching technique, thereby patterning the dummy gate electrode layer (referring to FIG. 12) into the dummy gate electrode 182. In some embodiments, the etching process may include dry etching (e.g., RIE etching), wet etching, and/or other etching methods. After the patterning process, the dummy gate electrode 182 covers portions of the fins FS, which will be exposed in subsequent processes to form channel regions.

Through the patterning process, dummy gate structures DG including a dummy gate electrode 182 and a hard mask 190 are formed over the substrate 110. The gate structure DG may extend along a direction Y substantially perpendicular (within process variations) to the direction X. In the context, portions of the fins FS underlying the gate structures DG may be referred to as the channel regions. The gate structures DG may also define a source/drain (S/D) region of the fins FS, for example, the regions of the fin FS adjacent to and on opposing sides of the channel region. In some embodiments, the gate structures DG are dummy (sacrificial) gate structures that are subsequently removed. Thus, in some embodiments using a gate-last process, the gate structures DG are dummy gate structures and will be replaced by the final gate structures at a subsequent processing stage of the semiconductor device. In particular, the dummy gate structures DG may be replaced at a later processing stage by a high-k dielectric layer (HK) and metal gate electrode (MG) as discussed below.

In some embodiments, a gate pitch GP between the dummy gate structures DG may be in a range from about 7 nanometers to about 15 nanometers. If the gate pitch GP is less than about 7 nanometers, it may be hard to form source/drain features between the dummy gate structures DG. If the gate pitch GP is greater than about 15 nanometers, it may unnecessarily enlarge a device size.

Figure 14:
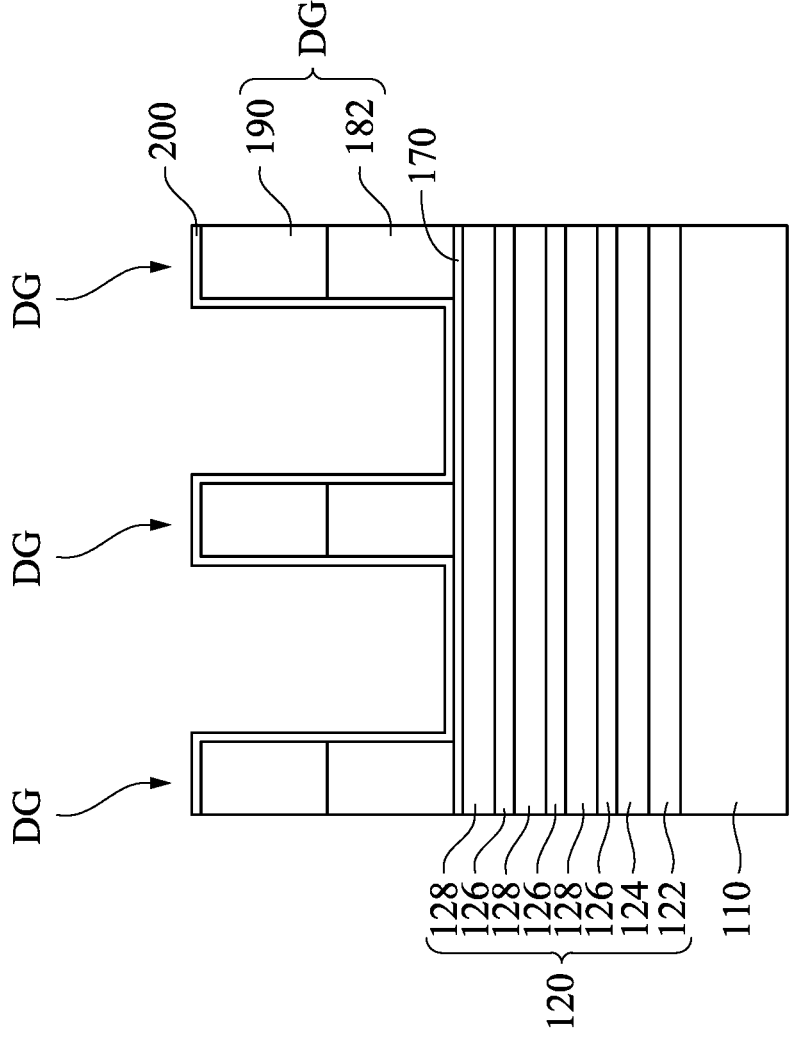
Figure 15A:
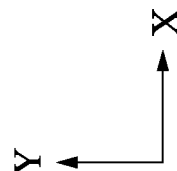
Figure 15B:
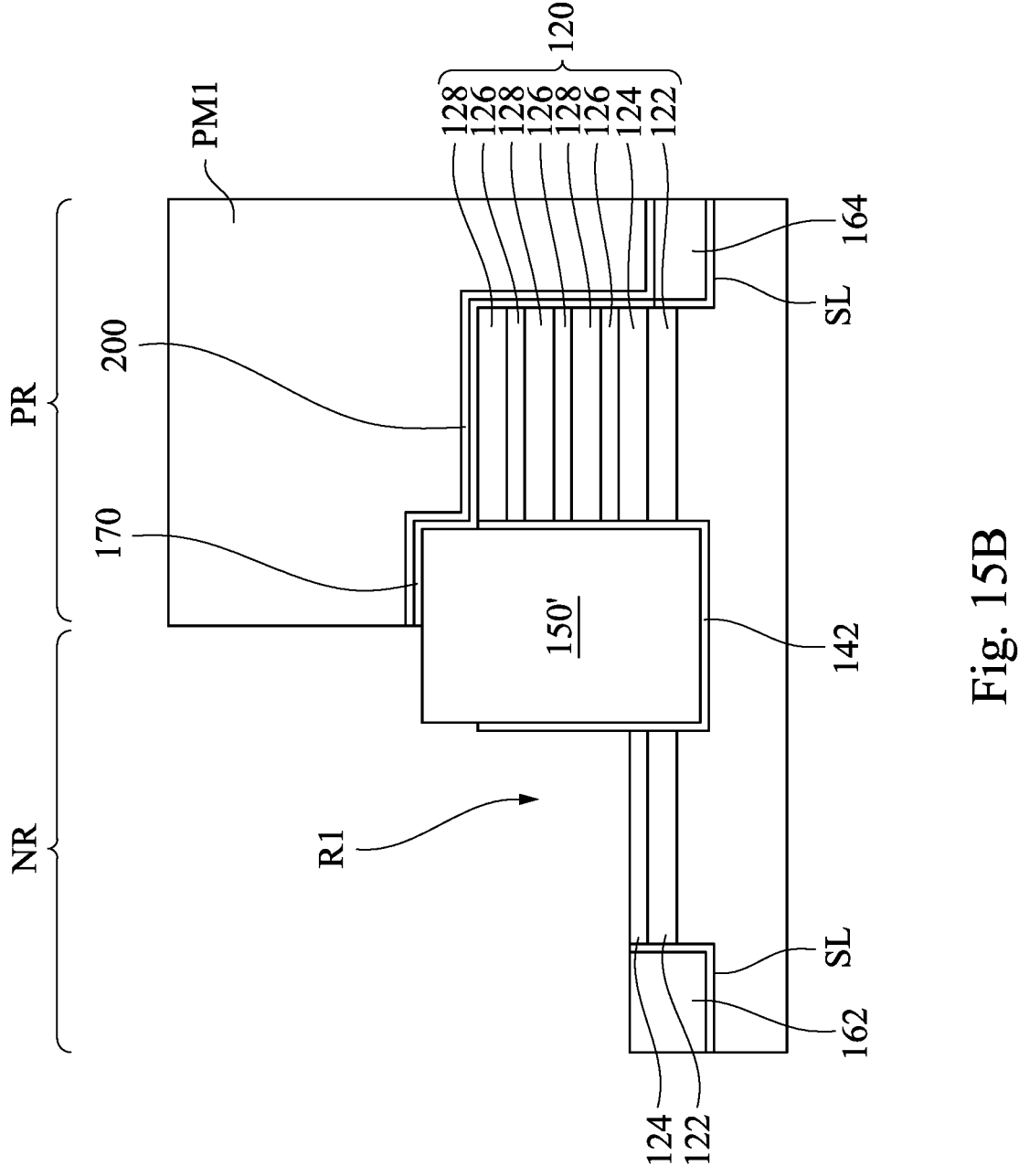
Figure 16A:
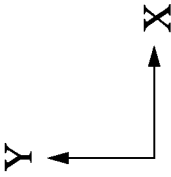
Figure 16B:
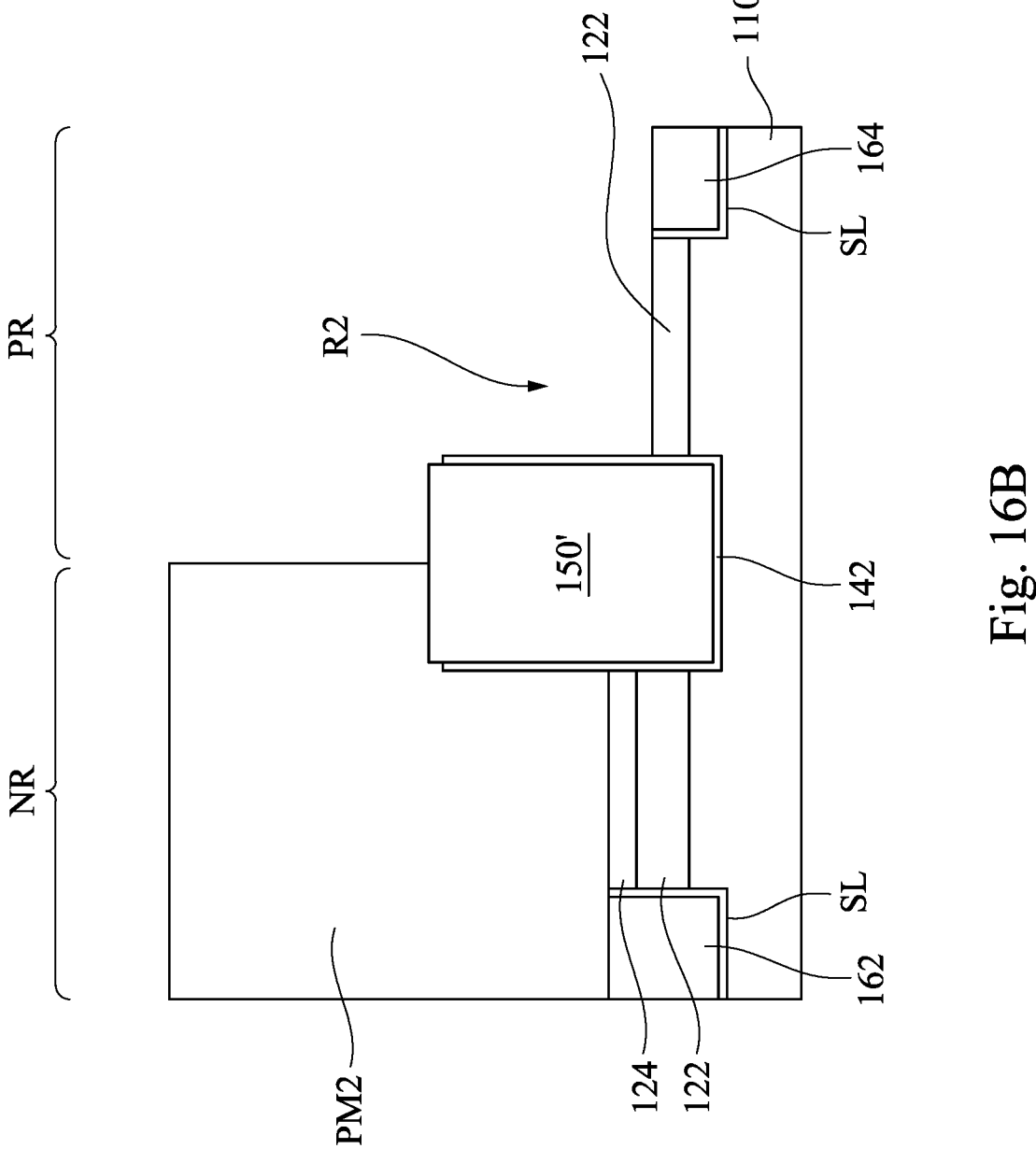
Figures 16C, 16D:
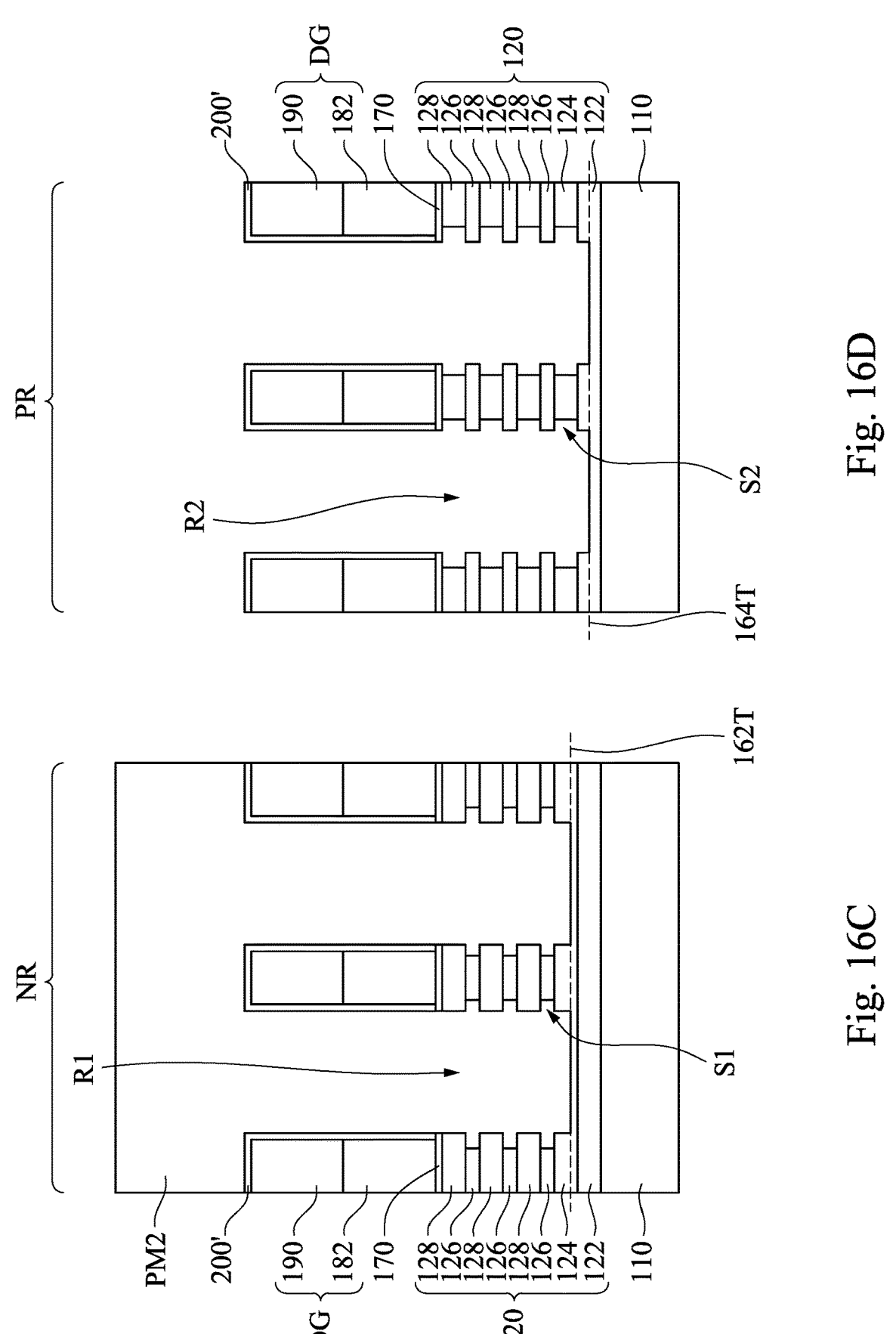

Reference is made to FIG. 14. After the formation of the dummy gate structures DG, a gate spacer layer 200 is formed on sidewalls of the dummy gate structures DG. For example, the gate spacer layer 200 is conformally deposited on the substrate using processes such as, CVD process, a subatmospheric CVD (SACVD) process, a flowable CVD process, an ALD process, a PVD process, or other suitable process. The gate spacer layer 200 may include a low-k dielectric material. In some embodiments, the gate spacer layer 200 may include a dielectric material such as silicon oxide, silicon nitride, silicon carbide, silicon oxynitride, SiCN films, silicon oxycarbide, SiOCN films, and/or combinations thereof. In some embodiments, the gate spacer layer 200 includes multiple layers.

Reference is made to FIGS. 15A-15D. Source/drain recesses R1 are formed in the semiconductor fins FS in the region NR. In the present embodiments, one or more anisotropic etching processes are performed by using the dummy gate structure 160 as an etch mask, resulting in recesses R1 into the semiconductor fins FS and between corresponding dummy gate structures DG in the region NR. In some embodiments, prior to the anisotropic etching processes, a patterned mask PM1 is formed to cover the fins FS in the region PR. The patterned mask PM1 can be formed by a photolithography process, including coating a photoresist, exposing the photoresist to a pattern, performing post-exposure bake processes, and developing the resist. The patterned mask PM1 may protect the fins FS in the region PR from the anisotropic etching processes in the formation of the source/drain recesses R1 in the region NR.

The recesses R1 may extend through the gate spacer layer 200 (referring to FIG. 14), the dielectric capping layer 170, the epitaxial layers 126 and 128 and stop over the epitaxial layer 124. After the anisotropic etching, end surfaces of the epitaxial layers 126 and 128 are exposed. In some embodiments, the anisotropic etching may be performed by a dry chemical etch (e.g., plasma etching, such as reactive-ion etching) with suitable gas etchants, such as silicon-based gases. The etching process may consume the exposed portion of the epitaxial layer 124, such that the recesses R1 may extend into and terminate over the epitaxial layer 124. In some embodiments, a bottom of the recesses R1 may be substantially level with a top surface 162T of the STI structure 162. In some embodiments, the etching process may also lower the top surface the dielectric wall 150' and top ends of the liners 142 and SL. In some embodiments, the gate spacer layer 200 (referring to FIG. 14) in the region NR may be referred to as gate spacers 200' after the anisotropic etching processes.

The epitaxial (sacrificial) layers 126 are laterally or horizontally recessed by using suitable selective etching process, resulting in lateral/sidewall recesses S1 each vertically between corresponding epitaxial (channel) layers 128. The lateral/sidewall recesses S1 may alternate with the epitaxial (channel) layers 128. The various compositions in epitaxial layers result in different oxidation rates and/or etch selectivity, thereby facilitating the selective etching process. In some embodiments, a selective dry etching process is performed by using fluorine-based gas (such as $SF_6$, $CH_2F_2$, $CH_3F$. $CHF_3$, $CF_4$, or the like), chloride-based gas (e.g., $Cl_2$), hydrogen bromide gas (HBr), oxygen gas ($O_2$), Ar, the like, or combinations thereof. These gas may etch SiGe at a faster etch rate than it etches Si. The epitaxial (channel) layers 128 and the epitaxial layer 124 may have a higher etch resistance to the etching process than that of the epitaxial (sacrificial) layers 126. In some embodiments, the selective etching includes SiGe oxidation followed by a $SiGeO_x$ removal. For example, the oxidation may be provided by an oxygen-containing cleaning process and then $SiGeO_x$ removed by the fluoride-based plasma (e.g., $NF_3$ plasma) that selectively etches $SiGeO_x$ at a faster etch rate than it etches Si. Moreover, because oxidation rate of Si is much lower (sometimes 30 times lower) than oxidation rate of SiGe (or Ge), the epitaxial (channel) layers 128 and the epitaxial layer 124 are not significantly etched by the process of laterally recessing the epitaxial (sacrificial) layers 126. As a result, in the region NR, the epitaxial (channel) layers 128 laterally extend past opposite end surfaces of the epitaxial (sacrificial) layers 126. The patterned mask PM1 may be removed by suitable stripping process after the etching processes.

Reference is made to FIGS. 16A-16D. Source/drain recesses R2 are formed in the semiconductor fins FS in the region PR. In the present embodiments, an anisotropic etching process is performed by using the dummy gate structure 160 as an etch mask, resulting in recesses R2 into the semiconductor fins FS and between corresponding dummy gate structures DG in the region PR. In some embodiments, prior to the anisotropic etching process, a patterned mask PM2 is formed to cover the fins FS in the region NR. The patterned mask PM2 can be formed by a photolithography process, including coating a photoresist, exposing the photoresist to a pattern, performing post-exposure bake processes, and developing the resist. The patterned mask PM2 may protect the fins FS in the region NR from the anisotropic etching process in the formation of the source/drain recesses R2 in the region PR.

The recesses R2 may extend through the gate spacer layer 200 (referring to FIG. 14), the dielectric capping layer 170, the epitaxial layers 128, 126, and 124 and stop over the epitaxial layer 122. After the anisotropic etching, end surfaces of the epitaxial layers 124, 126, and 128 are exposed. In some embodiments, the anisotropic etching may be performed by a dry chemical etch (e.g., plasma etching, such as reactive-ion etching) with suitable gas etchants, such as silicon-based gas. The etching process may consume the exposed portion of the epitaxial layer 122, such that the recesses R2 may extend into and terminate over the epitaxial layer 122. In some embodiments, a bottom of the recesses R2 may be substantially level with a top surface 164T of the STI structure 164. In some embodiments, the etching process may also lower the top surface the dielectric wall 150' and top ends of the liners 142 and SL. In some embodiments, the gate spacer layer 200 (referring to FIG. 14) in the region PR may be referred to as gate spacers 200' after the aniso- tropic etching processes.

The epitaxial (sacrificial) layers 128 and the epitaxial layer 124 are laterally or horizontally recessed by using suitable selective etching process, resulting in lateral/side- wall recesses S2 each vertically between corresponding epitaxial (channel) layers 126. The lateral/sidewall recesses S2 may alternate with the epitaxial (channel) layers 126. The various compositions in epitaxial layers result in different oxidation rates and/or etch selectivity, thereby facilitating the selective etching process. In some embodiments, a selective dry etching process is performed by using suitable etchant gas, such as $H_2$, the like, or the combination thereof. The etchant gas may etch Si at a faster etch rate than it etches SiGe. The epitaxial (channel) layers 126 may have a higher etch resistance to the etching process than that of the epitaxial (sacrificial) layers 128 and the epitaxial layer 124. As a result, in the region PR, the epitaxial (channel) layers 126 laterally extend past opposite end surfaces of the epitaxial (sacrificial) layers 128 and the epitaxial layer 124. The patterned mask PM2 may be removed by suitable stripping process after the etching processes. The etchant gas used in formation of the lateral/sidewall recesses S2 may be different from the etchant gas used in formation of the lateral/sidewall recesses S1.

Figures 17A, 17B:
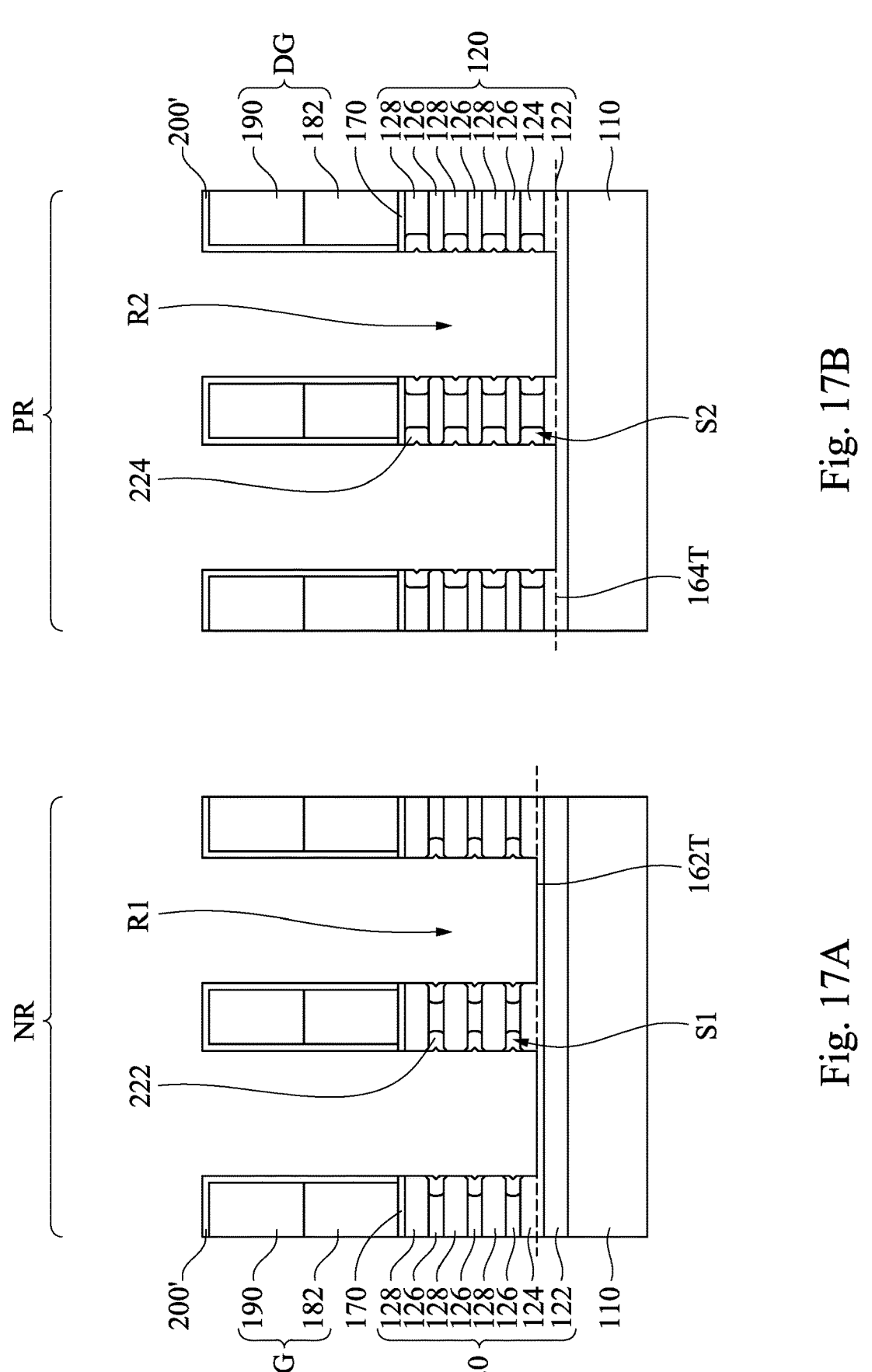
Figure 18A:
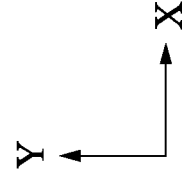
Figure 18B:
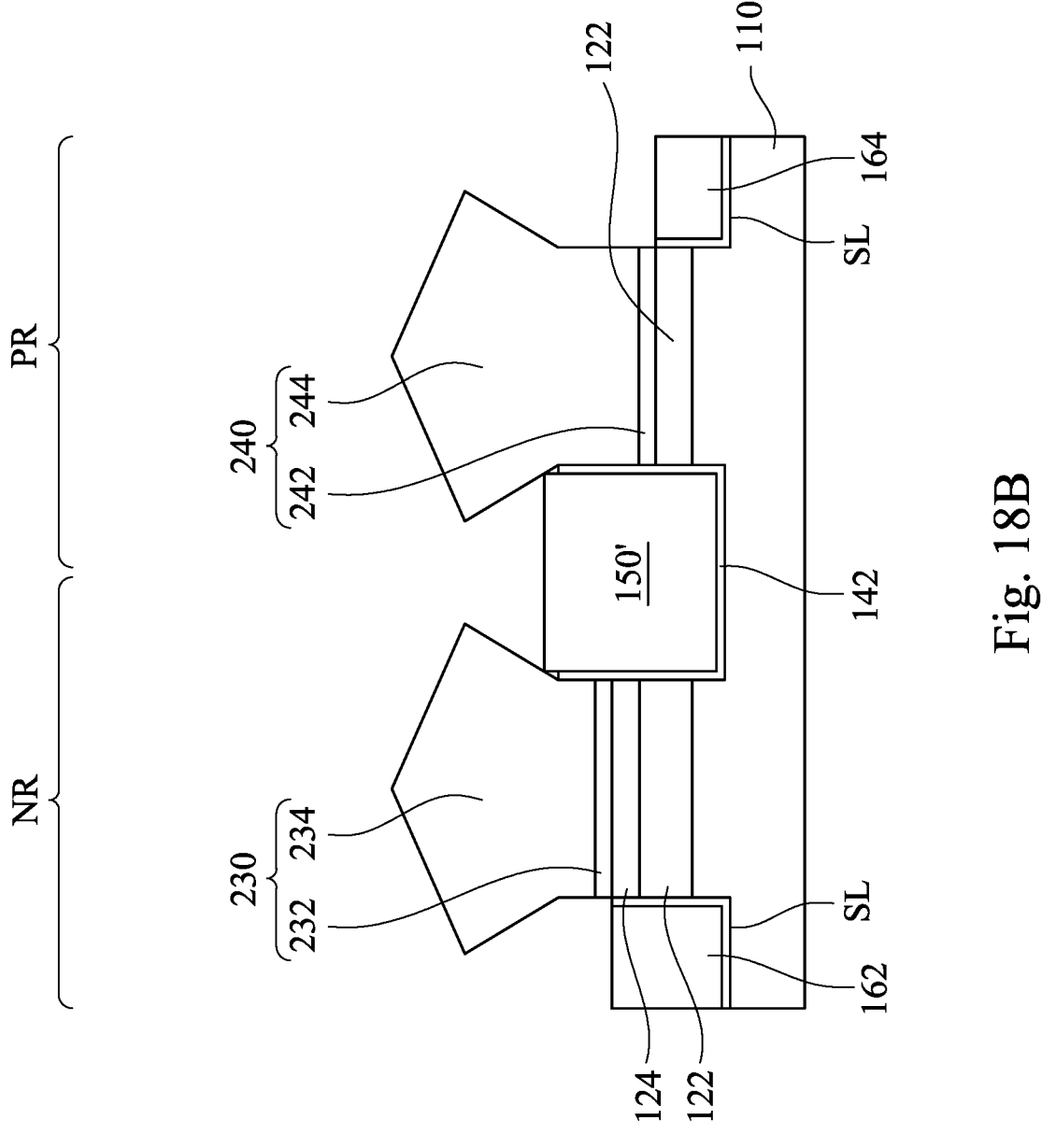
Figures 18C, 18D:
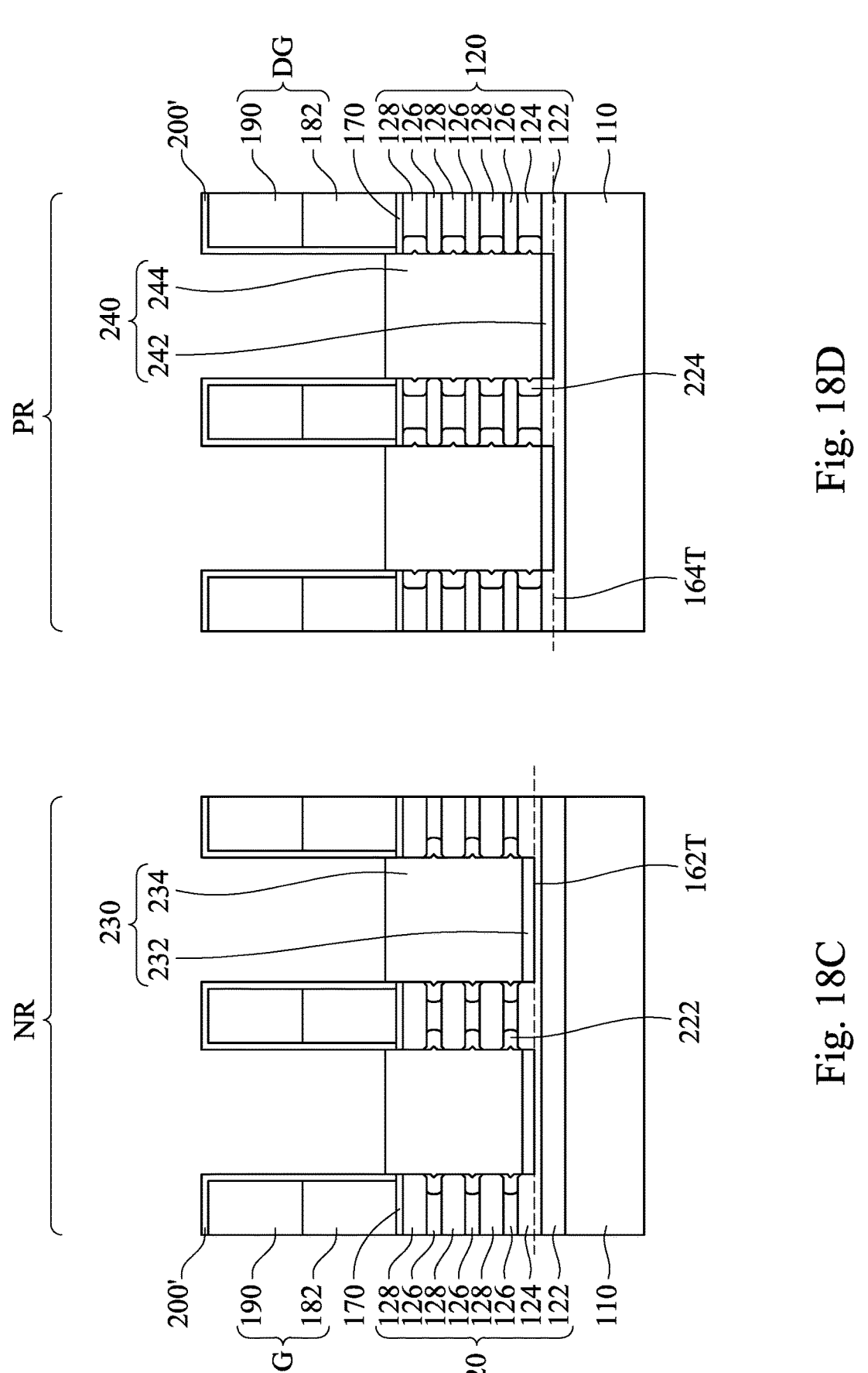

Reference is made to FIGS. 17A and 17B. Inner spacers 222 and 224 are formed in the recesses S1 and S2, respec- tively. Formation of the inner spacers 222 and 224 includes depositing an inner spacer material layer into the recesses R1 and R2 and to fill the lateral/sidewall recesses S1 and S2, and performing an anisotropic etching process to trim the deposited inner spacer material layer. The remaining por- tions of the deposited inner spacer material layer in the lateral/sidewall recesses S1 and S2 are denoted as inner spacers 222 and 224. The inner spacers 222 and 224 may include a low-k dielectric material, such as $SiO_x$, SiON, SiOC, SiN, SiCN, or SiOCN, and may be formed by a suitable deposition method, such as ALD. The inner spacers 222 and 224 may serve to isolate metal gates from source/ drain regions formed in subsequent processing.

Reference is made to FIGS. 18A-18D. Source/drain epi- taxial structures 230 and 240 are formed in the regions NR and PR, respectively. The source/drain epitaxial structures 230 and 240 may be referred to as source/drain epitaxial features in the context. The epitaxial layers 124 and 122 respectively under the source/drain epitaxial structures 230 and 240 can reduce leakages to underlying well regions in the substrate 110 in the region NR/PR.

In the region NR, the source/drain epitaxial structures 230 are n-type epitaxial structures, which may include a suitable n-type semiconductor material, such as germanium (Ge) or silicon (Si); or compound semiconductor materials, such as silicon carbide (SiC). The source/drain epitaxial structures 230 may be doped with n-type dopants, such as phosphorus or arsenic. The source/drain epitaxial structures 230 may include one or plural epitaxial layers (e.g., epitaxial layers 232 and 234), in which the plural epitaxial layers (e.g., epitaxial layers 232 and 234) may have different composi- tions. In some embodiments, the epitaxial layers 234 con- nects the channel layers 128, and the epitaxial layers 234 may have a n-type dopant concentration (e.g., phosphorus concentration) greater than a n-type dopant concentration (e.g., phosphorus concentration) of the epitaxial layers 232. In some embodiments, the epitaxial layers 234 may have a n-type dopant concentration (e.g., phosphorus concentra- tion) greater than about $10^{18}$ atoms/cm³, or even greater than about $2 \times 10^{21}$ atoms/cm³. In some embodiments, the epi- taxial layer 232 may be free from the dopants. A thickness of the epitaxial layers 232 may be less than a thickness of the epitaxial layers 234. The epitaxial layers 232 may lower leakage to the underlying epitaxial layers 124. In some other embodiments, the epitaxial layers 232 may be omitted.

In the region PR, the source/drain epitaxial structures 240 are p-type epitaxial structures, which may include a suitable semiconductor material, such as germanium (Ge) or silicon (Si); or compound semiconductor materials, such as silicon germanium (SiGe). The p-type source/drain epitaxial struc- tures 240 may be doped with p-type dopants, such as boron or $BF_2$. The source/drain epitaxial structures 240 may include one or plural epitaxial layers (e.g., epitaxial layers 242 and 244), in which the plural epitaxial layers (e.g., epitaxial layers 242 and 244) may have different composi- tions. In some embodiments, the epitaxial layers 244 con- nects the channel layers 126, and the epitaxial layers 244 may have a p-type dopant concentration (e.g., boron con- centration) greater than a p-type dopant concentration (e.g., boron concentration) of the epitaxial layers 242. In some embodiments, the epitaxial layers 244 may have a p-type dopant concentration (e.g., boron concentration) greater than about $10^{18}$ atoms/cm³, or even greater than about $2 \times 10^{21}$ atoms/cm³. In some embodiments, the epitaxial layer 242 may be free from the dopants. A thickness of the epitaxial layers 242 may be less than a thickness of the epitaxial layers 244. The epitaxial layers 234 may lower leakage to the underlying epitaxial layers 122. In some other embodi- ments, the epitaxial layers 234 may be omitted.

The epitaxy processes include CVD deposition tech- niques (e.g., vapor-phase epitaxy (VPE) and/or ultra-high vacuum CVD (UHV-CVD)), molecular beam epitaxy, and/ or other suitable processes. The epitaxy process may use gaseous and/or liquid precursors, which interact with the composition of the exposed semiconductor materials (e.g., silicon). For example, for the n-type source/drain epitaxial structures 230, the gaseous and/or liquid precursors interact with the composition of the exposed side surfaces of channel layers 128 and the exposed top surface of the epitaxial layer 124. The region PR are covered by suitable resist mask during the formation of the n-type source/drain epitaxial structures 230. For the p-type source/drain epitaxial struc- tures 240, the gaseous and/or liquid precursors interact with the composition of the exposed side surfaces of channel layers 126 and the exposed top surface of the epitaxial layer 122. The region NR are covered by suitable resist mask during the formation of the p-type source/drain epitaxial structures 240. The source/drain epitaxial structures 230 and 240 may be in-situ doped. If the source/drain epitaxial structures 230/240 is not in-situ doped, a second implanta- tion process (i.e., a junction implant process) is performed to dope the source/drain epitaxial structures 230/240. One or more annealing processes may be performed to activate the source/drain epitaxial structures 230 and 240. The annealing processes may include rapid thermal annealing (RTA) and/or laser annealing processes.

Figure 19A:
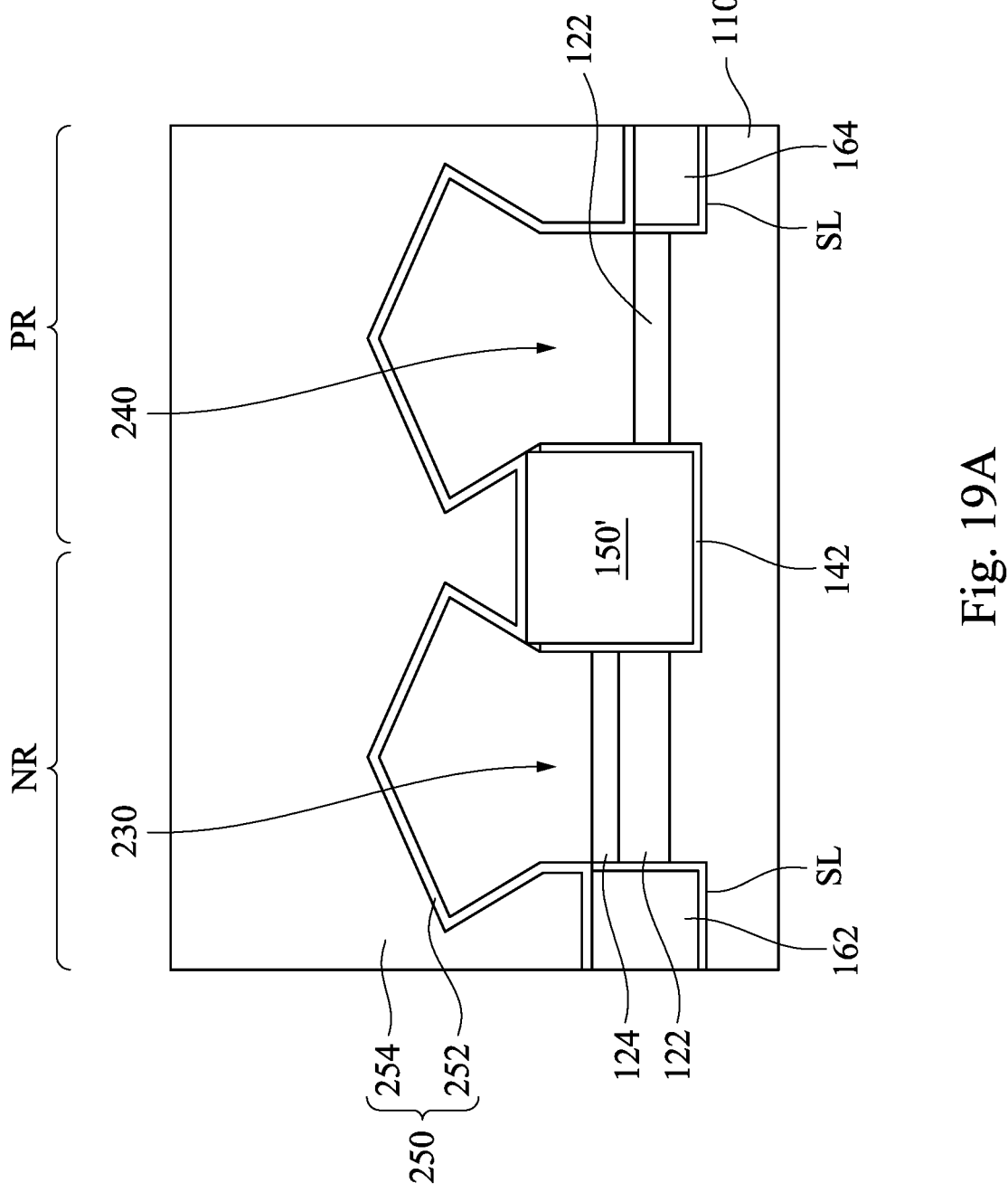
Figures 19B, 19C:
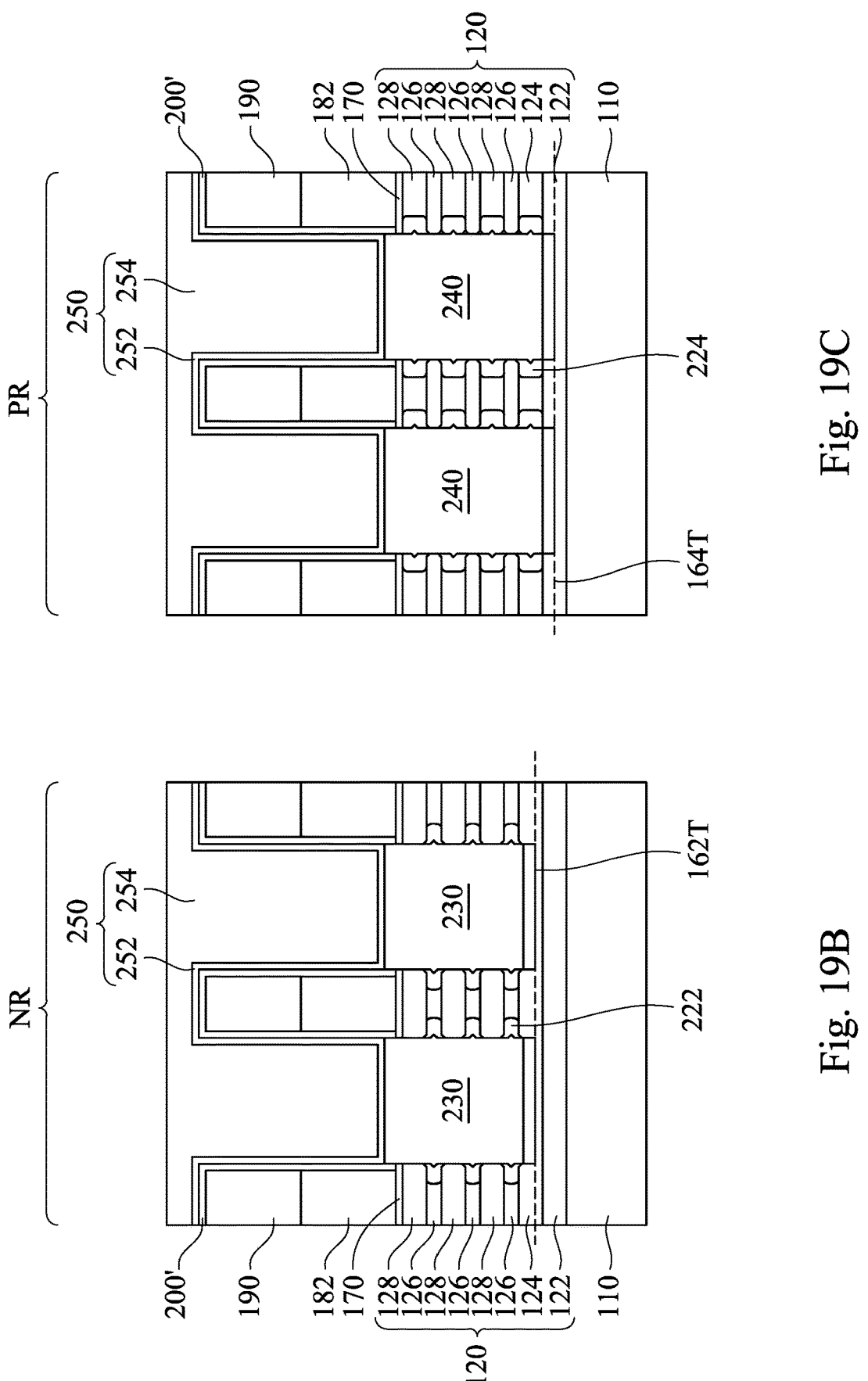

Reference is made to FIGS. 19A-19C. A dielectric mate- rial 250 is formed over the substrate 110 and filling the space between the dummy gate structures DG. In some embodi- ments, the dielectric material 250 includes a contact etch stop layer (CESL) 252 and an interlayer dielectric (ILD) layer 254 formed in sequence. In some examples, the CESL 252 includes a silicon nitride layer, silicon oxide layer, a silicon oxynitride layer, and/or other suitable materials having a different etch selectivity than the ILD layer 254. The CESL 252 may be formed by plasma-enhanced chemical vapor deposition (PECVD) process and/or other suitable deposition or oxidation processes. The ILD layer 254 is then deposited over the CESL 252. In some embodiments, the ILD layer 254 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 252. The ILD layer 254 may be deposited by a PECVD process or other suitable deposition technique. In some embodiments, after formation of the ILD layer 254, the semiconductor device may be subject to a high thermal budget process to anneal the ILD layer 254. After depositing the ILD layer 254, a planarization process may be performed to remove excessive materials of the ILD layer 254. For example, a planarization process includes a chemical mechanical planarization (CMP) process which removes portions of the ILD layer 254 and the CESL layer 252 overlying the dummy gate structures DG and planarizes a top surface of the semiconductor device.

Figure 20A:
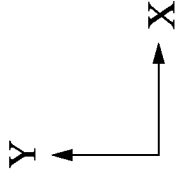
Figures 20B, 20C:
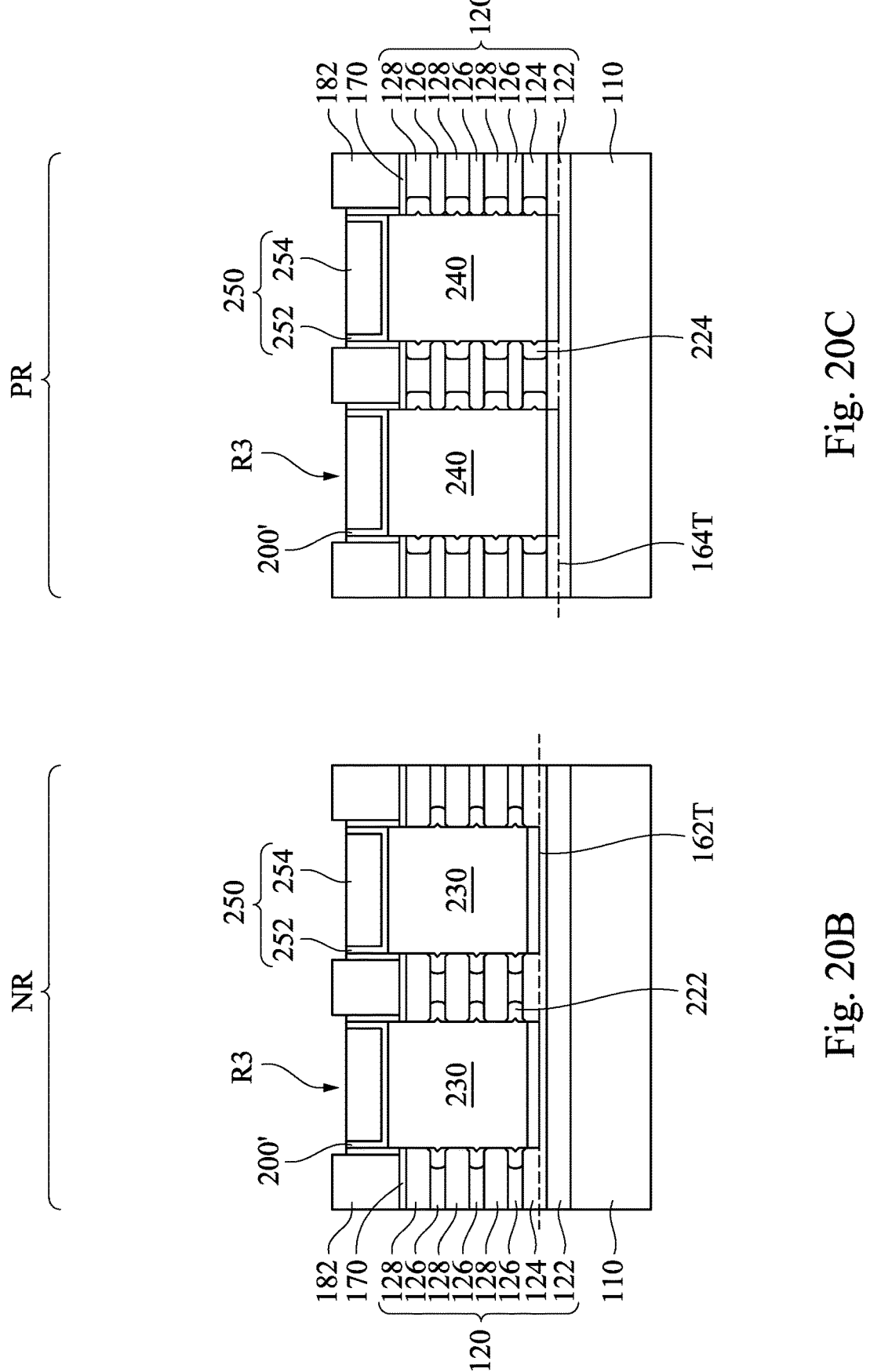
Figure 21A:
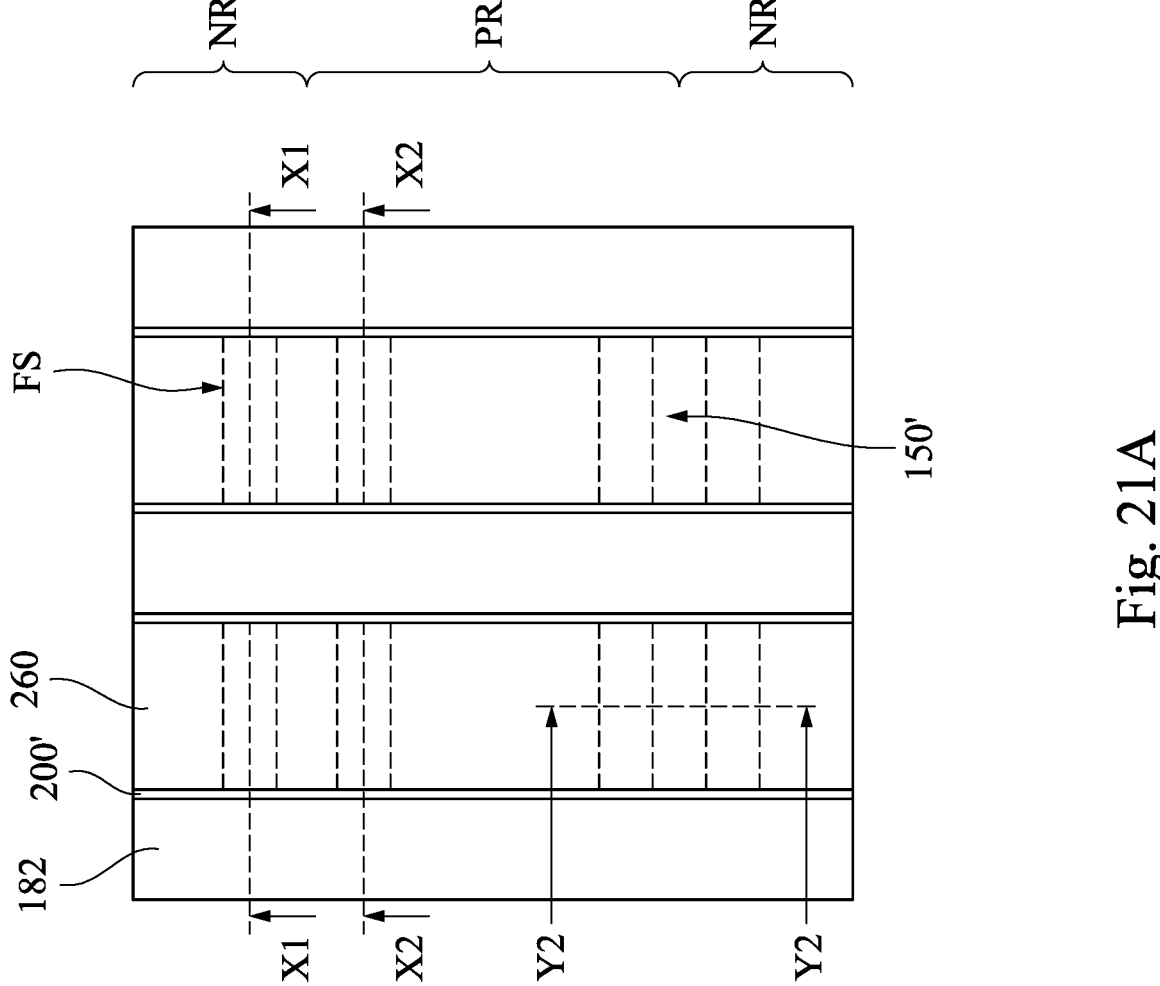
Figure 21B:
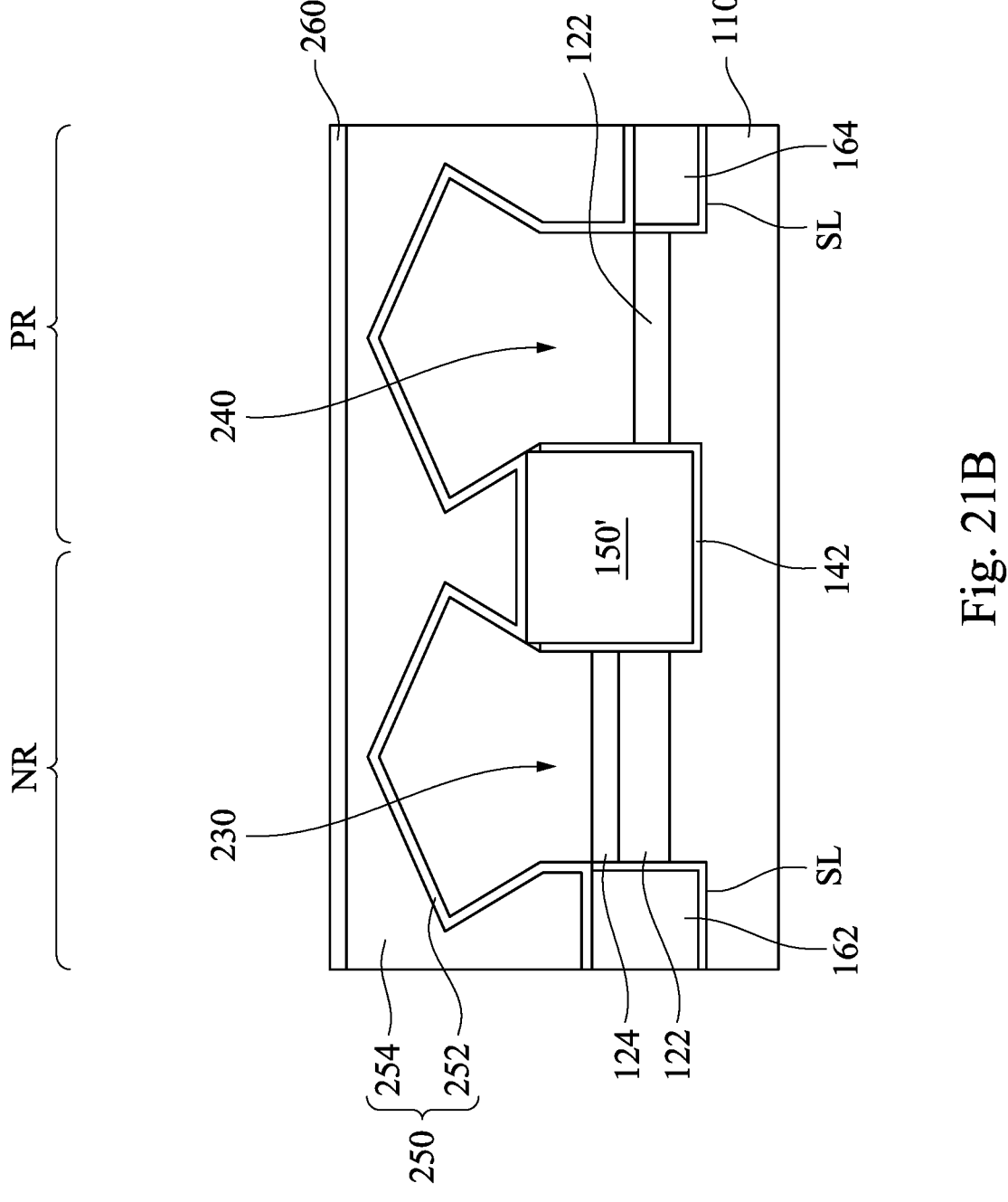
Figures 21C, 21D:
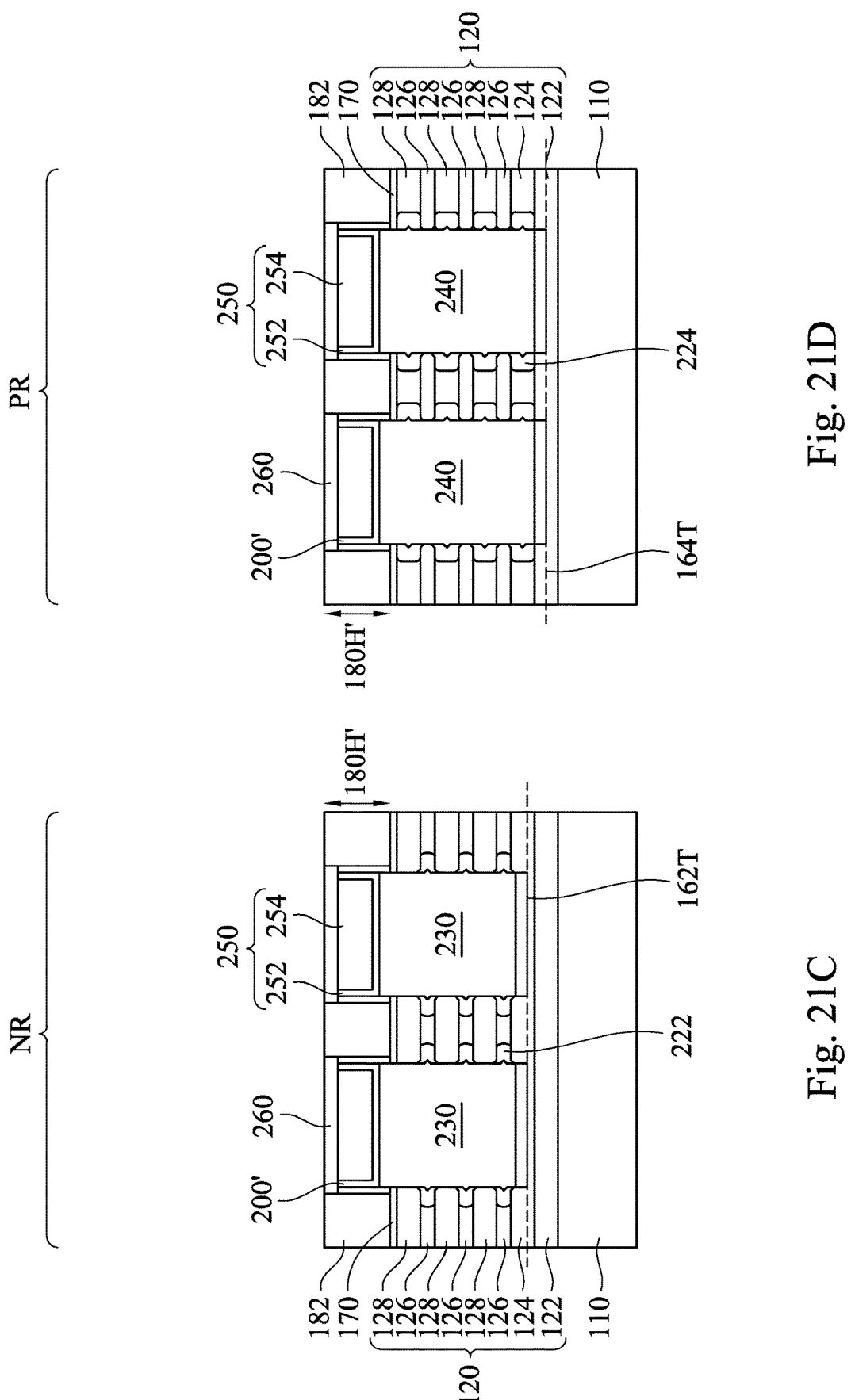
Figure 22A:
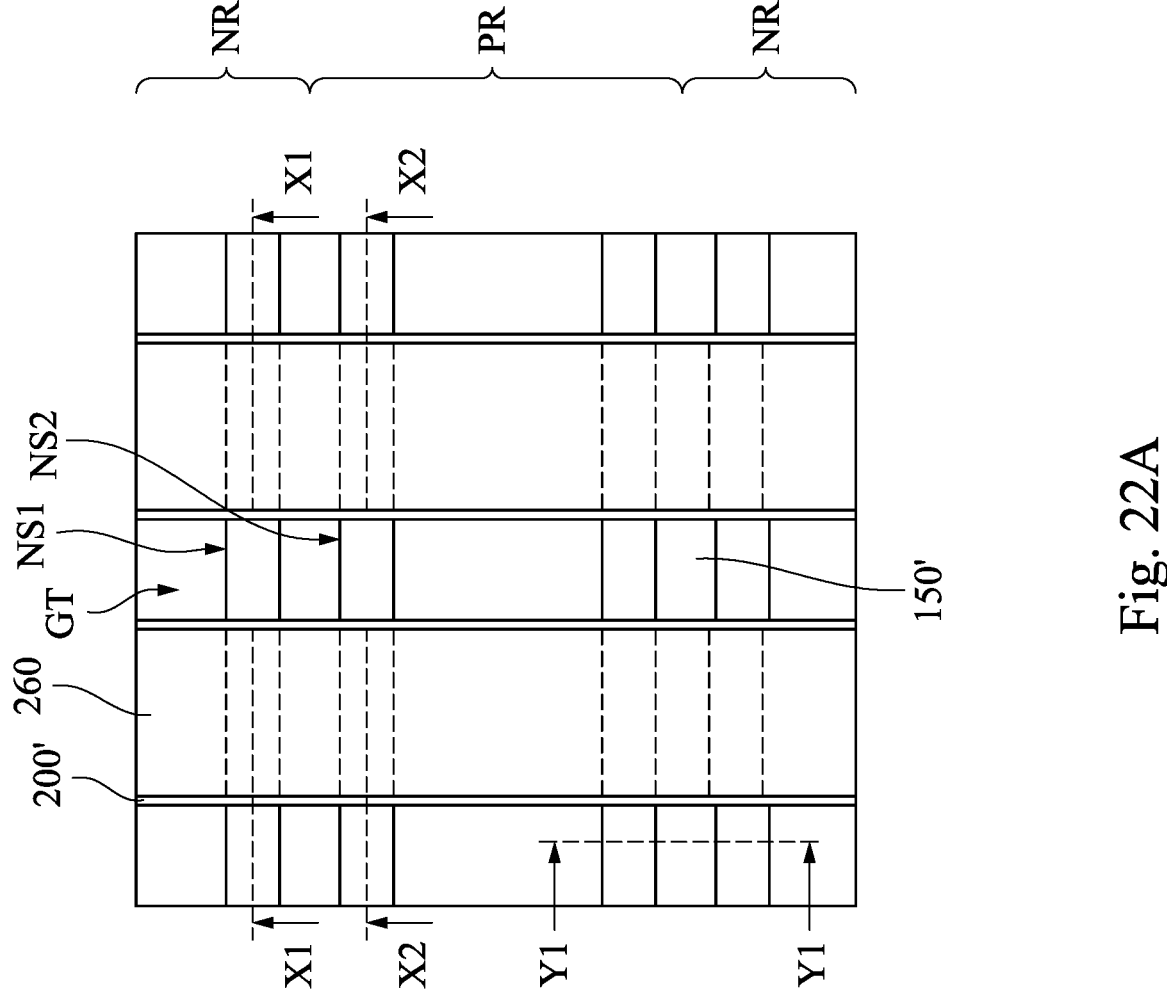
Figure 22B:
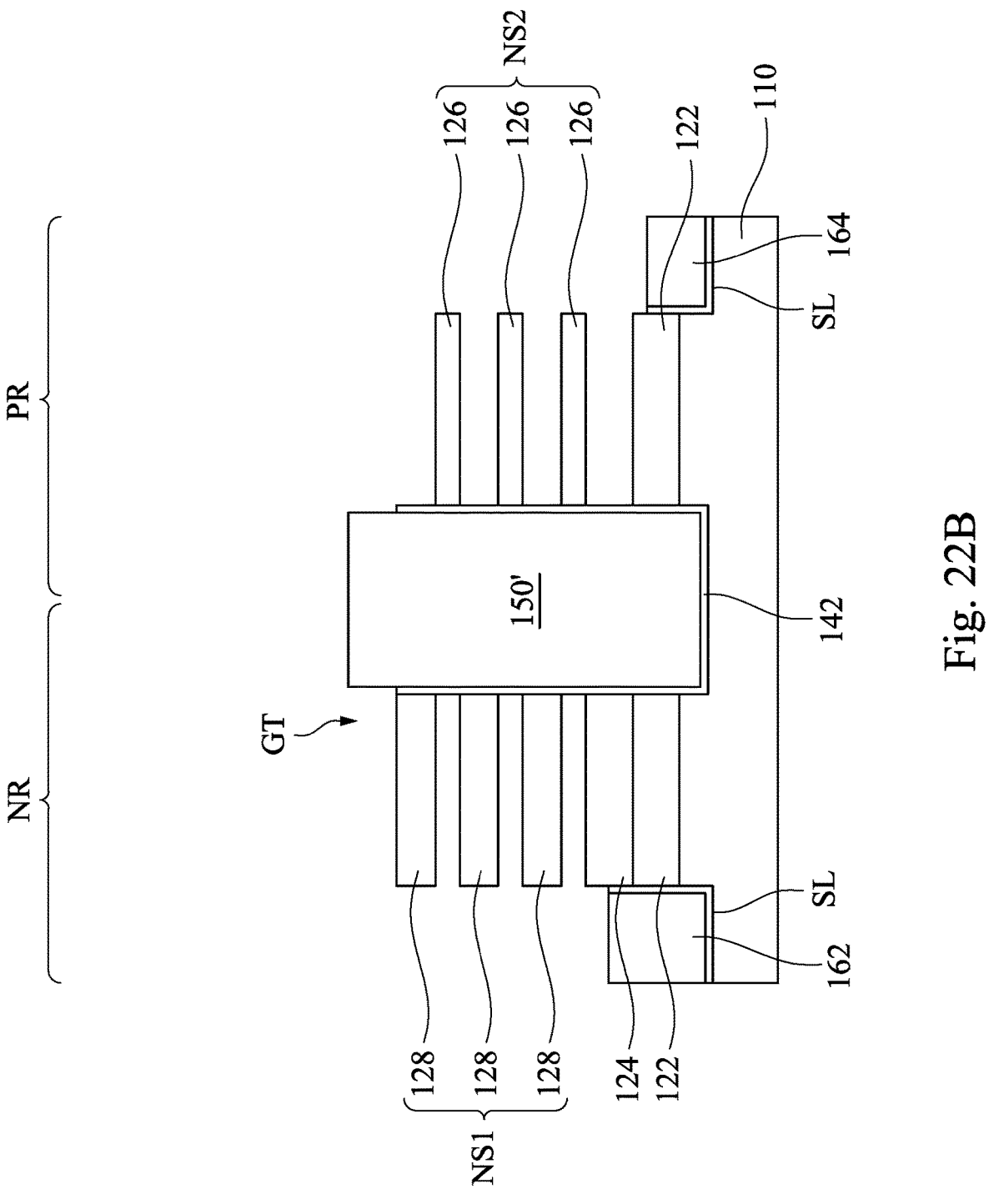
Figures 22C, 22D:
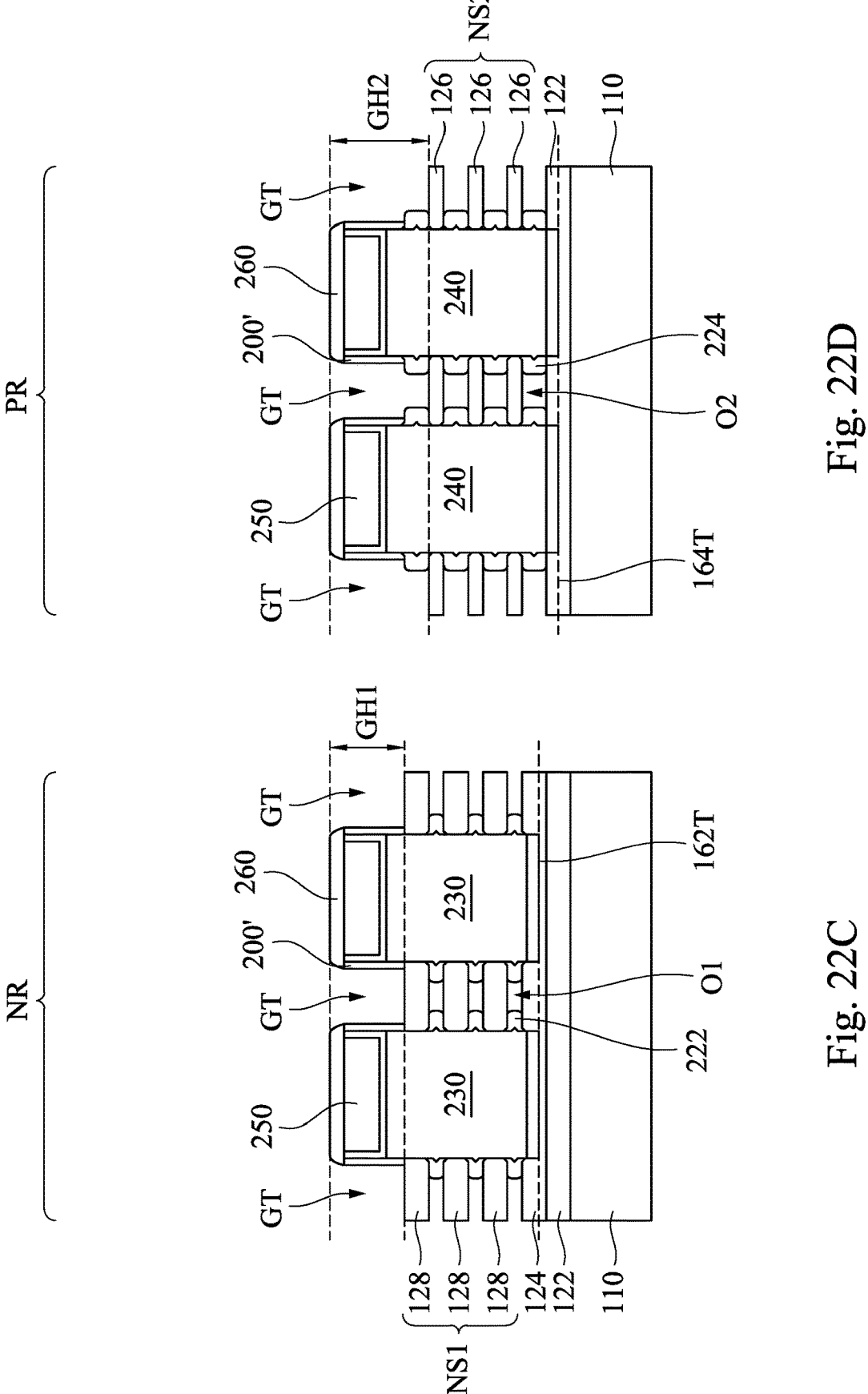
Figure 23A:
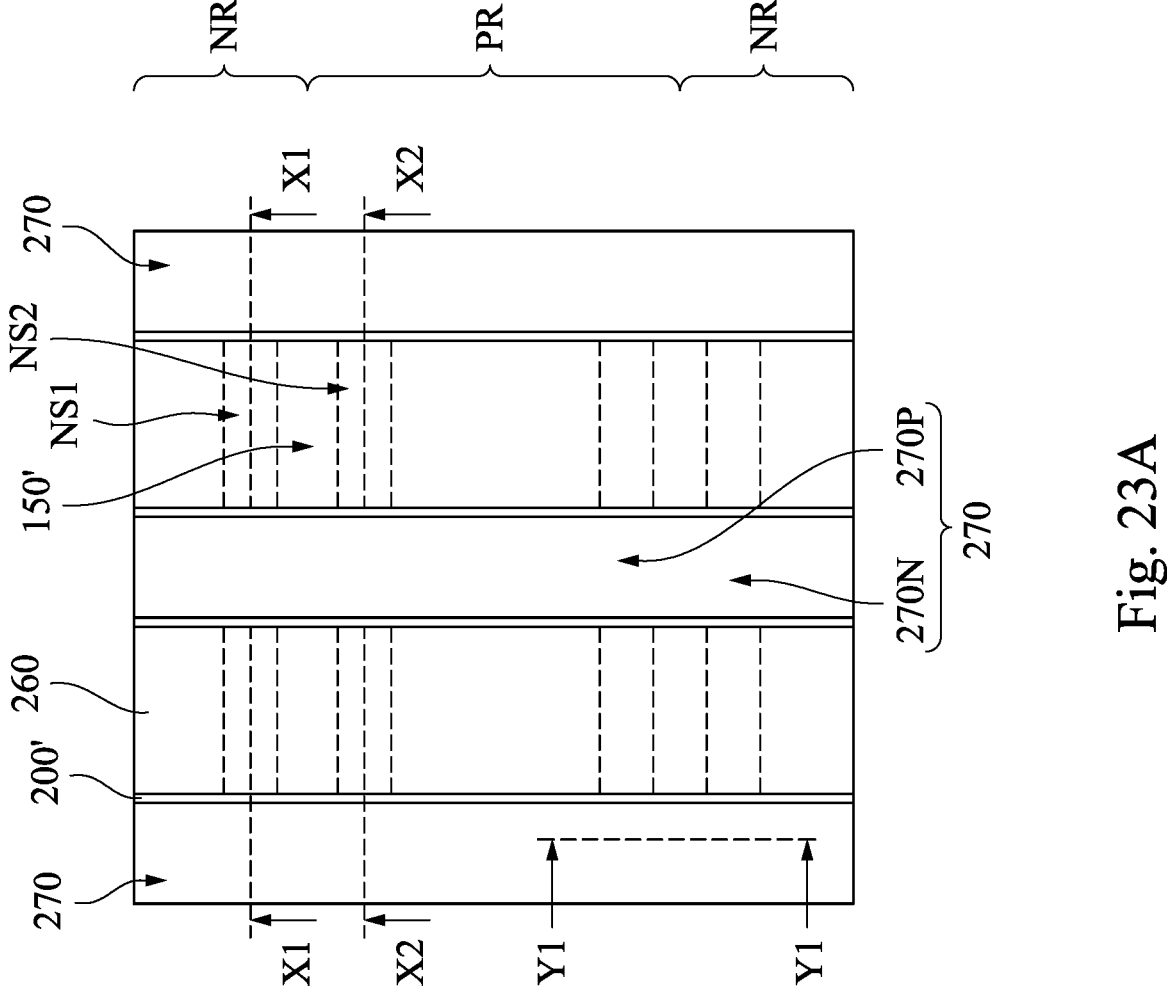
Figure 23B:
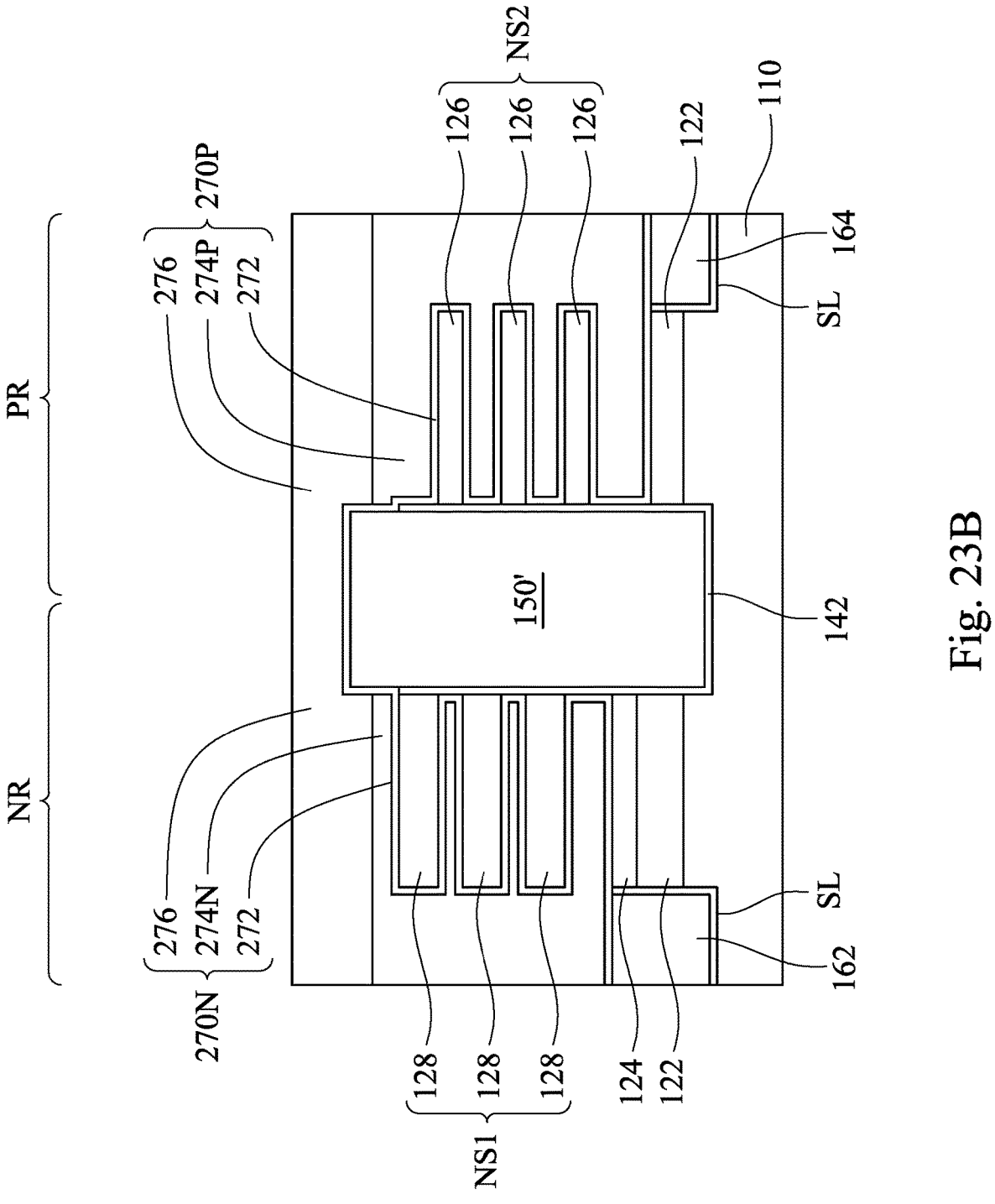
Figures 23C, 23D:
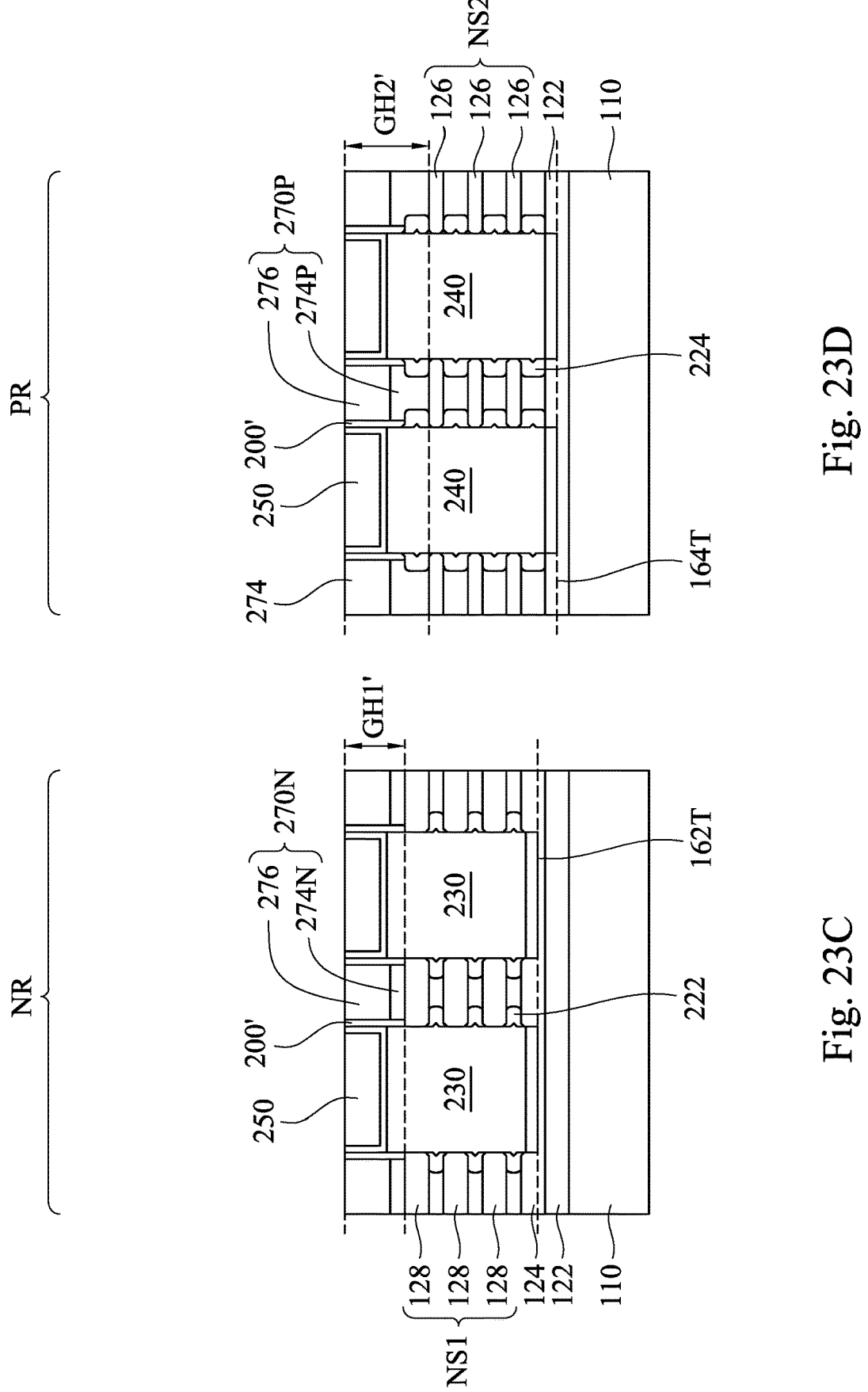

Reference is made to FIGS. 20A-20C. The dielectric material 250 and the gate spacers 200' is recessed by suitable etching process. The etching process may be a dry etch, a wet etch, or the combination thereof. The etching process may include an etch back process in some embodiments. Through the etching process, recesses R3 are formed between the dummy gate electrode 182 over the dielectric material 250 and the gate spacers 200'. A depth of the recesses R3 may be in a range from 10 nanometers to about 25 nanometers. If the thickness of the depth of the recesses R3 is less than 10 nanometers, it may not protect the underlying layers in subsequent etching process. If the depth of the recesses R3 is greater than about 25 nanometers, it may unnecessarily increase an operation time of a subsequent CMP process.

Reference is made to FIGS. 21A-21D. One or more dielectric materials (e.g., silicon nitride) is formed over the recessed dielectric material 250 and the gate spacers 200' and into the recesses R3. A CMP process may be performed to remove an excess portion of the dielectric materials external to the recesses R3, and remaining portions of the dielectric materials in the recesses R3 are denoted as capping layers 260. A thickness of the capping layer 260 may be in a range from about 5 nanometers to about 15 nanometers. If the thickness of the capping layer 260 is less than 5 nanometers, it may not protect the underlying layers in subsequent etching process. If the thickness of the capping layer 260 is greater than about 15 nanometers, it may unnecessarily increase an operation time of a subsequent CMP process.

In some embodiments, the CMP process may also lower the top surface of the dummy gate electrode 182, such that the dummy gate electrode 182 may have a gate height 180H' less than the gate height 180H of the dummy gate electrode layer 180 in FIG. 12. For example, the gate height 180H' may be in a range from about 45 nanometers to about 50 nanometers. And, by the CMP process, the thickness of the capping layer 260 is less than the depths of the recesses R3 (referring to FIGS. 20B and 20C).

FIGS. 22A-23D show a gate replacement process. In the region NR, the dummy gate structures DG and the epitaxial layers 126 (referring to FIGS. 21A-21D) are replaced with high-k/metal gate structures 270N. In the region PR, the dummy gate structures DG and the epitaxial layers 124 and 128 (referring to FIGS. 21A-21D) are replaced with high-k/metal gate structures 270P. The epitaxial layers 126 in the region NR and the epitaxial layers 124 and 128 in the region PR may be referred to as sacrificial layers in the context.

Reference is made to FIGS. 22A-22D. The dummy gate structures DG (referring to FIGS. 21A-21D) are removed, followed by a channel release process. The channel release process includes removing the epitaxial layers 126 in the region NR (referring to FIGS. 21A-21D) and removing the epitaxial layers 124 and 128 in the region PR (referring to FIGS. 21A-21D).

In the illustrated embodiments, the dummy gate structures DG (referring to FIGS. 21A-21D) are removed by using a first selective etching process (e.g., selective dry etching, selective wet etching, or a combination thereof) that etches the materials in dummy gate structures DG (referring to FIGS. 21A-21D) at a faster etch rate than it etches materials in the capping layer 260. The first selective etching process results in gate trenches GT between corresponding gate spacers 200', in the regions NR and PR. And, the epitaxial layers 128 (referring to FIGS. 21A-21D) are exposed in the gate trenches GT, in the regions NR and PR. The dielectric capping layer 170 underlying the dummy gate structures DG can be removed by suitable cleaning/etching process. In some embodiments, in the region PR, since the topmost epitaxial layer 128 overlies the channel layers 126, there is little or no top sheet loss for the top channel layer 126.

Subsequently, in the region NR, the epitaxial layers 126 (referring to FIGS. 21A-21D) in the gate trenches GT are etched by using a second selective etching process that etches the epitaxial layers 126 (referring to FIGS. 21A-21D) at a faster etch rate than it etches the epitaxial layers 128, thus forming openings/spaces O1 between neighboring epitaxial layers 128 and between the bottommost epitaxial layer 128 and epitaxial layer 124. In some embodiments, the second selective dry etching may use fluorine-based gas (such as $SF_6$, $CH_2F_2$, $CH_3F$, $CHF_3$, $CF_4$, or the like), chloride-based gas (e.g., $Cl_2$), hydrogen bromide gas (HBr), oxygen gas ($O_2$), Ar, the like, or combinations thereof. In some embodiments, the selective removal includes SiGe oxidation followed by a $SiGeO_x$ removal. For example, the oxidation may be provided by $O_2$ plasma and then $SiGeO_x$ removed by the chloride-based plasma (e.g., $CF_4/C_4F_8$ plasma) that selectively etches $SiGeO_x$ at a faster etch rate than it etches Si, and stops on SiGe. The steps of SiGe oxidation and $SiGeO_x$ removal may be repeated until the sacrificial layers 126 are laterally removed. The epitaxial layer 124 may serve as an etch stop layer during the second selective etching process. The openings/spaces O1 may expose the sidewalls of the inner spacers 222. In this way, the epitaxial layers 128 become nanosheets suspended over the substrate 110 and between the source/drain epitaxial structures 230.

Prior to the second selective etching process, a resist mask may be formed to cover the region PR. The resist mask may be formed by suitable photolithography process. Therefore, the materials in the region PR are protected from the second selective etching process. The resist mask may be removed by suitable stripping process after the second selective etching process.

In the region PR, the epitaxial layers 124 and 128 (referring to FIGS. 21A-21D) in the gate trenches GT are etched by using a third selective etching process that etches the epitaxial layers 124 and 128 at a faster etch rate than it etches the epitaxial layers 126, thus forming openings/spaces O2 between neighboring epitaxial layers 126 and between the bottommost epitaxial layer 126 and epitaxial layer 122. In some embodiments, the third selective dry etching may use suitable gases (e.g., $H_2$, the like, or the combination thereof) that selectively etches Si at a faster etch rate than it etches SiGe. The epitaxial layer 122 may serve as an etch stop layer during the second selective etching process. The openings/spaces O2 may expose the sidewalls of the inner spacers 224. In this way, the epitaxial layers 126 become nanosheets suspended over the substrate 110 and between the source/drain epitaxial structures 240. The etchant gas used in formation of the openings/spaces O2 may be different from the etchant gas used in formation of the openings/spaces O1.

Prior to the third selective etching process, a resist mask may be formed to cover the region NR. The resist mask may be formed by suitable photolithography process. Therefore, the materials in the region NR are protected from the third selective etching process. The resist mask may be removed by suitable stripping process after the third selective etching process.

The channel release process including the second and/or third selective etching processes is performed to leave a subsect of channel layers 128 (denoted as a nanosheet subset NS1) on a first side of the dielectric wall 150' and a subset of channel layers 126 (denoted as a nanosheet subset NS2) on a second side of the dielectric wall 150'. The nanosheet subset NS1 and the nanosheet subset NS2 may have patterns according to the pattern of fins FS. At this interim processing step, the openings/spaces O1 between the nanosheets 128 and the openings/spaces O2 between nanosheets 126 may be filled with ambient environment conditions (e.g., air, nitrogen, etc.). The formation of the openings/spaces O1 (e.g., the second selective etching process) can be performed before or after the formation of the openings/spaces O2 (e.g., the second selective etching process).

In the region NR, a gate height GH1 is between a top surface of the topmost nanosheet 128 and a top surface of the capping layers 260. In the region PR, a gate height GH2 is between a top surface of the topmost nanosheet 126 and the top surface of the capping layers 260. The nanosheet 128 are misaligned from the nanosheet 126. For example, each of center horizontal lines of the nanosheet 128 are misaligned from center horizontal lines of the nanosheet 126. Therefore, the gate height GH1 is different from the gate height GH2. The gate height GH1 may be equal to or less than the gate height 180H' (referring to FIG. 21C). With the topmost epitaxial layer 128 (referring to FIG. 21D), the gate height GH2 may be greater than the gate height 180H' (referring to FIG. 21D). For example, the gate height GH1 is greater than the gate height GH2. In some embodiments, the gate height GH1 may be in a range from about 40 nanometers to about 45 nanometers, and the gate height GH2 may be in a range from about 50 nanometers to about 55 nanometers.

Reference is made to FIGS. 23A-23D. Replacement gate structures 270 are respectively formed in the gate trenches GT to surround each of the nanosheets 128 and/or 126 suspended in the gate trenches GT. The gate structures 270 may be final gates of GAA FETs. The final gate structure may be a high-k/metal gate stack, however other compositions are possible. In some embodiments, each of the gate structures 270 forms the gate associated with the multi-channels provided by the plurality of nanosheets 128/126. For example, the high-k/metal gate structures 270 may include high-k/metal gate structures 270N and 270P for n-type devices in the region NR and p-type devices in the region PR, respectively. The high-k/metal gate structures 270N are formed within the openings/spaces O1 provided by the release of nanosheets 128. The high-k/metal gate structures 270N may be between the nanosheets 128 and surrounded by the inner spacers 222. The high-k/metal gate structures 270P are formed within the openings/spaces O2 provided by the release of nanosheets 126. The high-k/metal gate structures 270P may be between the nanosheets 126 and surrounded by the inner spacers 224.

In various embodiments, the high-k/metal gate structure 270N/270P includes a gate dielectric layer 272 formed around the nanosheets 128/126 and a gate metal layer 274N/274P formed around the gate dielectric layer 272, and fill metal 276 filling a remainder of gate trenches GT. Formation of the high-k/metal gate structures 270N/270P may include one or more deposition processes to form various gate materials, followed by a CMP process to remove excessive gate materials, resulting in the high-k/metal gate structures 270N/270P having top surfaces level with a top surface of the dielectric material 250. In the present embodiments, the CMP process is performed such that the top surfaces of the high-k/metal gate structures 270N/270P is higher than a top surface of the dielectric wall 150'. In some other embodiments, the CMP process is performed such that the top surfaces of the high-k/metal gate structures 270N/270P is level with the top surface of the dielectric wall 250'. Thus, transistors (e.g., GAA FET) are formed, and the high-k/metal gate structure 270N/270P surrounding each of the nanosheets 128/126 is referred to as a gate of the transistors (e.g., GAA FET). In some embodiments, in the regions NR/PR, the epitaxial layer 124/122 may form mesa regions with a low doping concentrations, thereby lowering well leakages.

The gate dielectric layer 272 may include an interfacial layer and a high-k gate dielectric layer over the interfacial layer. In some embodiments, the interfacial layer is silicon oxide formed on exposed surfaces of semiconductor materials in the gate trenches GT (referring to FIG. 22A-22D) by using, for example, thermal oxidation, chemical oxidation, wet oxidation or the like. As a result, surface portions of the epitaxial layers 122-128 exposed in the gate trenches GT (referring to FIG. 22A-22D) are oxidized into semiconductor oxide to form interfacial layer. In some embodiments, the high-k gate dielectric layer includes dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), the like, or combinations thereof.

In some embodiments, the gate metal layer 274N/274P may include one or more metal layers stacked one over another. The gate metal layer 274N/274P may be referred to as work function metal structure in the context. The one or more work function metal layers in the gate metal layer 274N/274P provide a suitable work function for the high-k/metal gate structures 270N/270P, respectively. For an n-type GAA FET, the gate metal layer 274N may include one or more n-type work function metal (N-metal) layers. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TIC), aluminum carbide (AIC)), aluminides, titanium nitride (TiN), tungsten (W), and/or other suitable materials. On the other hand, for a p-type GAA FET, the gate metal layer 274P may include one or more p-type work function metal (P-metal) layers. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the gate metal layers 274N and 274P may include the same work function metal layers for n-type devices and p-type devices. In some embodiments, the gate metal layers 274N and 274P may include different work function metal layers for n-type devices and p-type devices. In some embodiments, the fill metal 276 may exemplarily include, but are not limited to, tungsten, aluminum, copper, nickel, cobalt, titanium, tantalum, titanium nitride, tantalum nitride, nickel silicide, cobalt silicide, TaC. TaSiN, TaCN, TiAl, TiAlN, or other suitable materials. The high-k/metal gate structures 270N and 270P may include the same fill metal 276 for n-type devices and p-type devices.

Figures 24A, 24B:
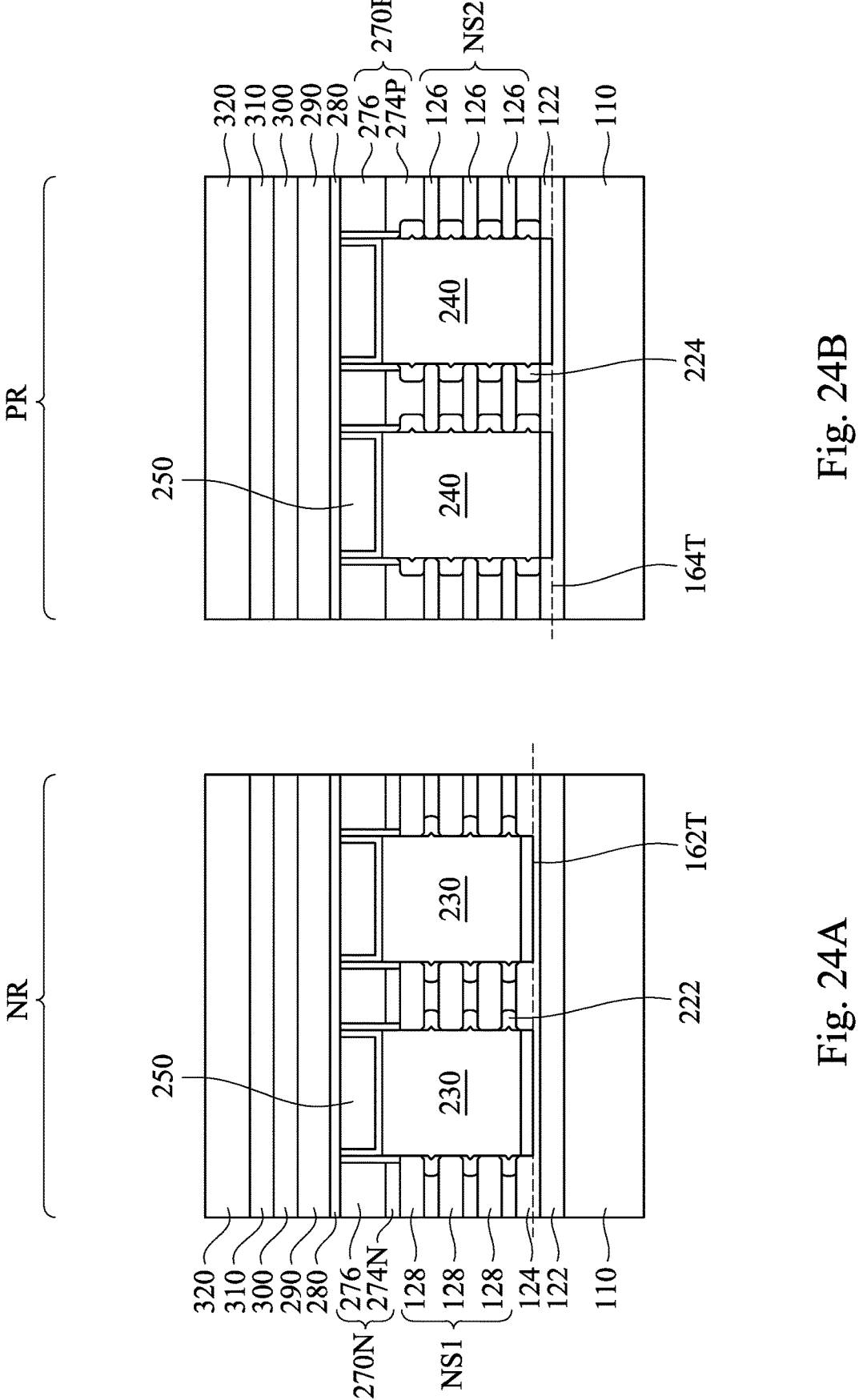

Reference is made to FIGS. 24A and 24B. A etch stop layer 280, an ILD layer 290, a metal-containing carbide layer 300, an oxide layer 310, and a silicon layer 320 are deposited over the top surfaces of the high-k/metal gate structures 270N/270P and the top surface of the dielectric material 250. The etch stop layer 280 may include silicon nitride or other suitable dielectric materials. In some embodiments, the ILD layer 290 includes materials such as TEOS oxide, un-doped silicate glass, or doped silicon oxide such as BPSG, FSG, PSG, boron doped silicon glass (BSG), and/or other suitable dielectric materials having a different etch selectivity than the etch stop layer 280. The metal-containing carbide layer 300 may include tungsten-doped carbon (WDC). The oxide layer 310 may be deposited by plasma-enhanced CVD.

Figures 25A, 25B:
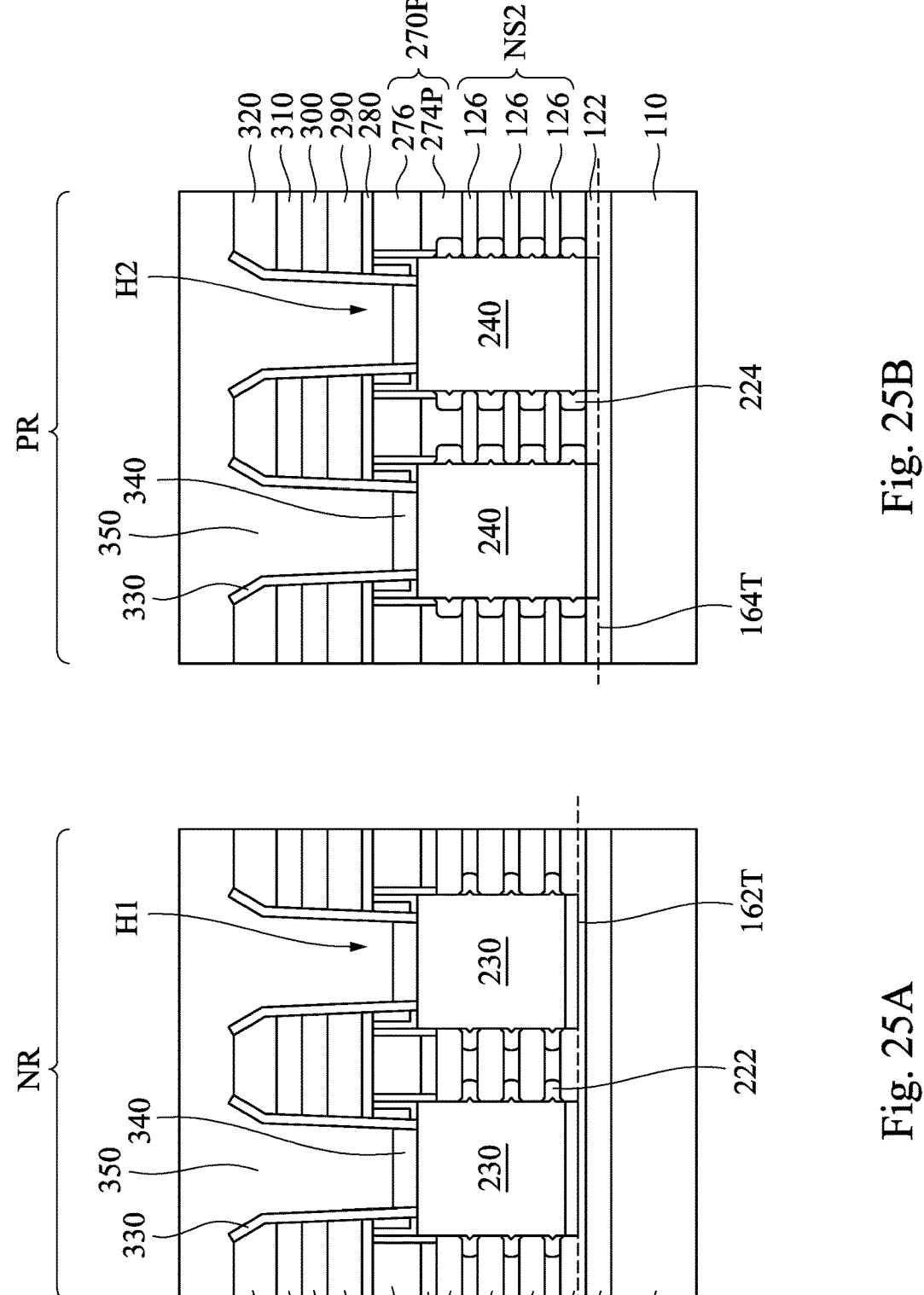

Reference is made to FIGS. 25A-26B. Source/drain contacts 352 are formed over the source/drain epitaxial structures 230 and 240. Referring to FIGS. 25A and 25B, source/drain contact openings H1/H2 may be first formed through the layers 320-280 to expose the source/drain epitaxial structures 230/240 by suitable patterning process (e.g., using suitable photolithography and etching techniques). Subsequently, hole liners 330 are formed on sidewalls of the source/drain contact openings H1/H2. Formation of the hole liners 330 may include conformally depositing a dielectric layer into the source/drain contact openings H1/H2, and etching away horizontal portions of the dielectric layer. Remaining portions of the dielectric layer are denoted as the hole liners 330. The hole liners 330 may include silicon nitride or other suitable dielectric materials. In some embodiments, the hole liners 330 may include a same material as that of the etch stop layer 280. Then, silicide regions 340 are formed on the exposed side of the source/drain epitaxial structures 230/240 by using a silicidation process, followed by depositing metal materials 350 over the silicide regions 340. Silicidation may be formed by depositing a metal layer (e.g., nickel layer or cobalt layer) over the exposed source/drain epitaxial structures 230/240, annealing the metal layer such that the metal layer reacts with silicon (and germanium if present) in the source/drain epitaxial structures 230/240 to form the metal silicide region 340 (e.g., nickel silicide or cobalt silicide), and thereafter removing the non-reacted metal layer. One or more metal materials (e.g., tungsten, cobalt, copper, the like or combinations thereof) are deposited to fill the contact holes H1/H2 by using suitable deposition techniques (e.g., CVD. PVD, ALD, the like or combinations thereof).

Figures 26A, 26B:
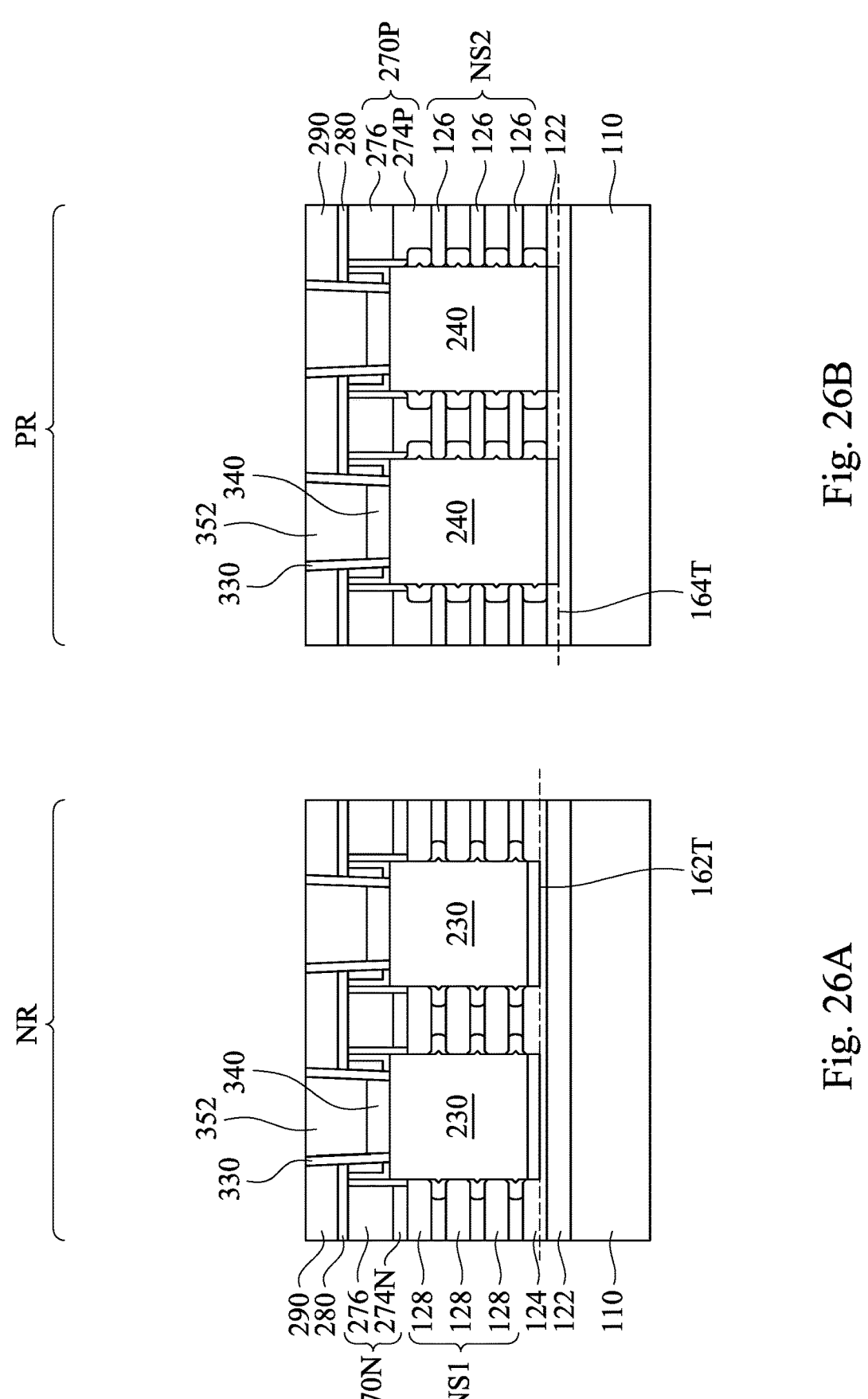

Referring to FIGS. 26A and 26B, a CMP process is performed to remove excess metal materials 350 outside the contact openings H1/H2. Remaining portions of the metal materials 350 in the contact openings H1/H2 are denoted as the source/drain contacts 352. After the CMP process, a front-end of line (FEOL) structure is formed.

Figures 27A, 27B:
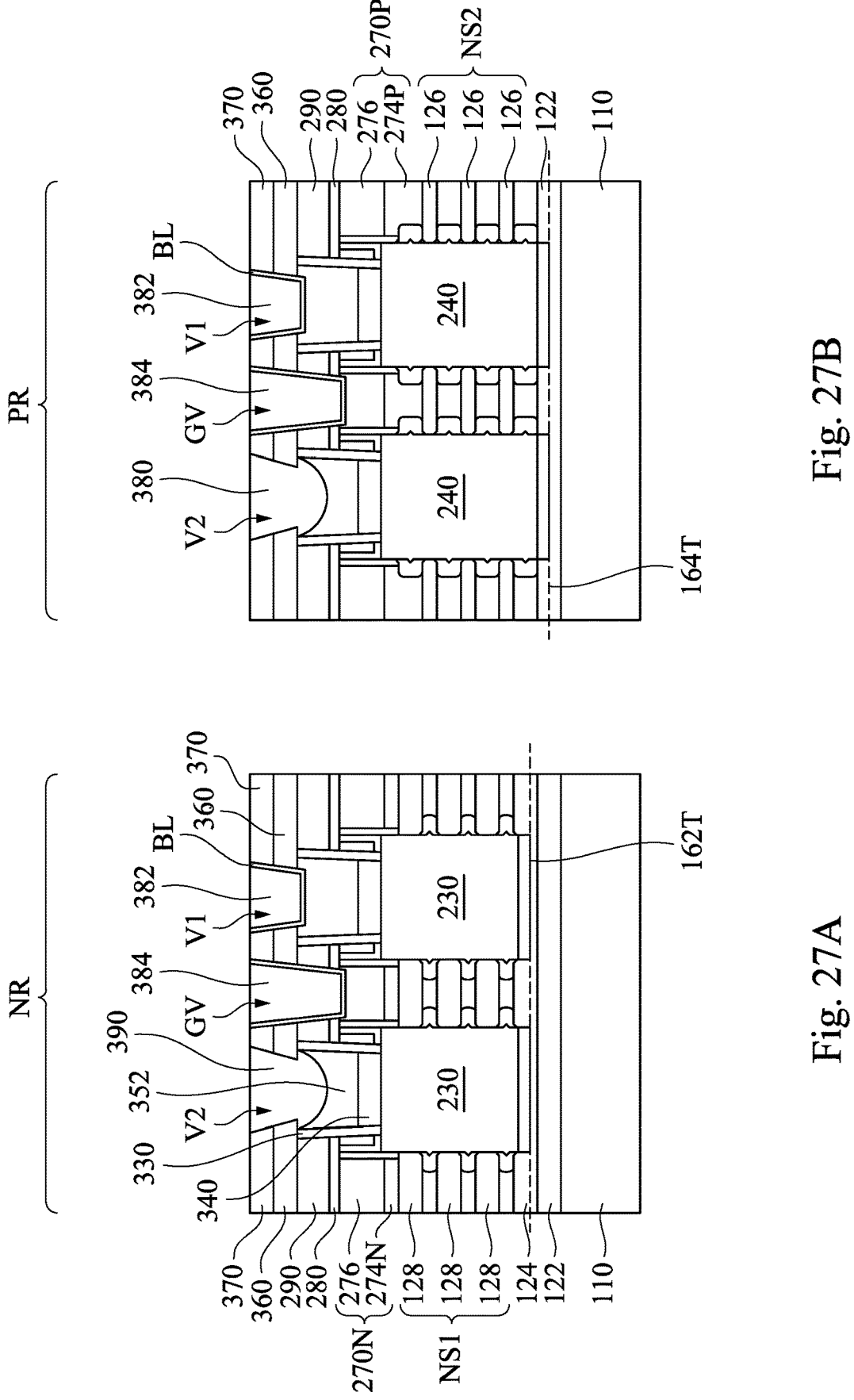

Reference is made to FIGS. 27A and 27B. A middle-end of line (MEOL) process is performed to form an interconnect structure over the FEOL structure shown in FIGS. 26A and 26B. The interconnect structure includes source/drain vias 382, gate contact vias 384, and ultimate plug schemes (UPS) 390. The source/drain via 382 is formed over one of the source/drain epitaxial structures 230/240. The gate contact via 384 is formed over the high-k/metal gate structure 270N/270P. The ultimate plug scheme (UPS) 390 are formed over another one of the source/drain epitaxial structures 230/240.

An etch stop layer 360 and an ILD layer 370 are first deposited over the structure of FIGS. 26A and 26B. The etch stop layer 360 may include silicon nitride or other suitable dielectric materials. In some embodiments, the ILD layer 370 includes materials such as TEOS oxide, un-doped silicate glass, or doped silicon oxide such as BPSG, FSG, PSG, boron doped silicon glass (BSG), and/or other suitable dielectric materials having a different etch selectivity than the etch stop layer 360. First source/drain via openings V1 are etched through the ILD layer 370 and the etch stop layer 360 to expose top surfaces of some of the source/drain contacts 352. Gate contact via openings GV are etched through the ILD layer 370, the etch stop layer 360, the ILD layer 290, and the etch stop layer 280 to expose top surfaces of the high-k/metal gate structure 270N and 270P. A metal barrier layer BL may be deposited into the first source/drain via openings V1 and the gate contact via openings GV by using suitable deposition techniques (e.g., CVD, PVD. ALD, the like or combinations thereof). The metal barrier layer BL may include titanium, titanium nitride, the like or the combination thereof. The metal barrier layer BL may be a multi-layer stack in some embodiments. One or more metal materials (e.g., tungsten, cobalt, copper, the like or combinations thereof) are deposited to fill the first source/drain via openings V1 and the gate contact via openings GV by using suitable deposition techniques (e.g., CVD, PVD, ALD, the like or combinations thereof). A CMP process is performed to remove excess portions of the metal barrier layer BL and the metal materials outside the first source/drain via openings V1 and the gate contact via openings GV, and remaining portions of the metal barrier layer BL and the metal materials in the first source/drain via openings V1 and the gate contact via openings GV are denoted as the source/drain via 382 and gate contact via 384, respectively.

Second source/drain via openings V2 are etched through the ILD layer 370 and the etch stop layer 360 to expose top surfaces of some of the source/drain contacts 352. An etch process may be performed to etch away a top portion of the source/drain contacts 352, resulting a concave top surface of the source/drain contacts 352. Subsequently, one or more metal materials (e.g., tungsten, cobalt, copper, the like or combinations thereof) are deposited to fill the second source/drain via openings V2. A CMP process is performed to remove excess portions of the metal materials outside the second source/drain via openings V2, and remaining portions of the metal materials in the second source/drain via openings V2 are denoted as the UPS 390.

Figure 28:
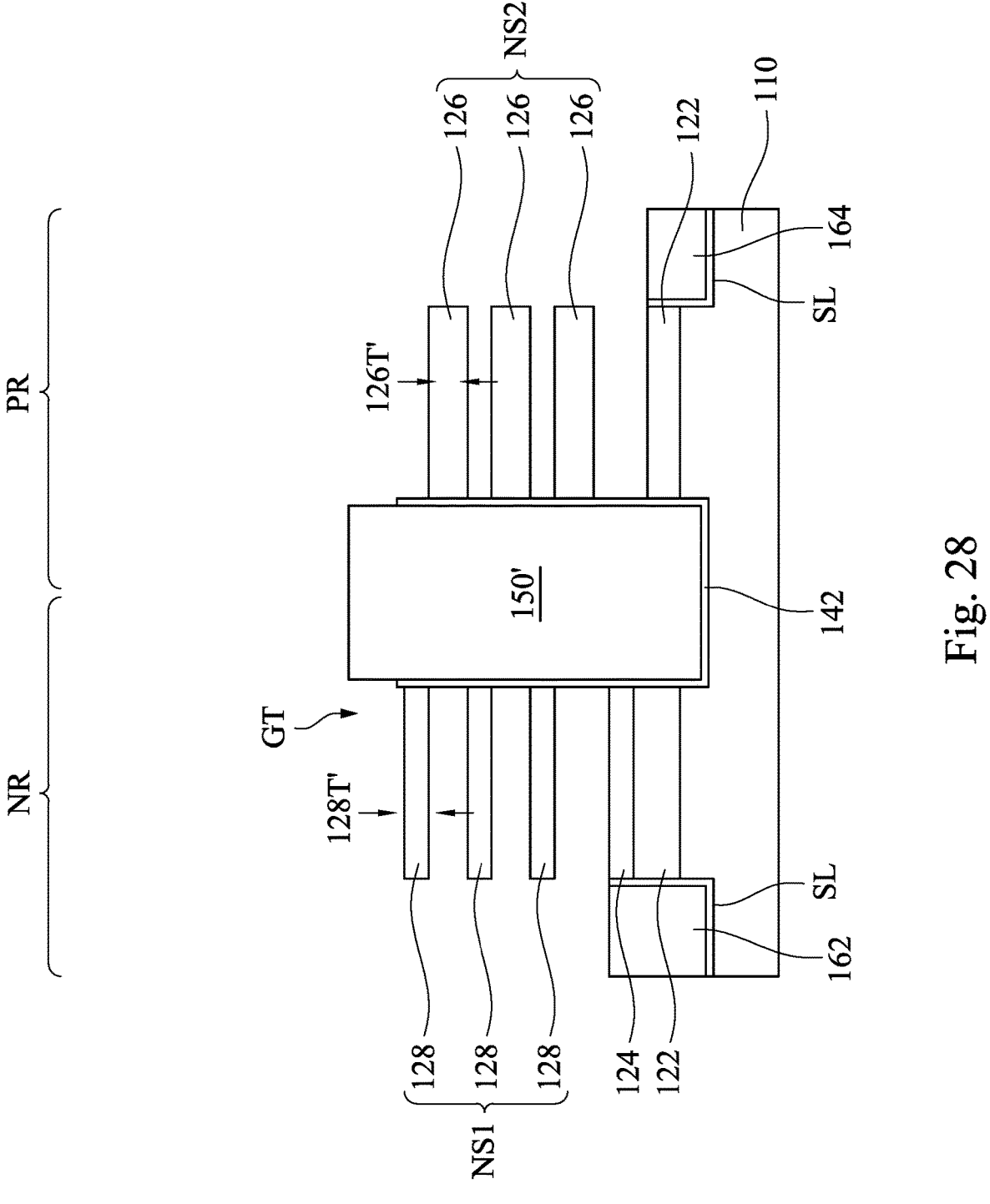
FIGS. 28 and 29 illustrate cross-sectional views of intermediate stages in the manufacture of a semiconductor device in accordance with some embodiments of the present disclosure.
Figure 29:
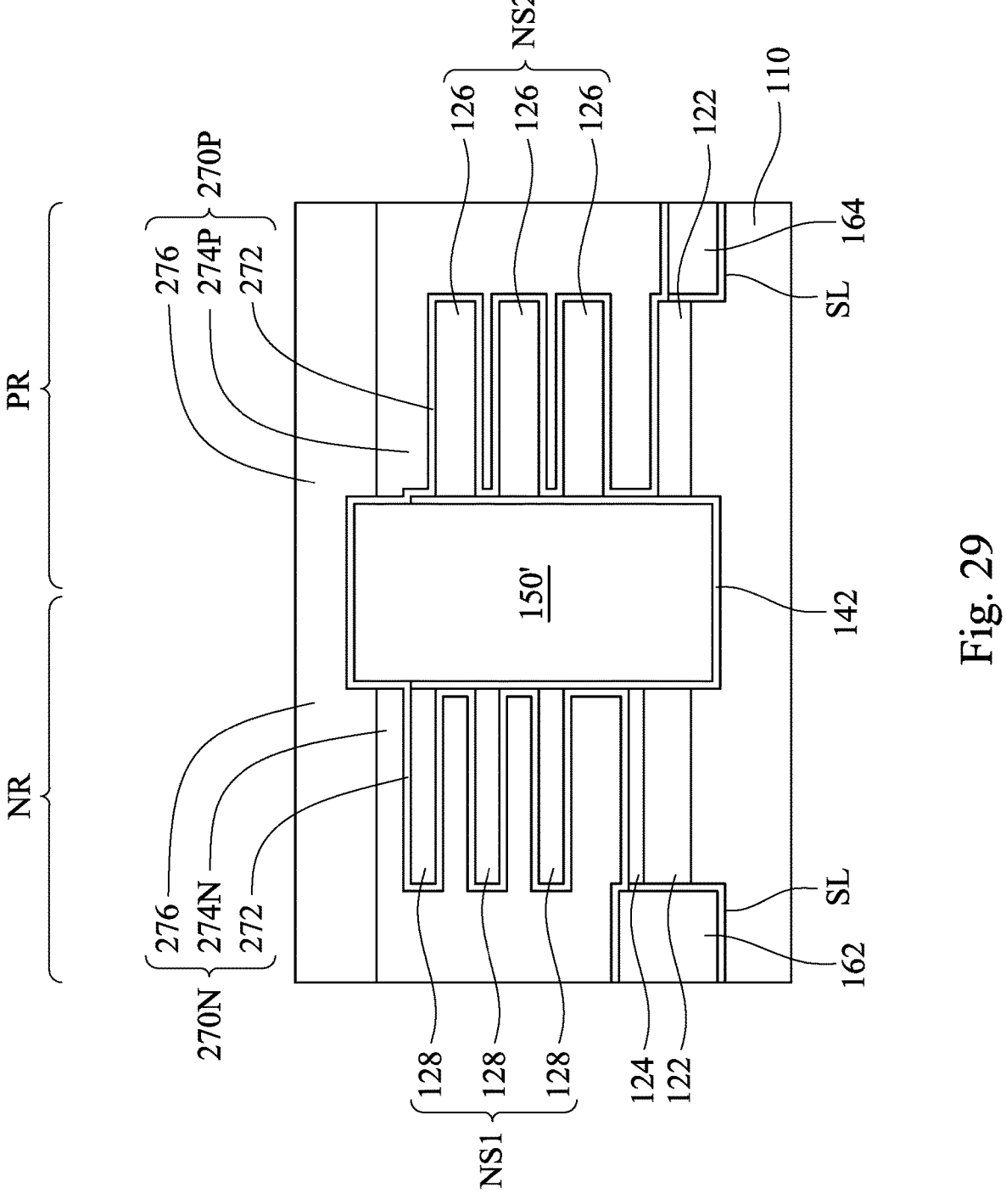

FIGS. 28 and 29 illustrate cross-sectional views of intermediate stages in the manufacture of a semiconductor device in accordance with some embodiments of the present disclosure. In the present embodiments, during the fabrication process (e.g., annealing processes), germanium atoms in the SiGe epitaxial layers diffuse into the Si epitaxial layers, thereby increasing a thickness of the SiGe epitaxial layers and decrease a thickness of the Si epitaxial layers. Thus, referring to FIG. 28, after the channel release step, the nanosheets 128 may have a thickness 128T' less than the deposited thickness 128T in FIG. 1, and the nanosheets 126 may have a thickness 126T' greater than the deposited thickness 126T in FIG. 1. For example, the thickness 128T' may be less than the thickness 128T in FIG. 1 by about 1 nanometer to about 5 nanometers, and the thickness 126T' may be greater than the thickness 126T in FIG. 1 by about 1 nanometer to about 5 nanometers.

The deposited thickness 126T and 128T of the epitaxial layers 126 and 128 (referring to FIG. 1) may be designed for compensating this thickness variation due to the diffusion of germanium atom. In the present embodiments, the deposited thickness 126T (referring to FIG. 1) may be less than the deposited thickness 128T (referring to FIG. 1), and the thickness 126T' of the nanosheets 126 may be substantially equivalent to the thickness 128T' of the nanosheets 128 after the channel release step. In some other embodiments, the deposited thickness 126T (referring to FIG. 1) may be less than the deposited thickness 128T (referring to FIG. 1), and the thickness 126T' of the nanosheets 126 may be greater than the thickness 128T' of the nanosheets 128 after the channel release step. In some other embodiments, the deposited thickness 126T (referring to FIG. 1) may be less than the deposited thickness 128T (referring to FIG. 1), and the thickness 126T' of the nanosheets 126 may be still less than the thickness 128T' of the nanosheets 128 after the channel release step.

Reference is made to FIG. 29. The high-k/metal gate structures 270N and 270P may be formed around the nanosheets 128 and 126, respectively. Other details of the present embodiments are similar to those illustrated in FIGS. 1-27B, and therefore not repeated herein.

FIGS. 30A-32B illustrate schematic views of intermediate stages in the manufacture of a semiconductor device in accordance with some embodiments of the present disclosure. Details of the present embodiments are similar to those shown in FIGS. 1-27B, except that the source/drain recesses R1 and R2 are formed in the regions NR and PR by a same etch back process, and then lateral/sidewall recesses S1 and S2 are respectively formed in the regions NR and PR by different patterned masks.

Figures 30A, 30B:
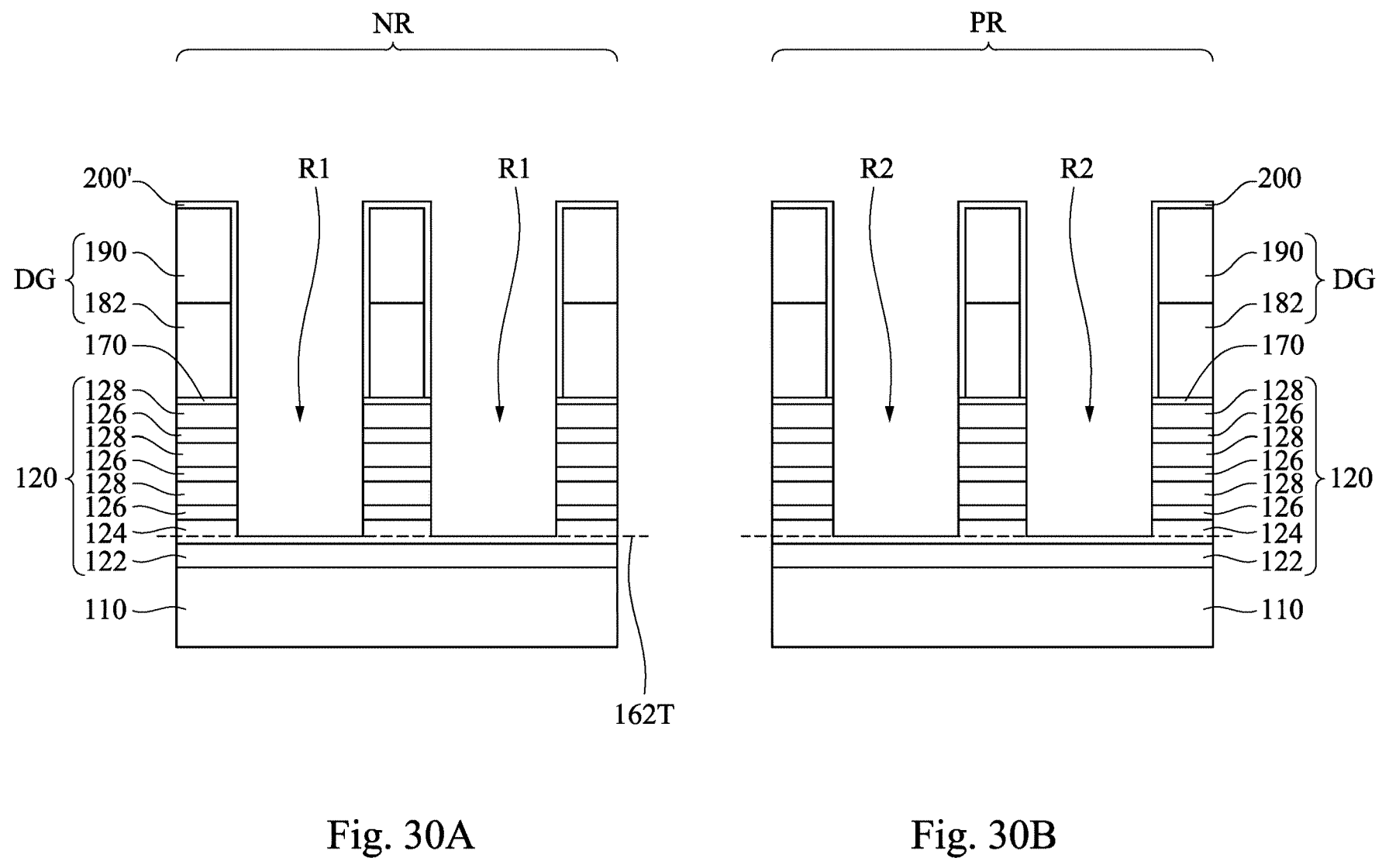

Reference is made to FIGS. 30A and 30B. An etch back process using the dummy gate structure 160 as an etch mask, resulting in recesses R1 into the semiconductor fins FS and between corresponding dummy gate structures DG in the region NR and recesses R2 into the semiconductor fins FS and between corresponding dummy gate structures DG in the region PR. The etch back process may include one or more anisotropic etching processes. After the anisotropic etching, end surfaces of the epitaxial layers 126 and 128 are exposed. In some embodiments, the anisotropic etching may be performed by a dry chemical etch (e.g., plasma etching, such as reactive-ion etching) with suitable gas etchants, such as silicon-based gases. In some embodiments, the gate spacer layer 200 (referring to FIG. 14) in the regions NR and PR may be referred to as gate spacers 200' after the anisotropic etching processes.

Figures 31A, 31B:
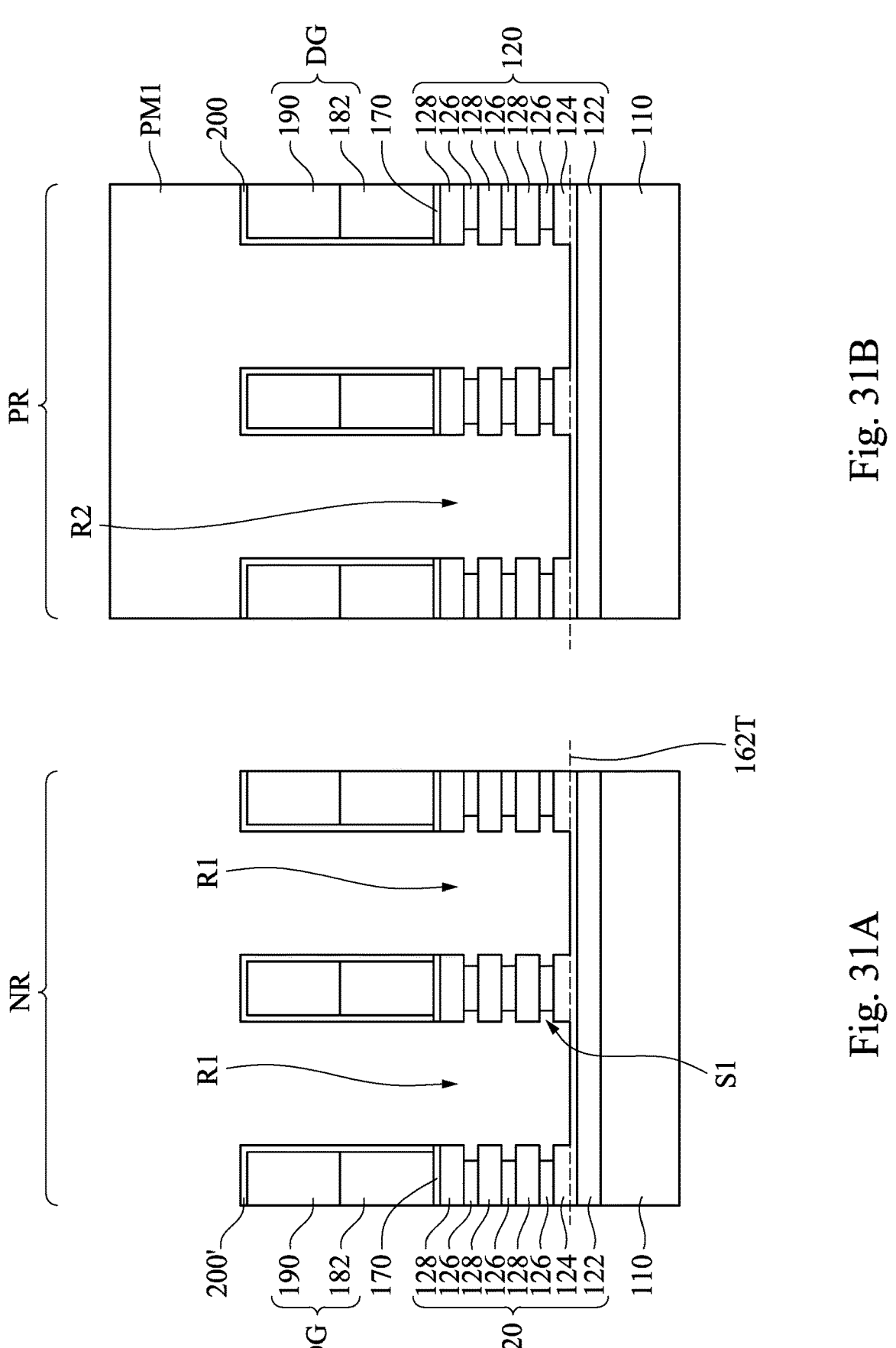

Reference is made to FIGS. 31A and 31B. The epitaxial (sacrificial) layers 126 are laterally or horizontally recessed by using suitable selective etching process, resulting in lateral/sidewall recesses S1 each vertically between corresponding epitaxial (channel) layers 128. The lateral/sidewall recesses S1 may alternate with the epitaxial (channel) layers 128. The various compositions in epitaxial layers result in different oxidation rates and/or etch selectivity, thereby facilitating the selective etching process. In some embodiments, a selective dry etching process is performed by using fluorine-based gas (such as $SF_6$, $CH_2F_2$. $CH_3F$, $CHF_3$, $CF_4$, or the like), chloride-based gas (e.g., $Cl_2$), hydrogen bromide gas (HBr), oxygen gas ($O_2$), Ar, the like, or combinations thereof. These gas may etch SiGe at a faster etch rate than it etches Si. The epitaxial (channel) layers 128 and the epitaxial layer 124 may have a higher etch resistance to the etching process than that of the epitaxial (sacrificial) layers 126. As a result, in the region NR, the epitaxial (channel) layers 128 laterally extend past opposite end surfaces of the epitaxial (sacrificial) layers 126.

In some embodiments, prior to the selective etching processes, a patterned mask PM1 is formed to cover the fins FS in the region PR. The patterned mask PM1 can be formed by a photolithography process, including coating a photoresist, exposing the photoresist to a pattern, performing post-exposure bake processes, and developing the resist. The patterned mask PM1 may protect the fins FS in the region PR from the selective etching processes in the formation of the lateral/sidewall recesses S1 in the region NR. The patterned mask PM1 may be removed by suitable stripping process after the selective etching processes.

Figures 32A, 32B:
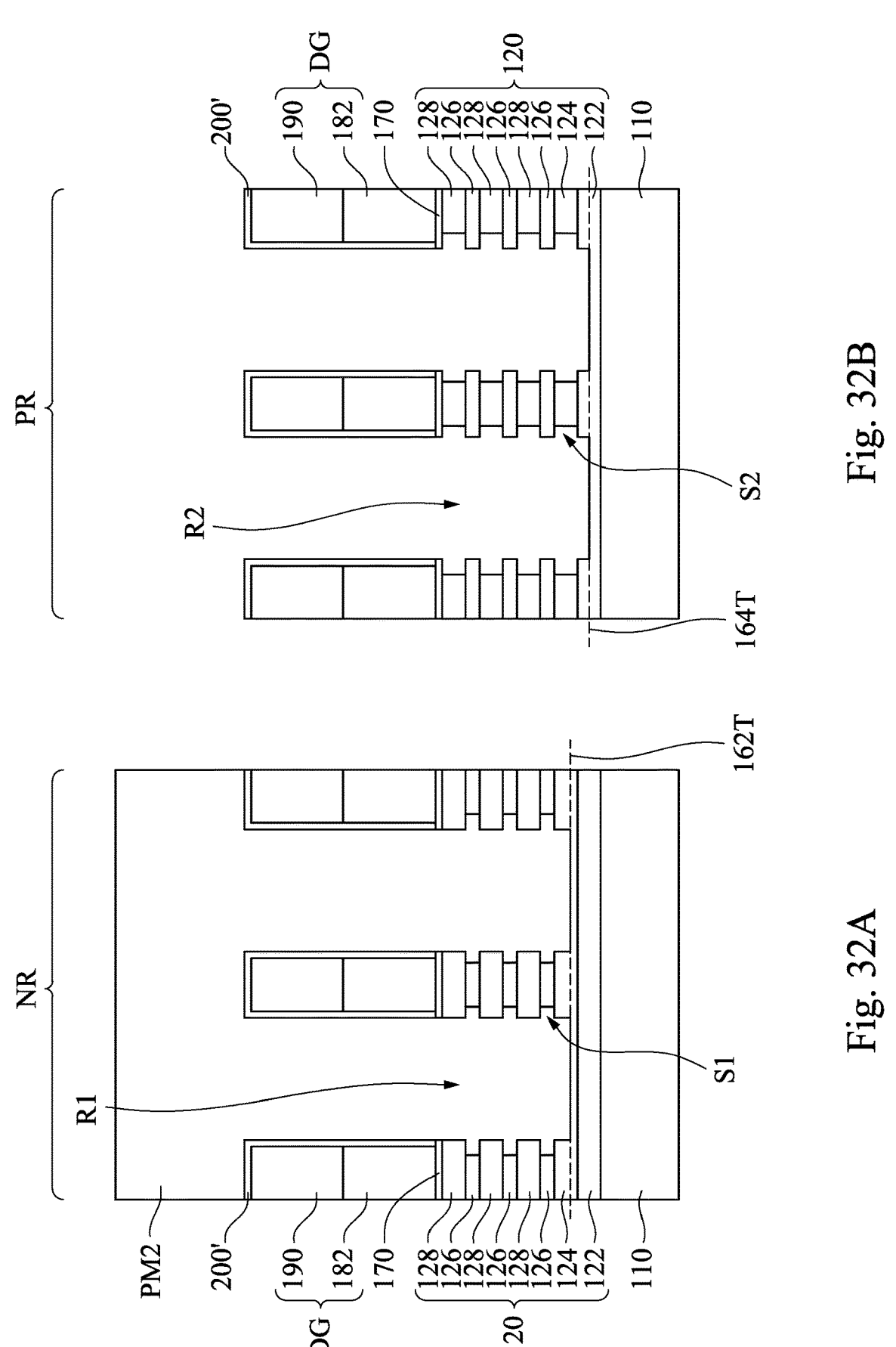

Reference is made to FIGS. 32A and 32B. The epitaxial (sacrificial) layers 128 and the epitaxial layer 124 are laterally or horizontally recessed by using suitable selective etching process, resulting in lateral/sidewall recesses S2 each vertically between corresponding epitaxial (channel) layers 126. The lateral/sidewall recesses S2 may alternate with the epitaxial (channel) layers 126. The various compositions in epitaxial layers result in different oxidation rates and/or etch selectivity, thereby facilitating the selective etching process. In some embodiments, a selective dry etching process is performed by using suitable etchant gas, such as $H_2$, the like, or the combination thereof. The etchant gas may etch Si at a faster etch rate than it etches SiGe. The epitaxial (channel) layers 126 may have a higher etch resistance to the etching process than that of the epitaxial (sacrificial) layers 128 and the epitaxial layer 124. As a result, in the region PR, the epitaxial (channel) layers 126 laterally extend past opposite end surfaces of the epitaxial (sacrificial) layers 128 and the epitaxial layer 124. The patterned mask PM2 may be removed by suitable stripping process after the etching processes. The etchant gas used in formation of the lateral/sidewall recesses S2 may be different from the etchant gas used in formation of the lateral/sidewall recesses S1.

In some embodiments, prior to the selective etching process, a patterned mask PM2 is formed to cover the fins FS in the region NR. The patterned mask PM2 can be formed by a photolithography process, including coating a photoresist, exposing the photoresist to a pattern, performing post-exposure bake processes, and developing the resist. The patterned mask PM2 may protect the fins FS in the region NR from the selective etching process in the formation of the lateral/sidewall recesses S2 in the region PR. The patterned mask PM2 may be removed by suitable stripping process after the selective etching processes.

Inner spacers 222 and 224 (referring to FIGS. 17A and 17B) are formed in the recesses S1 and S2, respectively, and source/drain epitaxial structures 230 and 240 (referring to FIGS. 18A-18D) are formed in recesses R1 and R2 the regions NR and PR, respectively. Other details of the present embodiments are similar to those illustrated in the embodiments of FIGS. 1-27B, and thereto not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a threshold voltage of PFET is reduced by using SiGe as the channel material, and the threshold voltage of PFET can be adjusted by tuning a Ge concentration in SiGe and/or changing SiGe thickness. Another advantage is that there is little or no top sheet loss for the top channel layer of the PFET. Still another advantage is that there is less sheet thickness loss for the PFET due to Ge diffusion in Si. Still another advantage is that a well leakage is lowered by a bottom mesa epitaxial layer. Still another advantage is that the mobility gain of the PFET is improved. Still another advantage is that SiGe and Si etch stop layers are designed for protecting substrate during the channel release process.

According to some embodiments of the present disclosure, a method includes depositing an epitaxial stack over a substrate, the epitaxial stack comprising alternating first semiconductor layers and second semiconductor layers, wherein the first semiconductor layers comprise a different semiconductor composition from that of the second semiconductor layers; forming a dielectric wall in the epitaxial stack; removing a first subset of the first semiconductor layers on a first side of the dielectric wall, while leaving a first subset of the second semiconductor layers on the first side of the dielectric wall; removing a second subset of the second semiconductor layers on a second side of the dielectric wall, while leaving a second subset of the first semiconductor layers on the second side of the dielectric wall; forming a first gate structure around the first subset of the second semiconductor layers; and forming a second gate structure around the second subset of the first semiconductor layers.

According to some embodiments of the present disclosure, a method includes depositing an epitaxial stack over a substrate, the epitaxial stack comprising a first semiconductor layer, a second semiconductor layer, and alternating third semiconductor layers and fourth semiconductor layers, wherein the first and third semiconductor layers comprise a different semiconductor composition from that of the second and fourth semiconductor layers; patterning the epitaxial stack into a first fin and a second fin, wherein the first fin comprises a first portion of the first semiconductor layer, a first portion of the second semiconductor layer, a first subset of the third semiconductor layers and a first subset of the fourth semiconductor layers, and the second fin comprises a second portion of the first semiconductor layer, a second portion of the second semiconductor layer, a second subset of the third semiconductor layers and a second subset of the fourth semiconductor layers; forming a dielectric wall between the first and second fins; replacing the first subset of the third semiconductor layers with a first gate structure; and replacing the second portion of the second semiconductor layer and the second subset of the fourth semiconductor layers with a second gate structure.

According to some embodiments of the present disclosure, a semiconductor device includes a dielectric wall, a plurality of first semiconductor channels, a plurality of second semiconductor channels, a first gate structure, and a second gate structure. The dielectric wall is on a substrate. The first semiconductor channels are on a first side of the dielectric wall. The second semiconductor channels are on a second side of the dielectric wall. The second semiconductor channels comprise a different semiconductor composition from that of the first semiconductor channels, and the first semiconductor channels are misaligned with the second semiconductor channels in a cross-sectional view. The first gate structure wraps around the first semiconductor channels. The second gate structure wraps around second semiconductor channels.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

depositing an epitaxial stack over a substrate, the epitaxial stack comprising alternating first semiconductor layers and second semiconductor layers, wherein the first semiconductor layers comprise a different semiconductor composition from that of the second semiconductor layers;

forming a dielectric wall in the epitaxial stack;

removing a first subset of the first semiconductor layers on a first side of the dielectric wall, while leaving a first subset of the second semiconductor layers on the first side of the dielectric wall;

removing a second subset of the second semiconductor layers on a second side of the dielectric wall, while leaving a second subset of the first semiconductor layers on the second side of the dielectric wall;

forming a first isolation structure over the substrate and having a top surface lower than a top surface of the dielectric wall, wherein the first semiconductor layers are between the dielectric wall and the first isolation structure;

forming a second isolation structure over the substrate and having a top surface lower than the top surface of the dielectric wall, wherein the second semiconductor layers are between the dielectric wall and the second isolation structure, and the top surface of the first isolation structure is higher than the top surface of the second isolation structure;

forming a first gate structure around the first subset of the second semiconductor layers; and forming a second gate structure around the second subset of the first semiconductor layers.

2. The method of claim 1, further comprising:

forming an n-type source/drain epitaxial structure interfacing the first subset of the second semiconductor layers; and forming a p-type source/drain epitaxial structure interfacing the second subset of the first semiconductor layers.

3. The method of claim 2, wherein a bottom surface of the n-type source/drain epitaxial structure is higher than a bottom surface of the p-type source/drain epitaxial structure.

4. The method of claim 1, wherein depositing the epitaxial stack is performed such that a thickness of the second semiconductor layers is greater than a thickness of the first semiconductor layers.

5. The method of claim 1, wherein a Ge concentration in the first semiconductor layers is greater than a Ge concentration in the second semiconductor layers.

6. The method of claim 1, further comprising:

forming a plurality of spacers on the first subset of the first semiconductor layers and on the second subset of the second semiconductor layers prior to removing the first subset of the first semiconductor layers and the second subset of the second semiconductor layers.

7. The method of claim 1, further comprising:

depositing a liner layer over the epitaxial stack prior to forming the dielectric wall in the epitaxial stack.

8. The method of claim 7, further comprising:

etching the liner layer such that the liner layer has a top surface level with a top surface of the epitaxial stack.

9. The method of claim 7, wherein the liner layer comprises semiconductor oxide material.

10. A method, comprising:

depositing an epitaxial stack over a substrate, the epitaxial stack comprising a first semiconductor layer, a second semiconductor layer, and alternating third semiconductor layers and fourth semiconductor layers, wherein the first and third semiconductor layers comprise a different semiconductor composition from that of the second and fourth semiconductor layers;

patterning the epitaxial stack into a first fin and a second fin, wherein the first fin comprises a first portion of the first semiconductor layer, a first portion of the second semiconductor layer, a first subset of the third semiconductor layers and a first subset of the fourth semiconductor layers, and the second fin comprises a second portion of the first semiconductor layer, a second portion of the second semiconductor layer, a second subset of the third semiconductor layers and a second subset of the fourth semiconductor layers;

forming a dielectric wall between the first and second fins;

forming a first isolation structure over the substrate and having a top surface lower than a top surface of the dielectric wall, wherein the first fin is between the dielectric wall and the first isolation structure;

forming a second isolation structure over the substrate and having a top surface lower than the top surface of the dielectric wall, wherein the second fin is between the dielectric wall and the second isolation structure, and the top surface of the first isolation structure is higher than the top surface of the second isolation structure;

replacing the first subset of the third semiconductor layers with a first gate structure; and replacing the second portion of the second semiconductor layer and the second subset of the fourth semiconductor layers with a second gate structure.

11. The method of claim 10, wherein replacing the first subset of the third semiconductor layers with the first gate structure is performed such that the first gate structure is over the first portion of the first semiconductor layer and the first portion of the second semiconductor layer.

12. The method of claim 10, wherein replacing the second portion of the second semiconductor layer and the second subset of the fourth semiconductor layers with the second gate structure is performed such that the second gate structure is over the second portion of the first semiconductor layer.

13. The method of claim 10, wherein the first semiconductor layer is thicker than the third semiconductor layers, and the second semiconductor layer is thicker than the fourth semiconductor layers.

14. The method of claim 10, further comprises:

etching a first source/drain opening in the first fin until reaching the first portion of the second semiconductor layer;

epitaxial growing a first source/drain epitaxial structure from the first portion of the second semiconductor layer and the first subset of the fourth semiconductor layers;

etching a second source/drain opening in the second fin until reaching the second portion of the first semiconductor layer; and epitaxial growing a second source/drain epitaxial structure from the second portion of the first semiconductor layer and the second subset of the third semiconductor layers.

15. The method of claim 10, wherein the top surface of the first isolation structure is laterally aligned with the second semiconductor layer, and the top surface of the second isolation structure is laterally aligned with the first semiconductor layer.

16. The method of claim 10, wherein forming the dielectric wall comprises:

depositing a dielectric material over and between the first and second fins; and etching back the dielectric material.

17. The method of claim 10, further comprises:

conformally depositing a liner layer over and between the first and second fins prior to forming the dielectric wall.

18. The method of claim 17, wherein forming the dielectric wall is performed such that a top end of the liner layer is lowered to a position level with or higher than a top surface of the epitaxial stack, and the dielectric wall is in contact with the top end of the liner layer.

19. A method, comprising:

forming a dielectric wall on a substrate;

forming a plurality of first semiconductor channels on a first side of the dielectric wall;

forming a plurality of second semiconductor channels on a second side of the dielectric wall, wherein the second semiconductor channels comprise a different semiconductor composition from that of the first semiconductor channels, and the first semiconductor channels are misaligned with the second semiconductor channels in a cross-sectional view;

forming a first isolation structure over the substrate and having a top surface lower than a top surface of the dielectric wall, wherein the first semiconductor channels are between the dielectric wall and the first isolation structure;

forming a second isolation structure over the substrate and having a top surface lower than the top surface of the dielectric wall, wherein the second semiconductor channels are between the dielectric wall and the second isolation structure, and the top surface of the first isolation structure is higher than the top surface of the second isolation structure;

forming a gate structure wrapping around the first semiconductor channels; and forming a second gate structure wrapping around the second semiconductor channels.

20. The method of claim 19, further comprising:

growing an n-type source/drain epitaxial structure interfacing the first semiconductor channels; and growing a p-type source/drain epitaxial structure interfacing the second semiconductor channels.

* * * * *